United States Patent
de Rochemont

(10) Patent No.: US 9,520,649 B2
(45) Date of Patent: Dec. 13, 2016

(54) CERAMIC ANTENNA MODULE AND METHODS OF MANUFACTURE THEREOF

(71) Applicant: L. Pierre de Rochemont, Austin, TX (US)

(72) Inventor: L. Pierre de Rochemont, Austin, TX (US)

(*) Notice: Subject to any disclaimer, the term of this patent is extended or adjusted under 35 U.S.C. 154(b) by 138 days.

(21) Appl. No.: 14/089,465

(22) Filed: Nov. 25, 2013

(65) Prior Publication Data
US 2014/0159976 A1    Jun. 12, 2014

Related U.S. Application Data

(62) Division of application No. 13/471,012, filed on May 14, 2012, now Pat. No. 8,593,819, which is a division
(Continued)

(51) Int. Cl.
*H05K 7/06* (2006.01)
*H01Q 9/16* (2006.01)
(Continued)

(52) U.S. Cl.
CPC ............... *H01Q 9/16* (2013.01); *H01Q 1/362* (2013.01); *H01Q 1/38* (2013.01); *H01Q 7/00* (2013.01);
(Continued)

(58) Field of Classification Search
USPC ......... 361/748; 174/258; 501/137, 134, 152, 501/154; 524/546
See application file for complete search history.

(56) References Cited

U.S. PATENT DOCUMENTS 2,283,925 A    5/1942 Harvey
2,886,529 A    5/1959 Louis
(Continued)

FOREIGN PATENT DOCUMENTS

EP    0026056 A1    4/1981
EP    0939451 A1    1/1999
(Continued)

OTHER PUBLICATIONS

Zhang, Y, et al. Planar Artificial Magnetic Conductors and Patch Antennas, IEEE Transactions on Antennas and Propagation 51 (1 0). Oct. 2003, pp. 2704-2712.*
(Continued)

*Primary Examiner* — Peter D Mulcahy
*Assistant Examiner* — Henry Hu
(74) *Attorney, Agent, or Firm* — Burns & Levinson LLP; David W. Gomes; Jerry Cohen

(57) ABSTRACT

Circuit modules and methods of construction thereof that contain composite meta-material dielectric bodies that have high effective values of real permittivity but which minimize reflective losses, through the use of host dielectric (organic or ceramic), materials having relative permittivities substantially less than ceramic dielectric inclusions embedded therein. The composite meta-material bodies permit reductions in physical lengths of electrically conducting elements such as antenna element(s) without adversely impacting radiation efficiency. The meta-material structure may additionally provide frequency band filtering functions that would normally be provided by other components typically found in an RF front-end.

9 Claims, 64 Drawing Sheets

TOP VIEW

Related U.S. Application Data of application No. 12/177,002, filed on Jul. 21, 2008, now Pat. No. 8,178,457, which is a division of application No. 11/243,422, filed on Oct. 3, 2005, now Pat. No. 7,405,698.

(60) Provisional application No. 60/615,174, filed on Oct. 1, 2004, provisional application No. 60/716,306, filed on Sep. 12, 2005.

(51) Int. Cl.
*H01Q 1/36* (2006.01)
*H01Q 1/38* (2006.01)
*H01Q 7/00* (2006.01)
*H01Q 9/04* (2006.01)
*H01Q 15/00* (2006.01)
*H01Q 21/00* (2006.01)

(52) U.S. Cl.
CPC .......... *H01Q 9/0407* (2013.01); *H01Q 15/006* (2013.01); *H01Q 15/0046* (2013.01); *H01Q 15/0086* (2013.01); *H01Q 21/0025* (2013.01); *H01L 2223/6677* (2013.01); *H01L 2924/0002* (2013.01)

(56) References Cited

U.S. PATENT DOCUMENTS

| | | |
|---|---|---|
| 3,574,114 A | 4/1971 | Monforte |
| 3,614,554 A | 10/1971 | Shield et al. |
| 3,983,077 A | 9/1976 | Fuller et al. |
| 4,400,683 A | 8/1983 | Eda et al. |
| 4,455,545 A | 6/1984 | Shelly |
| 4,523,170 A | 6/1985 | Huth, III |
| 4,646,038 A | 2/1987 | Wanat |
| 4,759,120 A | 7/1988 | Bernstein |
| 4,859,492 A | 8/1989 | Rogers, Jr. et al. |
| 4,880,770 A | 11/1989 | Mir et al. |
| 4,967,201 A | 10/1990 | Rich, III |
| 5,084,749 A | 1/1992 | Losee et al. |
| 5,130,675 A | 7/1992 | Sugawara |
| 5,139,999 A | 8/1992 | Gordan et al. |
| 5,154,973 A | 10/1992 | Imagawa et al. |
| 5,198,824 A | 3/1993 | Poradish |
| 5,217,754 A | 6/1993 | Santiago-Aviles et al. |
| 5,219,377 A | 6/1993 | Poradish |
| 5,263,198 A | 11/1993 | Geddes et al. |
| 5,272,485 A | 12/1993 | Mason et al. |
| 5,403,797 A | 4/1995 | Ohtani et al. |
| 5,427,988 A | 6/1995 | Sengupta et al. |
| 5,456,945 A | 10/1995 | McMillan et al. |
| 5,478,610 A | 12/1995 | Desu et al. |
| 5,513,382 A | 4/1996 | Agahi-Kesheh et al. |
| 5,535,445 A | 7/1996 | Gunton |
| 5,540,772 A | 7/1996 | McMillan et al. |
| 5,543,773 A | 8/1996 | Evans et al. |
| 5,584,053 A | 12/1996 | Kommrusch et al. |
| 5,590,387 A | 12/1996 | Schmidt et al. |
| 5,614,252 A | 3/1997 | McMillan et al. |
| 5,625,365 A | 4/1997 | Tom et al. |
| 5,635,433 A | 6/1997 | Sengupta |
| 5,707,459 A | 1/1998 | Itoyama et al. |
| 5,707,715 A | 1/1998 | deRochemont et al. |
| 5,747,870 A | 5/1998 | Pedder |
| 5,759,923 A | 6/1998 | McMillan et al. |
| 5,764,189 A | 6/1998 | Lohninger |
| 5,771,567 A * | 6/1998 | Pierce ............... C04B 38/06 29/25.35 |
| 5,854,608 A | 12/1998 | Leisten |
| 5,859,621 A | 1/1999 | Leisten |
| 5,888,583 A | 3/1999 | McMillan et al. |
| 5,889,459 A | 3/1999 | Hattori et al. |
| 5,892,489 A | 4/1999 | Kanba et al. |
| 5,903,421 A | 5/1999 | Furutani et al. |
| 5,933,121 A | 8/1999 | Rainhart et al. |
| 5,945,963 A | 8/1999 | Leisten |
| 6,023,251 A | 2/2000 | Koo et al. |
| 6,027,826 A | 2/2000 | deRochemont et al. |
| 6,028,568 A | 2/2000 | Asakura et al. |
| 6,031,445 A | 2/2000 | Marty et al. |
| 6,040,805 A | 3/2000 | Huynh et al. |
| 6,046,707 A | 4/2000 | Gaughan et al. |
| 6,052,040 A | 4/2000 | Hino |
| 6,111,544 A | 8/2000 | Dakeya et al. |
| 6,143,432 A | 11/2000 | deRochemont et al. |
| 6,154,176 A | 11/2000 | Fathy et al. |
| 6,176,004 B1 | 1/2001 | Rainhart et al. |
| 6,181,297 B1 | 1/2001 | Leisten |
| 6,188,368 B1 | 2/2001 | Koriyama et al. |
| 6,195,049 B1 | 2/2001 | Kim et al. |
| 6,204,203 B1 | 3/2001 | Narwankar et al. |
| 6,208,843 B1 | 3/2001 | Huang et al. |
| 6,222,489 B1 | 4/2001 | Tsuru et al. |
| 6,266,020 B1 | 7/2001 | Chang |
| 6,271,803 B1 | 8/2001 | Watanabe et al. |
| 6,300,894 B1 | 10/2001 | Lynch et al. |
| 6,320,547 B1 | 11/2001 | Fathy et al. |
| 6,323,549 B1 | 11/2001 | deRochemont et al. |
| 6,492,949 B1 | 12/2002 | Breglia et al. |
| 6,496,149 B1 | 12/2002 | Birnbaum et al. |
| 6,501,415 B1 | 12/2002 | Viana et al. |
| 6,541,820 B1 | 4/2003 | Bol |
| 6,552,693 B1 | 4/2003 | Leisten |
| 6,559,735 B1 | 5/2003 | Hoang et al. |
| 6,583,699 B2 | 6/2003 | Yokoyama |
| 6,605,151 B1 | 8/2003 | Wessels et al. |
| 6,611,419 B1 | 8/2003 | Chakravorty |
| 6,620,750 B2 | 9/2003 | Kim et al. |
| 6,639,556 B2 | 10/2003 | Baba |
| 6,642,908 B2 | 11/2003 | Pleva et al. |
| 6,650,303 B2 | 11/2003 | Kim et al. |
| 6,670,497 B2 | 12/2003 | Tashino et al. |
| 6,680,700 B2 | 1/2004 | Hilgers |
| 6,683,576 B2 | 1/2004 | Achim |
| 6,686,406 B2 * | 2/2004 | Tomomatsu ............ C01G 29/00 343/785 |
| 6,690,336 B1 | 2/2004 | Leisten et al. |
| 6,697,605 B1 | 2/2004 | Atokawa et al. |
| 6,742,249 B2 | 6/2004 | deRochemont et al. |
| 6,743,744 B1 | 6/2004 | Kim et al. |
| 6,762,237 B2 | 7/2004 | Glatkowski et al. |
| 6,791,496 B1 * | 9/2004 | Killen ..................... H01Q 1/38 343/700 MS |
| 6,864,848 B2 | 3/2005 | Sievenpiper |
| 6,906,674 B2 | 6/2005 | McKinzie, III et al. |
| 6,919,119 B2 | 7/2005 | Kalkan et al. |
| 7,047,637 B2 | 5/2006 | deRochemont et al. |
| 7,405,698 B2 * | 7/2008 | de Rochemont ...... H01Q 1/362 343/700 MS |
| 7,564,887 B2 | 7/2009 | Wang et al. |
| 7,763,917 B2 | 7/2010 | deRochemont |
| 8,178,457 B2 * | 5/2012 | de Rochemont ...... H01Q 1/362 501/134 |
| 8,593,819 B2 * | 11/2013 | de Rochemont ...... H01Q 1/362 174/258 |
| 2001/0023779 A1 | 9/2001 | Sugaya et al. |
| 2001/0027119 A1 | 10/2001 | Furutani et al. |
| 2001/0048969 A1 | 12/2001 | Constantino et al. |
| 2002/0039667 A1 | 4/2002 | Takaya et al. |
| 2002/0047768 A1 | 4/2002 | Duffy |
| 2002/0070983 A1 | 6/2002 | Kozub et al. |
| 2002/0092472 A1 | 7/2002 | Hayashi et al. |
| 2002/0110004 A1 | 8/2002 | Parks |
| 2002/0190818 A1 | 12/2002 | Endou et al. |
| 2003/0002045 A1 | 1/2003 | Nemat-Nasser et al. |
| 2003/0034124 A1 | 2/2003 | Sugaya et al. |
| 2003/0073565 A1 | 4/2003 | Ellis et al. |
| 2003/0080325 A1 | 5/2003 | Uchiyama et al. |
| 2003/0107455 A1 | 6/2003 | Imanaka et al. |
| 2003/0111714 A1 | 6/2003 | Bates et al. |
| 2003/0122647 A1 | 7/2003 | Ou |
| 2003/0148024 A1 | 8/2003 | Kodas et al. |
| 2003/0161959 A1 | 8/2003 | Kodas et al. |

(56) References Cited

U.S. PATENT DOCUMENTS

| | | |
|---|---|---|
| 2003/0170436 A1 | 9/2003 | Sumi et al. |
| 2003/0221621 A1 | 12/2003 | Pokharna et al. |
| 2004/0000964 A1 | 1/2004 | Killen et al. |
| 2004/0000966 A1 | 1/2004 | Killen et al. |
| 2004/0000970 A1 | 1/2004 | Killen et al. |
| 2004/0000972 A1 | 1/2004 | Killen et al. |
| 2004/0000975 A1 | 1/2004 | Killen et al. |
| 2004/0000976 A1 | 1/2004 | Killen et al. |
| 2004/0001024 A1 | 1/2004 | Killen et al. |
| 2004/0001026 A1* | 1/2004 | Killen ............... H01Q 7/00 343/795 |
| 2004/0001027 A1 | 1/2004 | Killen et al. |
| 2004/0001028 A1 | 1/2004 | Killen et al. |
| 2004/0012081 A1 | 1/2004 | Kwon |
| 2004/0033654 A1 | 2/2004 | Yamagata |
| 2004/0070915 A1 | 4/2004 | Nagai et al. |
| 2004/0084080 A1 | 5/2004 | Sager et al. |
| 2004/0092236 A1 | 5/2004 | Irie et al. |
| 2004/0113738 A1 | 6/2004 | Ahn et al. |
| 2004/0118448 A1 | 6/2004 | Scher et al. |
| 2004/0189528 A1 | 9/2004 | Killen et al. |
| 2005/0036269 A1 | 2/2005 | Ma et al. |
| 2005/0051870 A1 | 3/2005 | Yamazaki et al. |
| 2006/0086994 A1 | 4/2006 | Viefers et al. |
| 2006/0125681 A1 | 6/2006 | Smith et al. |
| 2006/0134491 A1 | 6/2006 | Hilchenko et al. |
| 2007/0003781 A1 | 1/2007 | deRochemont |
| 2007/0137257 A1 | 6/2007 | Desantolo et al. |
| 2007/0139976 A1 | 6/2007 | deRochemont |
| 2007/0166453 A1 | 7/2007 | Van Duren et al. |
| 2007/0170535 A1 | 7/2007 | deRochemont |
| 2007/0259768 A1 | 11/2007 | Kear et al. |
| 2008/0136395 A1 | 6/2008 | Bennett |
| 2009/0004370 A1 | 1/2009 | Zurcher et al. |
| 2009/0015314 A1 | 1/2009 | Kirchmeier et al. |
| 2011/0021007 A1* | 1/2011 | de Rochemont ... C23C 18/1204 438/483 |
| 2011/0049394 A1 | 3/2011 | deRochemont |
| 2011/0065224 A1 | 3/2011 | Bollman et al. |
| 2011/0248900 A1* | 10/2011 | de Rochemont ........ H01Q 9/26 343/803 |

FOREIGN PATENT DOCUMENTS

| | | | |
|---|---|---|---|
| EP | 939451 A1 * | 9/1999 | |
| EP | 1376759 A2 * | 1/2004 | |
| EP | 1376759 A2 | 2/2004 | |
| GB | 1125897 A | 9/1968 | |

OTHER PUBLICATIONS

Weiley, A.R. et al. Antennas Based on 2-D and 3-D Electromagnetic Bandgap Materia[s, IEEE, pp. 847-850 (2003).*

Lee, Y. et al. Investigation of Electromagnetic Bandgap (EBG) Structures for Antenna Pattern Control. IEEE, pp. 1115-1118 (2003).*

Andrenko, A.S. et al. EM Analysis of PBG Substrate Microstrip Circuits for Integrated Transmitter Front End. MMET 2000 Proceedings pp. 295-297.

Bardi, I. et al. Plane Wave Scattering From Frequency-Selective Surfaces by the Fionite-Element Method. IEEE Transactions on Magnetics 38(2) Mar. 2002. pp. 641-644.

Chappell, W. et al. Composite Metamaterial Systems for Two-Dimensional Periodic Structures. ©2002 IEEE pp. 384-387.

Cheng, Y.L. et al. Preparation and Characterization of (Ba.Sr)TiO3 thin films using interdigital electrodes. Microelectronic Engineering vol. 66 (2003) 872-879.

Clavijo, S. et al. Design Methodology for Sievenpiper High-Impedance Surfaces: An Artificial Magnetic Conductor for Positive Gain Electrically Small Antennas. IEEE Transactions on Antennas and Propagation 51(10). Oct. 2003. pp. 2678-2690.

Diaz, R. et al. Magnetic Loading of Aritficial Magnetic Conductors for Bandwidth Enhancement. ©2003 IEEE pp. 431-434.

Hansen, R.C. Effects of a High-Impedance Screen on a Dipole Antenna. IEEE Antennas and Wireless Propagation Letters vol. 1 2002 pp. 46-49.

Joshi, P.C. et al. Processing and Characterization of Pure and Doped Ba0.6Sr0.4TiO3 thin films tunable microwave applications, Mat. Res. Soc. Symp. Proc. vol. 656E (2001) DD4.9.1-DD4.9.6.

Kern, D.J. et al. Active Negative Impedance Loaded EBG Structures for the Realization of Ultra-Wideband Artificial Magnetic Conductors. ©2003 IEEE pp. 427-430.

Kern, D.J. et al. The Synthesis of Metamaterial Ferrites for RF Applications Using Electromagnetic Bandgap Structures. ©2003 IEEE pp. 497-500.

Kern, D.J. et al. Ultra-thin Electromagnetic Bandgap Absorbers Synthesized via Genetic Algorithms. ©2003 IEEE pp. 1119-1122.

Khun, R. et al., Characterization of Novel Mono- and Bifacially Active Semi-Transparent Crystalline Silicon Solar Cells, IEEE Transactions on Electron Devices, 46(10), Oct. 1999, p. 2013-2017.

Kretly, L.C. et al. The Influence of the Height Variation on the Frequency Bandgap in an AMC Artificial Magnetic Conductor for Wireless Applications: an EM Experimental Design Approach. Proceedings SBMO/IEEE MTT-S IMOC 2003 pp. 219-223.

Lee, Y. et al. Investigation of Electrmagnetic Bandgap (EBG) Structures for Antenna Pattern Control. ©2003 IEEE, pp. 1115-1118.

Mckinzie III, W.E. et al. Mitigation of Multipath Through the Use of an Artificial Magnetic Conductor for Precision CPS Surveying Antennas. ©2002 IEEE pp. 640-643.

Mckinzie, W. et al. A Multi-Band Artificial Magnetic Conductor Comprised of Multiple FSS Layers. ©2003 IEEE pp. 423-426.

Monorchio, A. et al. Synthesis of Artificial Magnetic Conductors by Using Multilayered Frequency Selective Surfaces. IEEE Antennas and Wireless Propagation Letters vol. 1 2002 pp. 196-199.

Mosallaei, H. et al. Periodic Bandgap and Effective Dielectric Materials in Electromagnetics: Characterization and Applications in Nanocavities and Waveguides. IEEE Transactions on Antennas and Propagation 51(3). Mar. 2003. pp. 549-563.

Pontes, F.M. et al. Study of the dielectric and ferroelectric properties of chemically processed BaxSr1-xTiO3 thin films. Thin Solid Films, vol. 386, No. 1 (2001) 91-98.

Rogers, S. et al. AMCs Comprised of Interdigital Capacitor FSS Layers Enable Lower Cost Applications. ©2003 IEEE pp. 411-414.

Rogers, S. et al. An AMC-Based 802.11a/b Antenna for Laptop Computers. ©2003 IEEE pp. 10-13.

Sievenpiper, D.F. et al. Two-Dimensional Beam Steering Using an Electrically Tunable Impedance Surface. IEEE Transactions on Antennas and Propagation 51(10). Oct. 2003. pp. 2713-2722.

Sun, J. et al. Efficiency of Various Photonic Bandgap (PBG) Structures. $3^{rd}$ Int'l. Conf. on Microwave and Milimeter Wave Technology Proceedings 2002. pp. 1055-1058.

Tsunemine, Y. et al. Pt/BaxSr(1-x)TiO3/Pt Capacitor Technology for 0.15 micron Embedded Dynamic Random Access Memory. Jap. J. Appl. Phys. vol. 43 No. 5A (2004) 2457-2461.

Vest, R.W. Metallo-organic decomposition (MOD) processing of ferroelectric and electro-optic films: A review. Ferroelectrics, 102:1, 53-68.

Viviani, M. et al. Positive Temperature Coefficient of Electrical Resistivity below 150k of Barium Strontium Titanate. J. Amer. Ceram. Soc. vol. 87 (2004) 756-758.

Weily, A.R. et al. Antennas Based on 2-D and 3-D Electromagnetic Bandgap Materials. ©2003 IEEE pp. 847-850.

Yang, H-Y. D. et al. Surface Waves of Printed Antennas on Planar Artificial Periodic Dielectric Structures. IEEE Transactions on Antennas and Propagation 49(3). Mar. 2001. pp. 444-450.

Zhang, Y. et al. Planar Artificial Magnetic Conductors and Patch Antennas. IEEE Transactions on Antennas and Propagation 51(10). Oct. 2003. pp. 2704-2712.

Ziroff, A. et al. A Novel Approach for LTCC Packaging Using a PBG Structure for Shielding and Package Mode Suppression. $33^{rd}$ European Microwave Conference—Munich 2003 pp. 419-422.

International Search Report dtd. Jul. 3, 2008 for PCT/US05/35678 filed Oct. 3, 2005.

(56) References Cited

OTHER PUBLICATIONS

Extended European Search Report dtd. Jul. 9, 2009 for EP 05821199.6 filed Oct. 3, 2005.

* cited by examiner

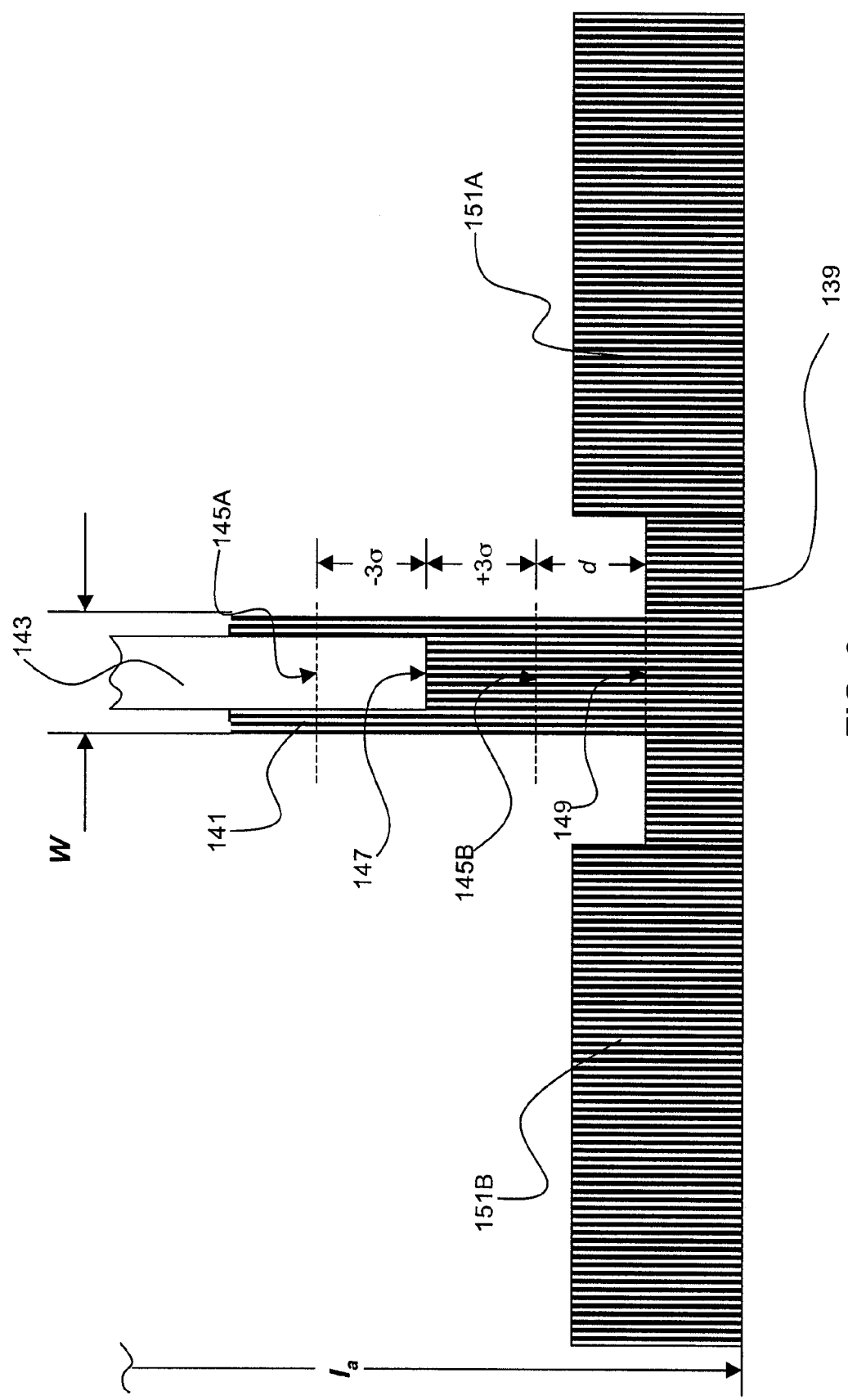

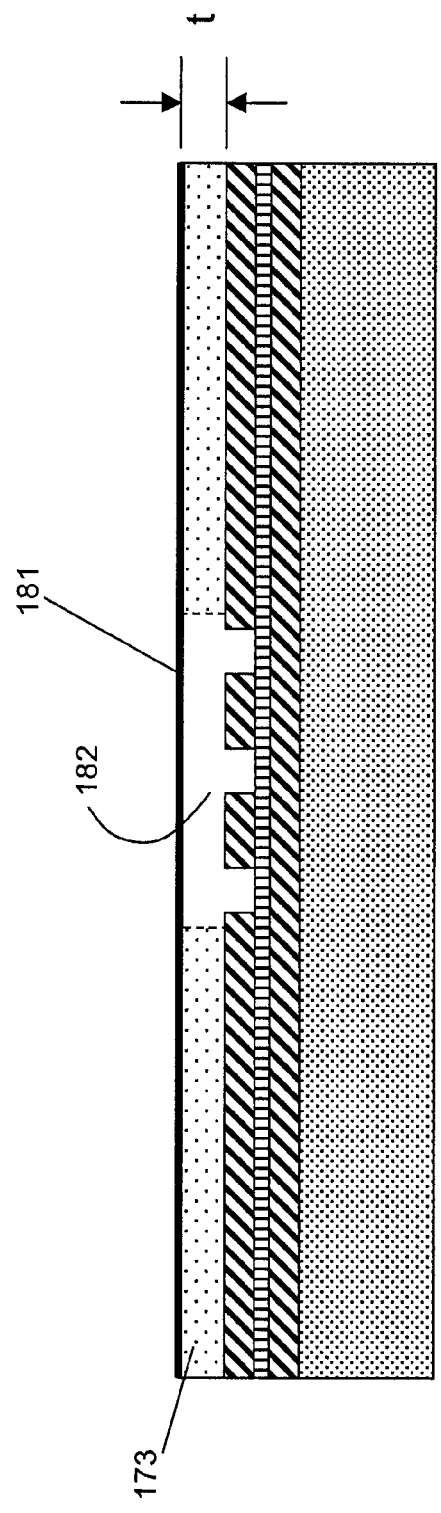
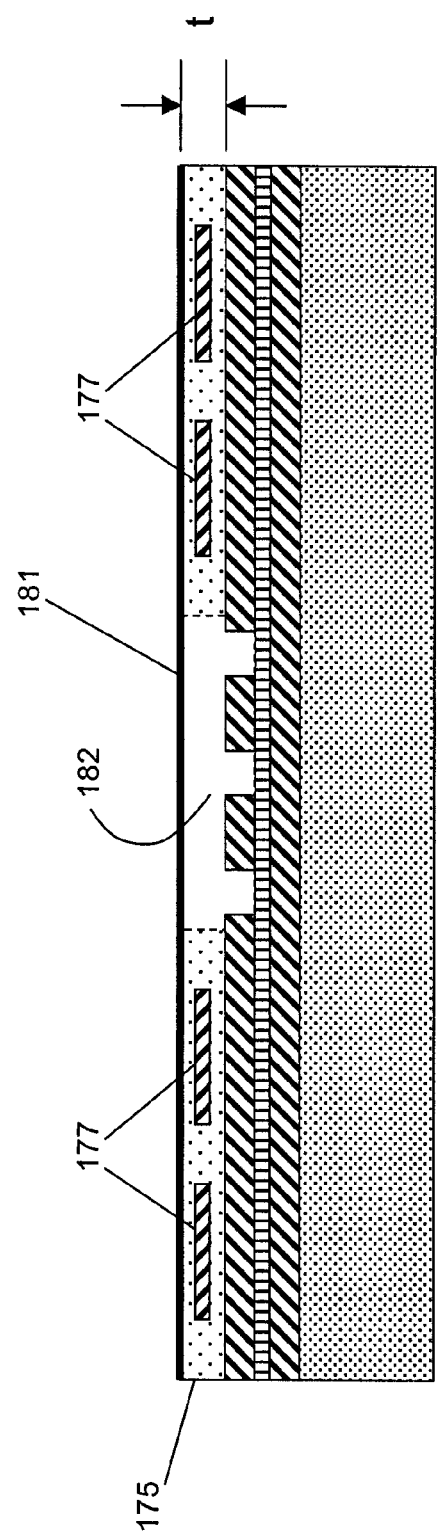
FIG. 5C
FIG. 5D

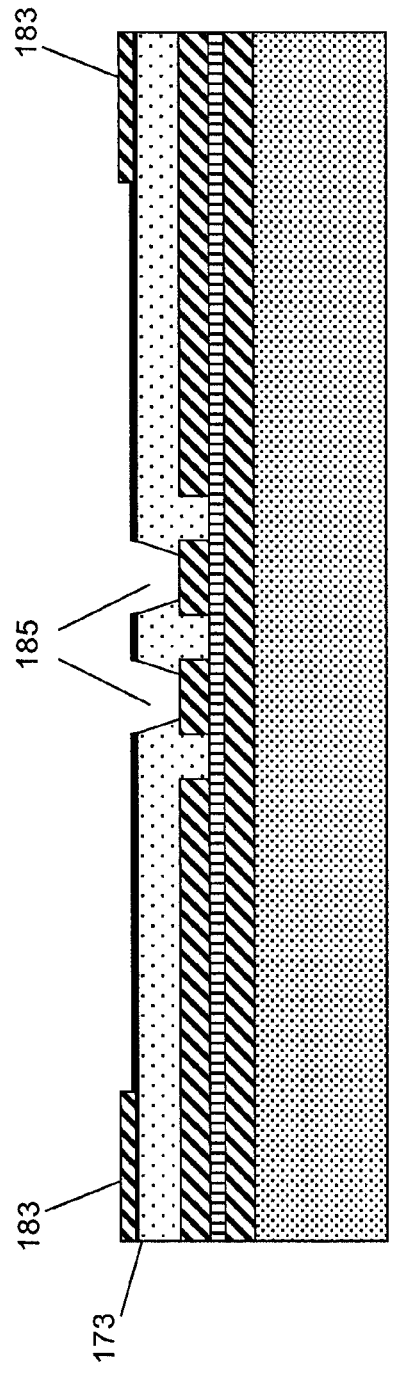
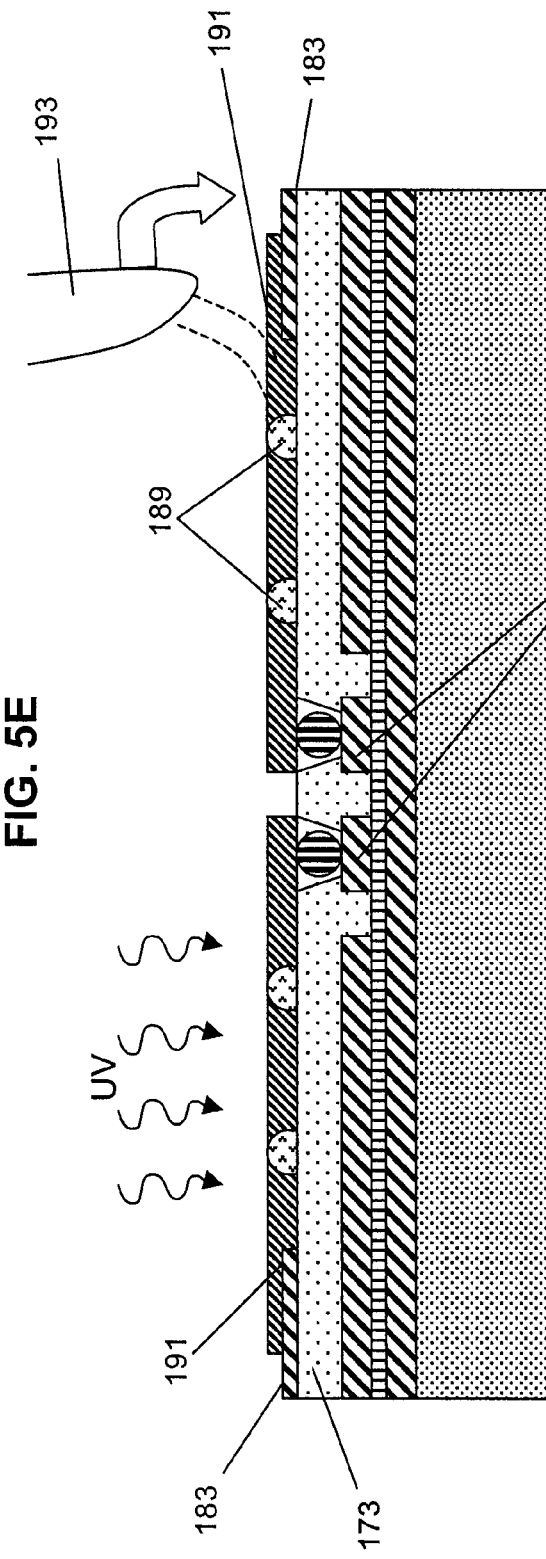

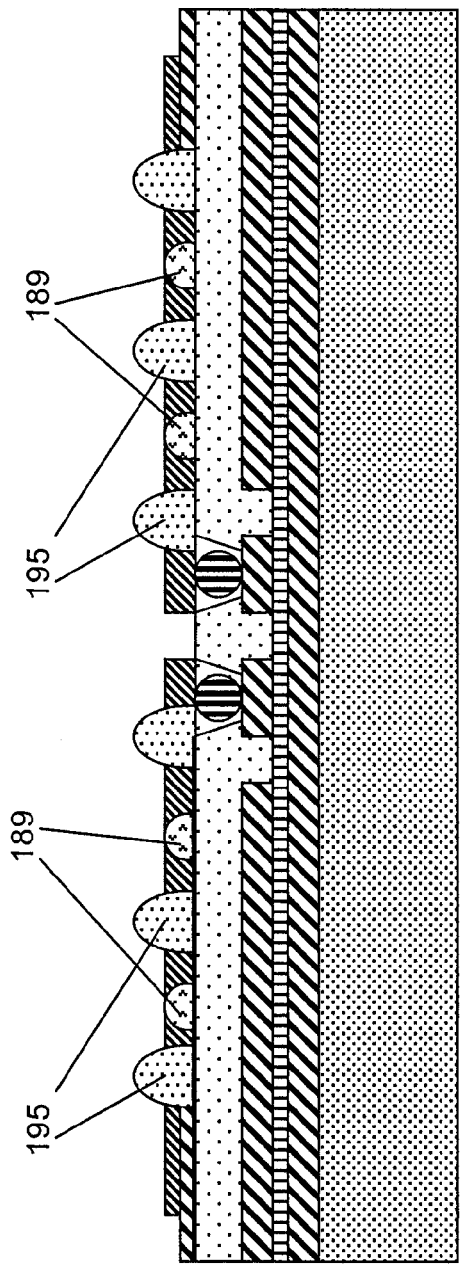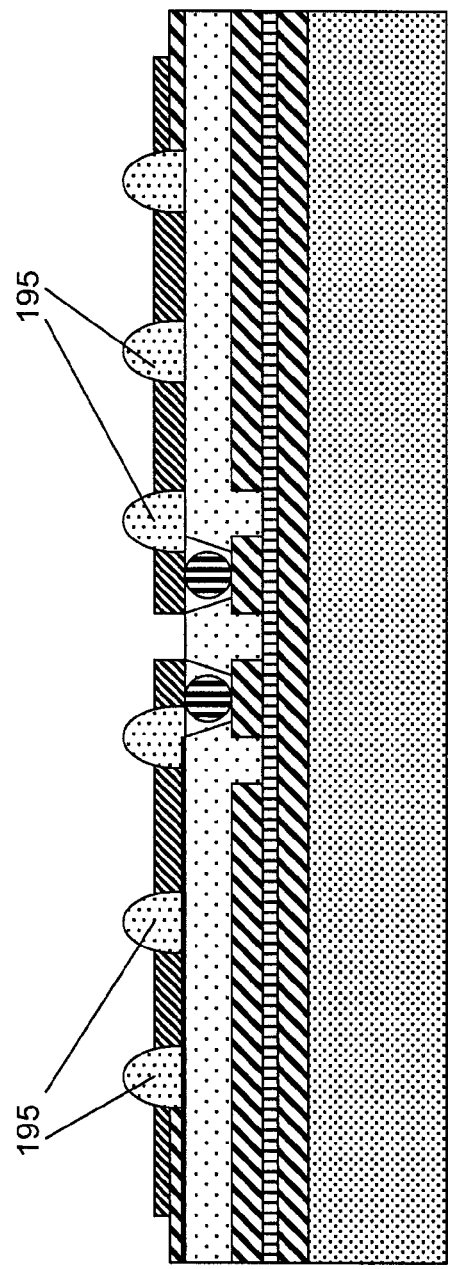

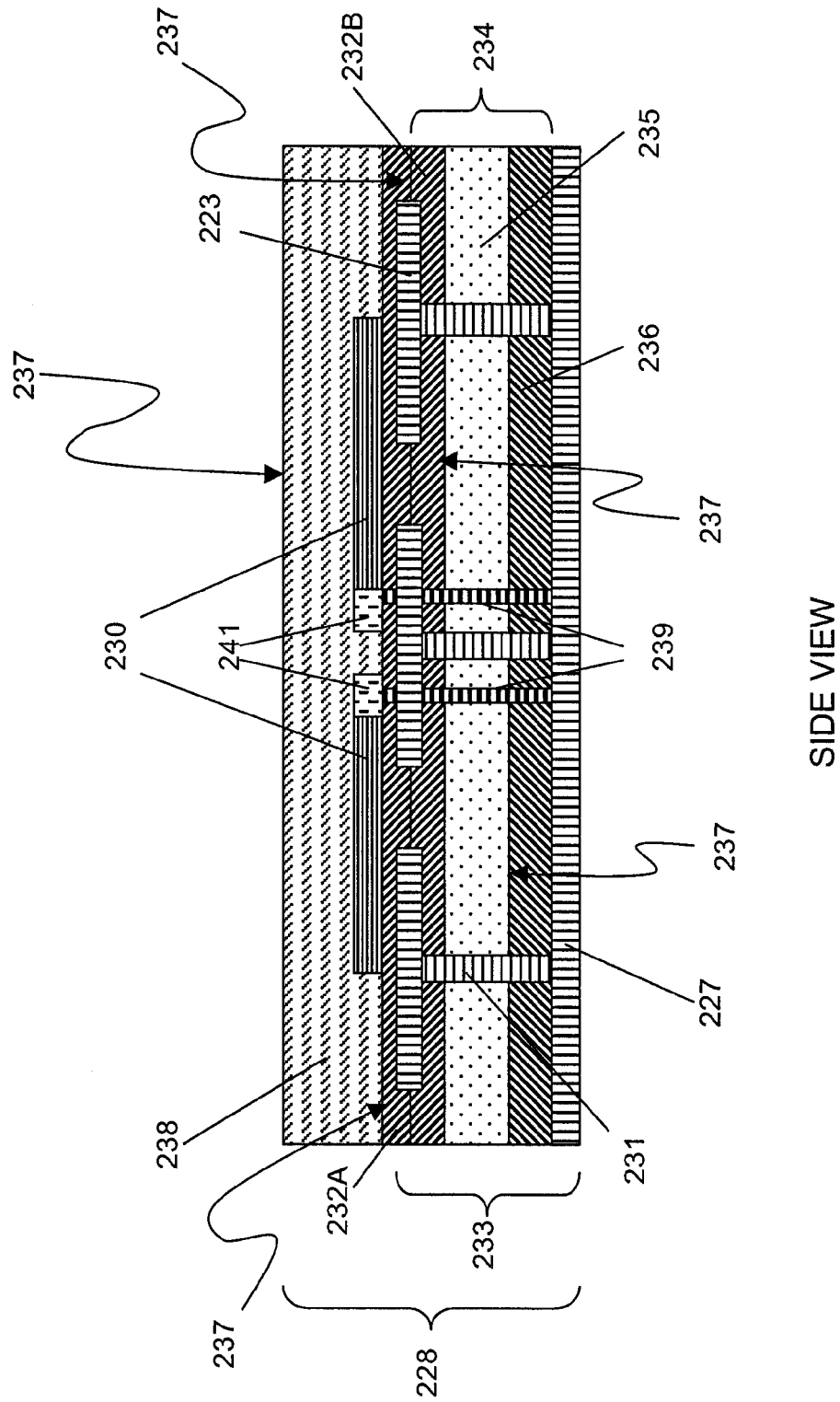
FIG. 12A SIDE VIEW

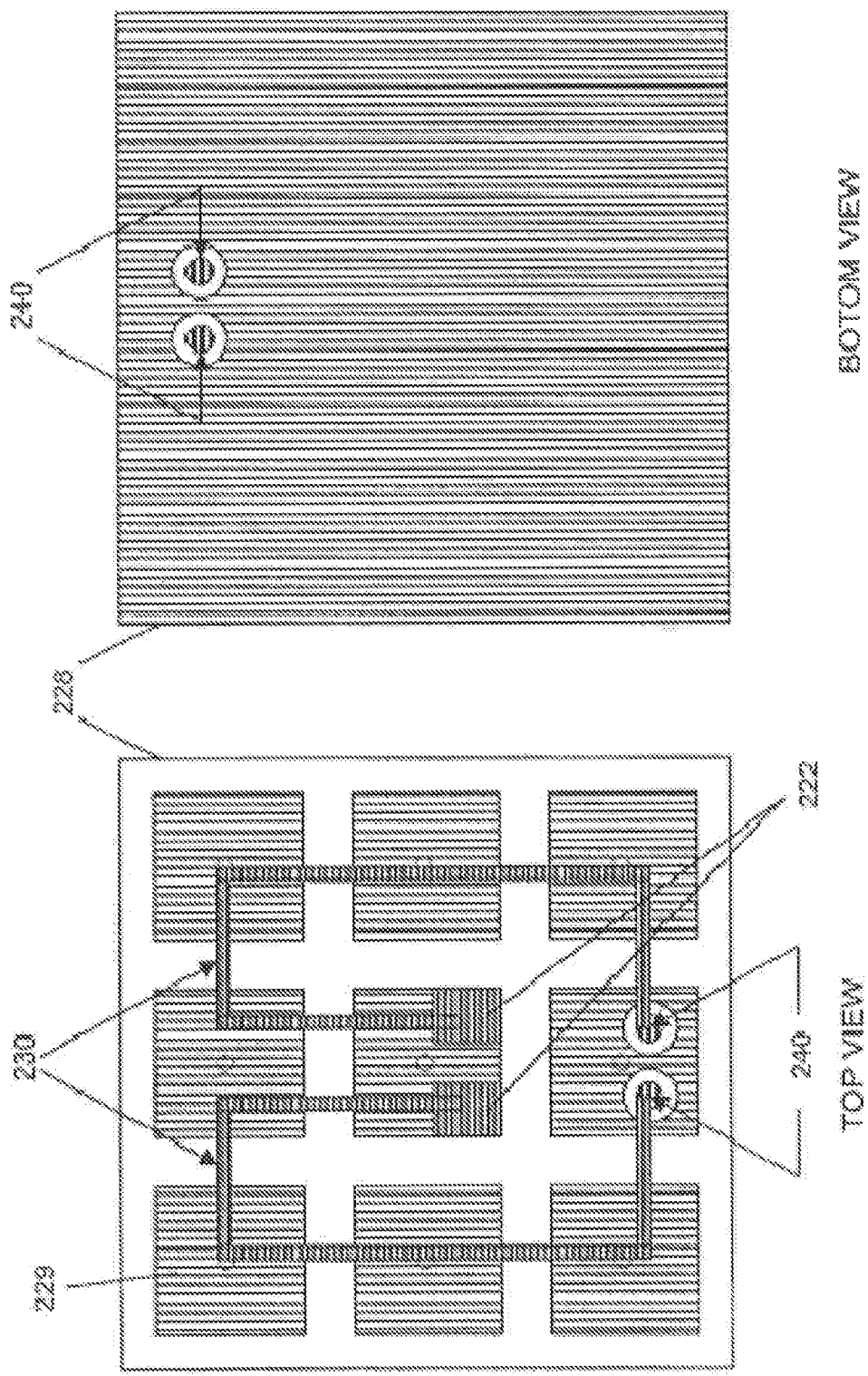

CERAMIC ANTENNA MODULE AND METHODS OF MANUFACTURE THEREOF

CROSS-REFERENCE TO RELATED APPLICATIONS

This application claims the benefit of the priority of U.S. patent application Ser. No. 13/471,012, filed May 14, 2012, now U.S. Pat. No. 8,593,819, which in turn claims priority of U.S. patent application Ser. No. 12/177,002, filed Jul. 21, 2008, now U.S. Pat. No. 8,178,457, which in turn claims priority of U.S. patent application Ser. No. 11/243,422, filed Oct. 3, 2005, now U.S. Pat. No. 7,405,698, which in turn claims the priority of U.S. Provisional Patent Application No. 60/615,174, filed Oct. 1, 2004, and 60/716,306 filed Sep. 12, 2005, and the contents of all of which applications are incorporated herein by reference as if set forth in their entirety.

FIELD OF THE INVENTION

The present invention relates generally to the construction of ceramic dielectric meta-material components that have high effective values of real permittivity but minimal body losses, and, more particularly, to small form factor wireless circuit modules operating in the radio frequency (RF) spectrum that contain at least one antenna element or at least one ultra-low loss transmission line.

BACKGROUND OF THE INVENTION

As used in the descriptions that follow, the term "meta-materials" refers to materials that possess unique macroscopic properties due to finer scale repetition or alterations of one or more secondary materials within the host material to alter the bulk body's dielectric or conductive properties.

"Electromagnetic Band-Gap" (EBG) materials, also known to those skilled in the art as "Photonic Band-Gap" materials, are meta-materials that contain one or more secondary phase dielectric inclusions that are organized in periodic array(s) with periodic spacing(s) having dimensions that are an appreciable amount of a center frequency's wavelength so as to cause constructive and destructive interference over a particular range of electromagnetic frequencies. An EBG material effectively attenuates frequencies that fall within in its bandgap or stopband as the periodic dielectric inclusions inhibit propagation due to the destructive interference of reflections off the periodic array.

The term "Perfect Electrical Conductor" (PEC) refers to an infinite conductive surface that causes electric field components of an electromagnetic wave incident upon the PEC to be totally reflected 180° out of phase with the incident wave.

The term "Perfect Magnetic Conductor" (PMC) refers to an imaginary surface generated by a periodic array of coupled inductor and capacitor elements that causes the electric field components of an electromagnetic wave incident upon the PMC to be totally reflected completely in phase with the incident wave. A finite dimension imperfect PMC can be practically constructed using meta-material construction techniques using dielectric material inclusions into a dielectric host that has suitable permittivity and permeability values and periodicity to simulate the coupled inductor and capacitor elements of the imaginary PMC. A PMC may alternatively be known as an artificial magnetic conductor (AMC).

The term "EGB Defect Resonator" refers to a resonant structure formed by selectively removing or eliminating one or more dielectric inclusion element(s) from the periodic array that forms the EGB meta-material in a manner that permits waves within a narrow frequency band of the EGB's bandgap or stopband to propagate freely through the medium and/or to be localized within a specific region of the meta-material dielectric defined by the defect.

RF electronic modules typically comprise one (or more) semiconductor chip(s) that is (are) connected to passive circuit elements (resistors, inductors, and capacitors) and/or other discrete circuit elements such as diodes, transistor switches, SAW filters, baluns, or impedance matching networks, among others, through a passive interconnect structure. The passive interconnect structure is formed by routing electrical signals over conductor leads that are attached to the surface of an organic or ceramic dielectric layer or are embedded within said organic or ceramic dielectric layer. RF electronic modules represent the next generation of microelectronic integration in that they integrate the semiconductor die with additional components that cannot be manufactured integrally to the semiconductor IC as a single part. Modules are gaining popularity in large market applications because they reduce part count and conversion costs to the OEM. In cost sensitive product applications, modules having an interconnect structure that is formed with organic dielectric are preferred; however, in applications that utilize signals operating at high frequency (e.g., f≥1 GHz) or that are subject to high thermal loads, more expensive ceramic dielectrics may be used to reduce absorptive dielectric loss and boost signal integrity. Therefore, a module containing a passive ceramic interconnect structure that offers low-cost and improved signal integrity has great value in wireless circuit applications.

Wireless circuits are used to form a network connection between a mobile platform (such as a cell phone or laptop computer) and are finding increasing application in fixed local area networks as well as radar systems, due to their low cost and easy installation. Radio communications are managed through the device's RF front-end, which will typically operate near to or at GHz signaling frequencies where the insertion loss of passive circuit components is widely known to increase.

The power budget is often a prime concern in mobile platform design, so methods that minimize insertion loss among components used to assemble the front-end have great value. For instance, the front-end of a CDMA cell phone may typically contain a power amplifier (PA) die, a duplexer switch that alternately modulates transmit and receive modes to the antenna, an isolator circuit, and a switch/diplexer component that discriminates individual frequencies of interest. This front-end circuitry will typically impose roughly 4 dB of signal loss, so most high power PA die are designed to accommodate 4 dB of loss between PA's output port and the antenna's feed point. Therefore, methods that can reduce this loss would extend battery life by allowing the power budget dedicated to radio broadcast to operate significantly longer than a conventional front-end circuit.

Signal loss is minimized in the module by limiting the overall length the signal must travel between the PA and the antenna, decreasing the signal loss per unit length along the transmission line(s) used to direct the signal from the PA to the antenna, minimizing the number of loss generating components that are needed to process the signal(s) along that path, and by ensuring excellent impedance match along the entire path between the signal source (the PA) and the antenna so as to minimize reflected energy along that path.

Physical size is another critical issue in mobile platform design. Today's state of the art has reduced the size of a cell phone's front end to an area that is roughly 1.5 inch$^2$. Therefore, an invention that would allow the entire function of an RF front end to be reduced in size to an area that is roughly the size of a PA die (4 mm×4 mm or 0.02 inch$^2$) has great value.

Physical size requirements are greater in interconnect structures that permit semiconductor dies to be flip-chip mounted on the interconnect structure. Input/output (I/O) contact pads 101 such as shown in FIG. 1 are mounted on the surface of the dielectric 111 in which conventional interconnect structures 103 are embedded, causing wells 105 to be formed between the pads 101 protruding from the dielectric's surface. Solder masks 107 are used to prevent solder balls 109 that connect the interconnect structure 103 to the semiconductor die 113 from wicking into the wells 105 during reflow processing and forming short circuits between adjacent pads. Recent increases in semiconductor integration have produced I/O pad pitches that are beyond solder mask manufacturing tolerances. This forces many module manufacturers to backside mount the semiconductor die and connect it to the interconnect structure through wire bonds located on the die's periphery, which then occupies a larger footprint. Therefore, modules that have I/O pads embedded within the dielectric of the interconnect structure, thereby allowing high-density semiconductor die to be flip-chip mounted within a wireless circuit are significant and have great value.

U.S. Pat. No. 6,027,826 to de Rochemont, et al., disclose articles and methods to form oxide ceramic on metal substrates to form laminate, filament and wire metal-ceramic composite structures using liquid aerosol spray techniques. U.S. Pat. Nos. 6,323,549 and 6,742,249 to de Rochemont, et al., disclose articles that comprise, and methods to construct, an interconnect structure that electrically contacts a semiconductor chip to a larger system using at least on discrete wire that is embedded in silica ceramic, as well as methods to embed passive components within said interconnect structure. U.S. Pat. Nos. 5,707,715 and 6,143,432 to de Rochemont, et al., disclose articles and methods to relieve thermally-induced mechanical stress in metal-ceramic circuit boards and metal-ceramic and ceramic-ceramic composite structures. The contents of each of these references are incorporated herein by reference as if laid out in their entirety.

SUMMARY OF THE INVENTION

The present invention provides circuit modules that contain at least one antenna element or at least one ultra-low loss transmission line in an interconnect structure supplying RF electromagnetic energy to an antenna element formed by embedding discrete wire or other type conductors within a pure amorphous silica, alumina, titania, or other suitable ceramic dielectric. The present invention also provides a method of constructing a ceramic dielectric meta-material that has a high effective value of real permittivity but which minimizes reflective losses, through the use of a host dielectric (organic or ceramic) having a relative permittivity substantially less than the embedded ceramic dielectric inclusions used to form the dielectric meta-material, and further allows the physical lengths of the antenna element(s), formed either with discrete wire conductors or patterned film, to be minimized without adversely impacting radiation efficiency. The meta-material structure may additionally provide frequency band filtering functions that would normally be provided by other components typically found in an RF front-end, and methods to construct the same. In a preferred embodiment of the invention the host dielectric is selected to have a minimal loss tangent to maximize the efficiency of the circuit module.

The needs for the invention set forth above as well as further and other needs and advantages of the present invention are achieved by the embodiments of the invention described herein below.

In one aspect, the present invention provides a method of constructing a semiconductor module such as, for example, an antenna module, that comprises forming a meta-material dielectric region in which high permittivity (high-κ) dielectric ceramic is incorporated within a host dielectric medium, preferably an ultra-low loss amorphous silica, alumina, titania or other suitable ceramic dielectric host to enhance the real permittivity while minimizing the dielectric loss of the meta-material dielectric. The embedded high-k region is dimensioned, sized and/or otherwise adapted for connection to electrical components of the semiconductor module. In certain embodiments includes a composite (meta-material) dielectric body formed of one or more ceramic dielectric inclusions composed of materials having a relative dielectric permittivity ≥10 and/or a relative dielectric permeability≠1 embedded in a dielectric host material comprised of amorphous silica, titania, tantalates, pure alumina, and admixtures thereof, and/or of an organic media. The combination of host material and inclusions impart upon the composite dielectric body an effective permittivity ≥4. The antenna module also includes a ground plane and at least one contact pad in a metallization layer adjacent the composite dielectric body, and one or more electrically conductive elements, such as antenna elements that, due to the presence of the composite dielectric body is/are resonant over a band of frequencies and that have a length (or lengths) ≤50% of the length that would be required to maintain the same resonance without the composite dielectric body. Controlling the grain size of the inclusions, as described below, adds stability to the antenna module.

In another aspect, the present invention provides an antenna module connectable to at least one semiconductor die and methods for constructing the module that includes an AMC ground plane. The AMC ground plane structure includes the composite (meta-material) dielectric body, an electrical ground plane and contact pads (through which electrical connection to one or more antenna elements can be made to one or more corresponding semiconductor die), and a periodic array of capacitor pads disposed at a surface of the composite dielectric body that are electrically shorted through the composite dielectric body. The array has substantially uniform periodicity and spacing. A reflected E field component of an electromagnetic wave incident upon the AMC ground plane structure that has a frequency within a bandgap range of frequencies will experience an induced phase shift that produces a condition of constructive interference between the reflected E field component and E-field components emanating from the at least one electrically conductive element that substantially share the same directional propagation vectors as the reflected E field component.

In another aspect, the present invention provides novel low-loss interconnect structures useful in any type of circuit module that requires a connection between a semiconductor die and a microelectronic component. The interconnect structure includes a dielectric body in which one or more transmission lines and electrical connectors are embedded (entirely within or at the surface of the dielectric body.) The dielectric body is comprised of multiple layers of a host dielectric material having a relative dielectric permittivity ≤4.5 or, alternatively, having a loss tangent ≤3×10$^{-3}$. In certain embodiments, impedance matching among the various electronic components (including components formed of discrete wire) is achieved through use of a layer of a high-κ ceramic material having a relative permittivity $\in_R$≥25 in the module and dimensioning the electrically conducting elements to have substantially similar cross-sectional areas and forms.

In another aspect, the present invention provides a meta-material dielectric body, useful in a variety of circuit modules, and a method of constructing same. The meta-material dielectric body may be formed by embedding one or more dielectric inclusions in a host material body having a loss tangent that is ≤3×10$^{-3}$, resulting in a composite (meta-material) dielectric body having an effective relative permittivity ≥4. As used herein, the term "embedding" does not connote any particular order of operation, as will be clarified below. Embedding a high-μ material within an ultra-low loss amorphous silica or a low-loss titania host enhances the real permeability while minimizing the magnetic losses of the meta-material dielectric. In preferred embodiments, the maximum nominal grain size is controlled to be ≤50 nanometers, or preferably ≤35 nanometers, which impart upon the meta-material dielectric body an effective permittivity that changes as a function of temperature ≤5×10$^{-2°}$ C.$^{-1}$ (for the be ≤50 nanometers embodiment) and ≤8×10$^{-3°}$ C.$^{-1}$ for the latter embodiment. The host material may be composed of amorphous silica, titania, an organic material such as Roger Duroid, GTEK and Teflon (PFTE) organic polymers, admixtures thereof, and admixtures of amorphous silica (α-SiO$_2$) and either titania (TiO$_2$) or alumina (Al$_2$O$_3$) having a corresponding chemical composition Si$_{1-x}$Y$_x$O$_2$, where 0≤x≤1 and Y is Ti or Al. Other compositions are described below.

In another aspect, the present invention provides circuit modules including one or more electrically conductive elements (e.g., antenna elements or transmission lines) disposed parallel to a metallization layer including a ground plane and at least one contact pad. The circuit modules include a composite dielectric body adjacent the metallization layer on the same side of the ground plane on which the conductive elements are located. The composite dielectric body includes at least one ceramic dielectric inclusion embedded in a host material having a relative dielectric permittivity ≤4.5. In alternative embodiments, the host material has a loss tangent that is ≤3×10$^{-3}$, and the composite dielectric body has an effective relative permittivity ≥4.

In a preferred embodiment, the present invention provides a frequency-selective antenna (FSA) element and method of manufacture thereof by embedding at least one narrow diameter discrete wire conductor as the electrically conducting elemental within an ultra-low loss meta-material dielectric.

In another embodiment, the present invention provides terminating capacitor pads to further reduce the length and simultaneously manage the manufacturing tolerances on wire bond length, without adversely impacting dipole arm length of a miniaturized, frequency-selective antenna element embedded in a meta-material dielectric.

In another embodiment, the present invention provides a miniaturized antenna element and method of manufacture thereof using an aerosol spray to dispose at least one electrical conducting element relative to (e.g., embedded within or at the surface of) a composite (meta-material) dielectric body comprised of high-κ ceramic microscopic regions embedded within an amorphous silica, alumina, titania, or other suitable dielectric host, including an organic dielectric.

At least one frequency-selective antenna (FSA) or miniaturized antenna element(s) may be configured over a conducting ground plane that shields at least one power amplifier (PA) die situated on the opposite side of said conducting ground plane from electromagnetic emanations of the radiating antenna element(s).

In a further embodiment, the present invention provides a semiconductor module having at least one frequency-selective or miniaturized antenna element disposed on one side of an artificial magnetic conductor (AMC) meta-material structure that shields at least one PA die situated on the opposite side of the AMC from electromagnetic emanations of the radiating frequency-selective or miniaturized antenna element, that provides positive gain to the antenna and which suppresses surface-wave modes that would couple energy radiated by the antenna element(s) to additional components situated nearby and vice-versa.

The stop-band gap of the AMC may be maximized by incorporating low permittivity amorphous silica and/or ferrite materials derived from an aerosol spray into the AMC meta-material structure.

In still another embodiment, the present invention provides a semiconductor module having high permittivity (high-K) or high permeability (high-μ) dielectric regions disposed within a host dielectric material at a periodic spacing and with physical dimensions that combine to create an EGB defect resonator having a pass band that is tuned to the radiation bandwidth of the antenna element(s) incorporated into said host dielectric material that shields the antenna(s) from spurious signal interference.

In yet another aspect, the present invention provides a means to reduce loss by tuning the input impedance at least one antenna element embedded within an amorphous silica host dielectric so that it is matched to the 2Ω, 5Ω or 10Ω output impedance of at least one PA die that is electrically connected to the antenna element.

In another aspect, the present invention provides a low insertion loss feed network (interconnect structure) and manufacturing method thereof that minimizes electrical reflections and signal attenuation within the portion of a semiconductor module that electrically connects at least one PA die to at least one antenna element through discrete wire transmission lines embedded in an ultra-low loss amorphous silica dielectric material. Amorphous silica or admixtures thereof maintain sufficient optical transparency to apply automated optical inspection and indexing that permits formation of vias and contact pad structures that are nominally the same physical size as the diameter of conducting elements used in the discrete wire transmission lines.

Contact pads may be embedded within the surface of the ceramic dielectric to allow the PA (or other semiconductor) die to be flip-chip mounted to the low insertion loss feed network without the need for a solder mask.

The PA (or other semiconductor) die may be flip chip mounted to the module's low insertion loss feed network to permit thermal heat sinks to be attached to the back side of the PA (or other semiconductor) die.

The present invention also provides a ceramic module and a method for constructing a ceramic module comprising at least one PA die and having single or multiple inputs and outputs and that is electrically connected to at least one narrow band (high-Q) frequency selective antenna element, the narrow band defined as have a bandwidth of less than 3%, preferably less than 0.5%. The frequency selective antenna element is specifically tuned to match the specific desired frequency band of the input(s) and output(s), such that the module performs the same function of an RF front end by using the individual antenna element(s) to isolate a specific frequency and direct its signal(s) to the appropriate input/output, effectively replacing the collective function of multiple components (SAW filters, switches, diplexers, isolators, pre-amplifiers, etc.) used in the construction of a conventional RF front end.

In a particular embodiment the ceramic module includes at least one pair of high-Q frequency selective antenna elements, with one of the antenna elements having a center frequency tuned to the receive channel of a particular communications band and the other antenna element having a center frequency tuned to the transmit channel of the particular communications band, and the respective bandwidths of the antenna elements tuned to provide sufficient signal isolation between them, such that signals transmitted do not interfere with the signals received by the other.

In yet another aspect, the present invention provides RF front-end circuits for a wireless communication devices, such as cell phones, or wireless network access points, including the novel antenna and circuit modules described above, plus additional electronics as appropriate and as described below.

An important aspect of this invention is the ability to construct high-Q transmission lines used to form antenna or interconnection networks that maintain frequency pass band stability over a wide range of operating temperatures.

The invention also advantageously improves radiation efficiencies by reducing internal reflections within the semiconductor module structure.

BRIEF DESCRIPTION OF THE FIGURES

For a better understanding of the present invention, together with other and further aspects thereof, reference is made to the following description taken in conjunction with the accompanying figures of the drawing, wherein:

FIG. 3 represents termination pad geometries to manage manufacturing tolerances in wire bond length without significantly altering capacitive loads;

FIGS. 5A-5J are illustrations of sequential steps used to create a discrete wire antenna embedded with a dielectric or meta-material dielectric body and methods that can be used to match the antenna elements impedance to a semiconductor die;

FIGS. 12A-12E are illustrations showing method steps involved in constructing an antenna element comprising an artificial magnetic conductor comprising ultra-low loss amorphous silica or titania dielectric host material as a ground plane to an impedance-matched antenna module;

DETAILED DESCRIPTION OF THE INVENTION

Figure 2A:
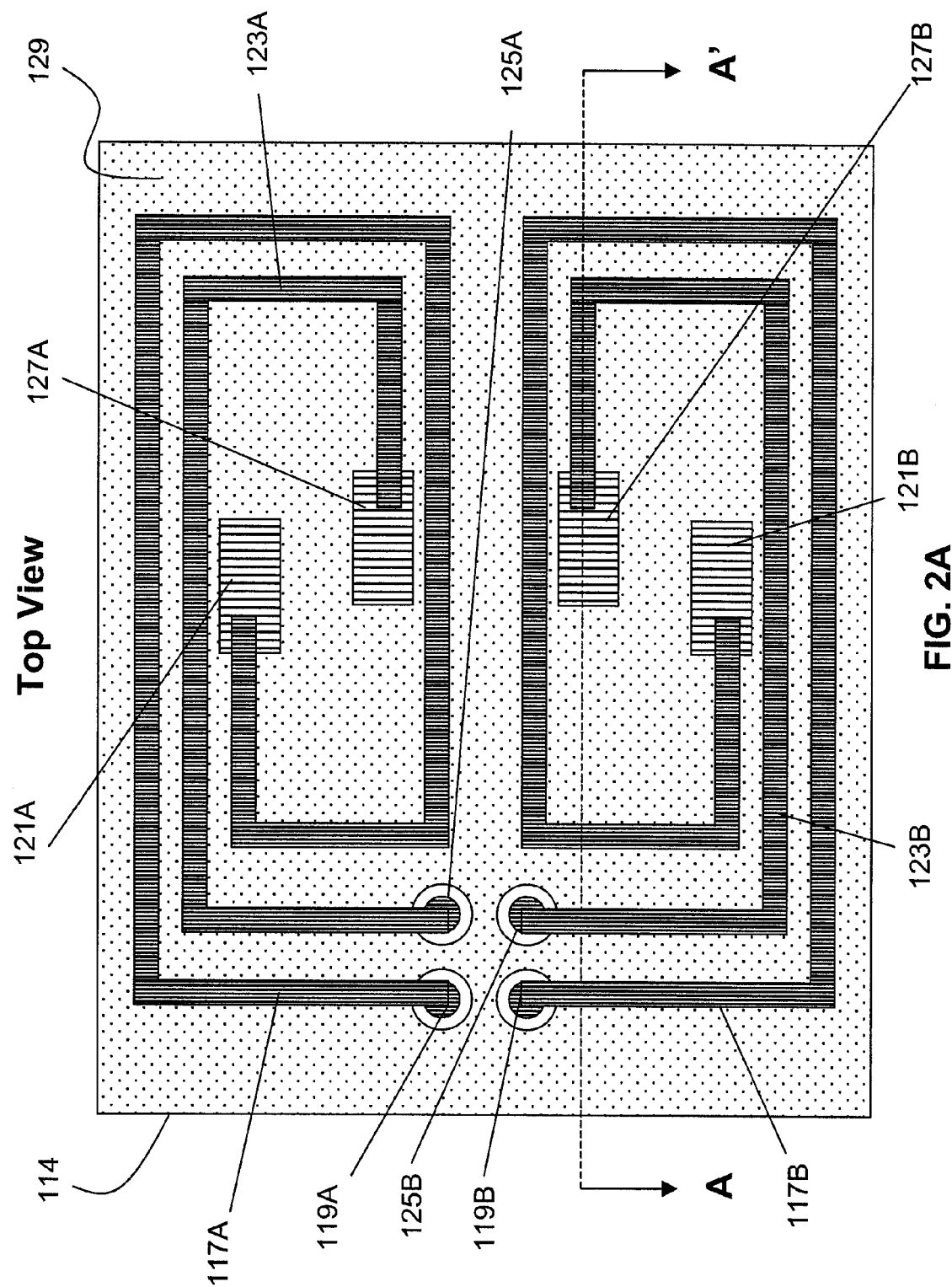
FIGS. 2A-2E are top and cross-sectional views of a fully assembled module containing a power amplifier die that is electrically connected through an ultra-low loss feed network (detailed in FIGS. 2C-2E) to two folded dipole antennae on one side of the die and a thermal heat sink on the other side of the die.

Reference is now made to FIGS. 2A thru 4 and FIGS. 6 thru 11, which illustrate preferred embodiments of various aspects of a wireless circuit module 115 in accordance with the present invention, and FIGS. 5A-5J and 12A,B, which illustrate the processing steps used to create the circuit module. Circuit module 115 includes, in its most complete embodiment, an antenna module 114, which is in turn comprised of a composite ceramic dielectric body, at least one electrically conductive element, a low attenuation interconnect structure, and a metallization layer adjacent the composite dielectric body and including a ground plane structure and at least one contact pad. References to "discrete wires" are intended to denote pre-fabricated, conducting wire bodies that are geometrically uniform along their lengths and, when comprised of metal, which contain significantly higher metallurgical purity and geometric uniformity than is possible for traces made from conductive pastes or patterned thin films. "Round wire" is understood to define wire structures that have substantially circular cross-sectional area. In contrast, "ribbon" wire is intended to refer to wires having a roughly square or rectangular cross-sectional form. In principal, however, discrete wire can assume any cross-sectional geometry (cross-shaped, hexagonal, star-shaped), without limitation, that improves the efficiency of the design. Round geometries will possess higher self-inductance and, therefore, are preferred in transmission line structures and antenna element configurations. Ribbon wires have lower self-inductance and are more useful in low-loss (low-impedance) transmission lines. FIG. 2A shows two arms 117A, 117B of a discrete wire dipole antenna (with arms folded in this instance) that are electrically connected at feed points 119A, 119B to an amplifier (power amplifier (PA) or low noise amplifier (LNA)) or other semiconductor die 135 located on the opposite side of the antenna module 114 and which terminate on respective capacitive pads 121A, 121B. A second dipole antenna element 123A,B having its own feed points 125A, 125B and terminating capacitors 127A, 127B is also shown. Antenna elements 117 and 123 are constructed over a ground plane 133 that is perforated at the feed points, through which electrical contact is made to at least one mounted power amplifier die 135 through an electrical interconnect structure 137. Although the semiconductor die 135 may be mounted in a variety of ways, flip-chip mounting is preferred in order to facilitate thermal management using a thermal reservoir device 139 providing temperature stability through the backside 136 of PA die 135. In a flip-chip configuration, the semiconductor die 135 would be mounted opposite the electrical feed network 137 that establishes electrically connection at the feed points 119,125 of the antenna elements and circuits board structures 140 that electrically connect the wireless circuit module 115 to a larger system. Conventional interconnect structures include impedance matching networks to compensate for the mismatch between the source impedance of the semiconductor die, typically 2-10Ω, and the load impedance of the antenna element, typically 50Ω. The antenna module's efficiency may be improved by impedance matching the antenna load to the 2-10Ω source impedance of the semiconductor die. This impedance match should be maintained throughout interconnect structure 137 and antenna feed points. To achieve proper impedance matching and reduced signal reflections along the feed network, it is necessary to construct transmission lines (and antenna elements) having intrinsic impedances tuned to 2-10Ω, and to maintain near uniformity among the physical dimensions of all conducting elements found in the line, pad, and via structures. As described below, the use of round, small diameter discrete wires is desirable in constructing a frequency-selective antenna element. The characteristic impedance, $Z_o$, of a wire over a ground plane is calculated per the formula:

$$Z_o = \mathrm{SQRT}(L/C), \qquad (1)$$

where $L=2\times10^{-7}\cdot\ln(2B/R)$ and $C=1.17\times10^{-17}\cdot\in_R/L$, and B is the height of the wire's center above ground and R is the wire's radius. Inserting a high-κ ceramic base dielectric layer 131 having a relative permittivity $\in_R\geq10$, preferably $\geq25$, and even more preferably $\in_R\geq100$, between the wire (antenna elements 117 and 123) and the ground plane 133 makes the construction of a low impedance (2-10Ω) discrete wire antenna element from a small diameter (18 μm) wire practical. (Similar techniques may be employed in constructing the interconnect structure.) Lower impedance (2-5Ω), smaller round wire diameter (18 μm) feed networks require higher permittivity ceramic layers 131 (e.g., $\in_R=100$ and 150), to achieve layer thicknesses of t=1.4 and 3.3 μm, respectively, for 50 input impedance. These thicknesses are within reasonable existing manufacturing capabilities. Whereas, even higher permittivity ceramic layers (e.g., $\in_R=450$) are able to achieve an input impedance of 2Ω with a layer thickness on the order of 1 μm for circuits constructed with discrete wire having a diameter $\leq25$ μm. Higher impedance (10Ω) and larger diameter wire (>25 μm), or the use of ribbon wire conductors, alleviates the need for a dielectric layer 131 with relative permittivity $\in_R\geq100$ separating the wire (antenna elements 117 and 123) from the ground plane 133, so high-κ dielectrics with $\in_R\geq60$ are preferred for the high-κ dielectric layer 131 when large diameter ($\geq25$ micron) wire or ribbon wire discrete wire conductors are incorporated into the antenna modules. In instances when the module is assembled from discrete components it is advantageous to use any underfill or adhesive agent 130 known to practitioners skilled in the art that mechanically secures the assembly into a solid structure.

The antenna elements may be disposed upon or embedded (completely or partially) in composite dielectric body 129, which is composed of at least one ceramic dielectric inclusion embedded in a low permittivity dielectric host material ($\in_R\leq10$, preferably $\in_R\leq4.5$) comprised of an organic dielectric, amorphous silica, pure alumina, titania, tantalates, and/or admixtures thereof. The dielectric inclusions have a relative dielectric permittivity $\geq10$ and/or a relative dielectric permeability$\neq1$, that cause the effective relative permittivity of the composite dielectric body to increase without cause the reflectance of the body to become too strong. As shown below, the higher effective permittivity of the composite body (($\in_{REff}\geq10$, preferably $\in_R\geq4$) causes the physical lengths of any resonant antenna elements embedded within it to be reduced by more than 50% and can also impart spectral filtering to the antenna module. Various configurations of the composite dielectric body and conducting elements are possible. In one embodiment, the composite dielectric body simply comprises a base dielectric layer having a surface at which the electrically conductive element(s) is/are disposed, and a dielectric host layer disposed above the base dielectric layer and covering the at least one electrically conductive element. In such an embodiment, the dielectric inclusions may be embedded in either or both of the base dielectric layer and the dielectric host layer. In other embodiments the composite dielectric body includes multiple dielectric layers and optionally spacer layers therebetween. The conductive elements and dielectric inclusions may be embedded as desired in any of the additional layers.

Figure 2B:
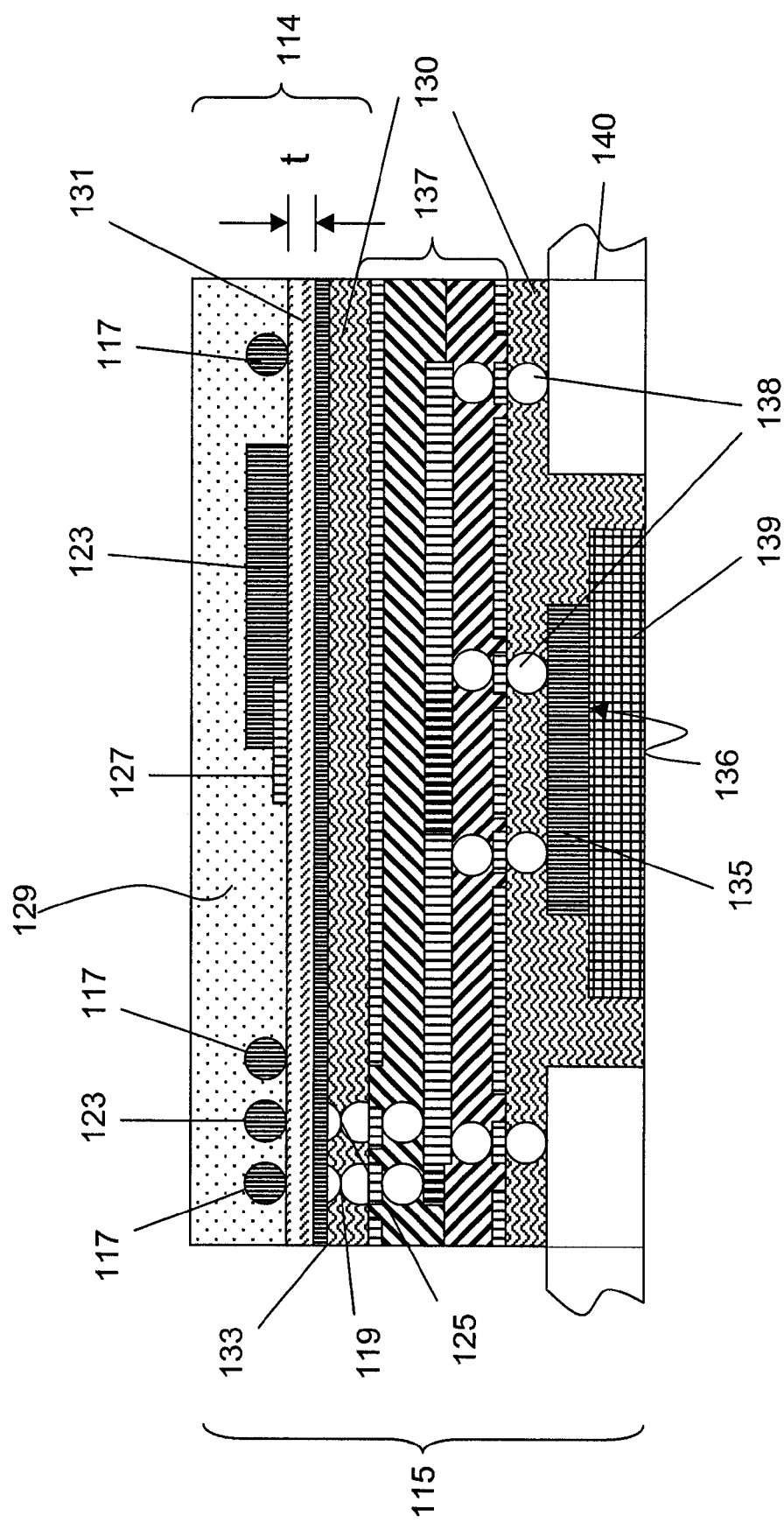
Figure 2C:
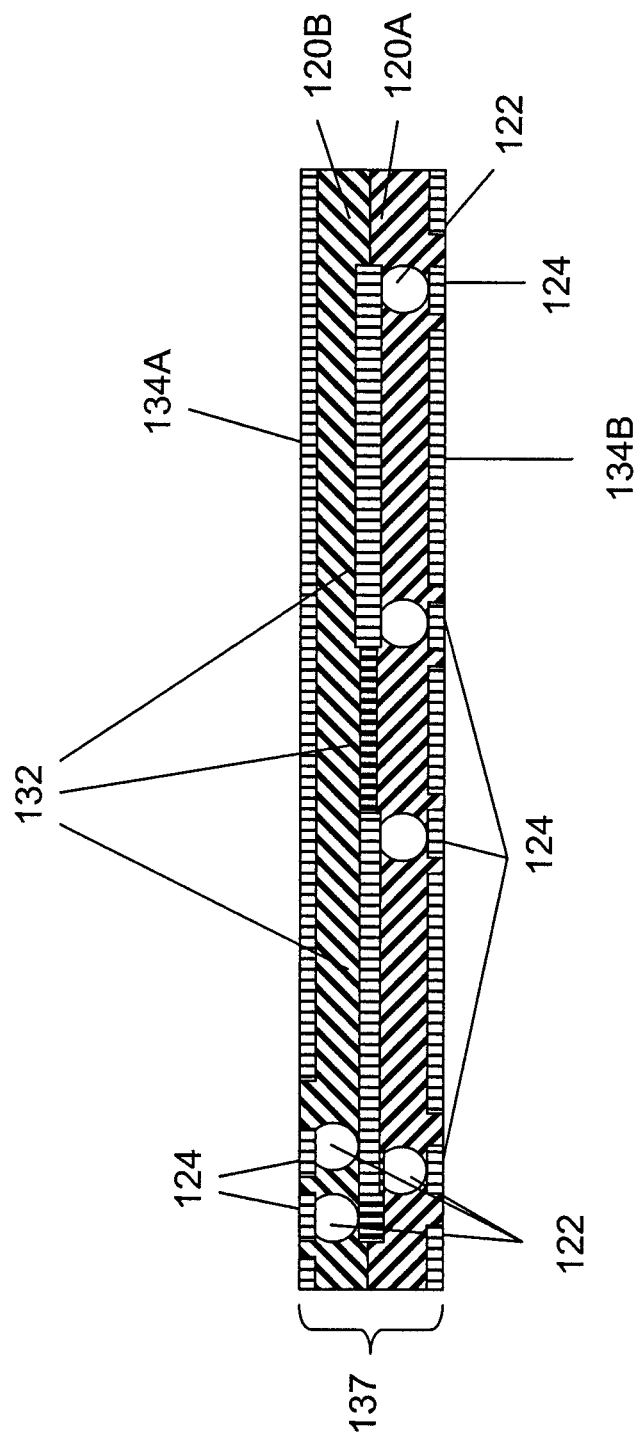
Figure 2D:
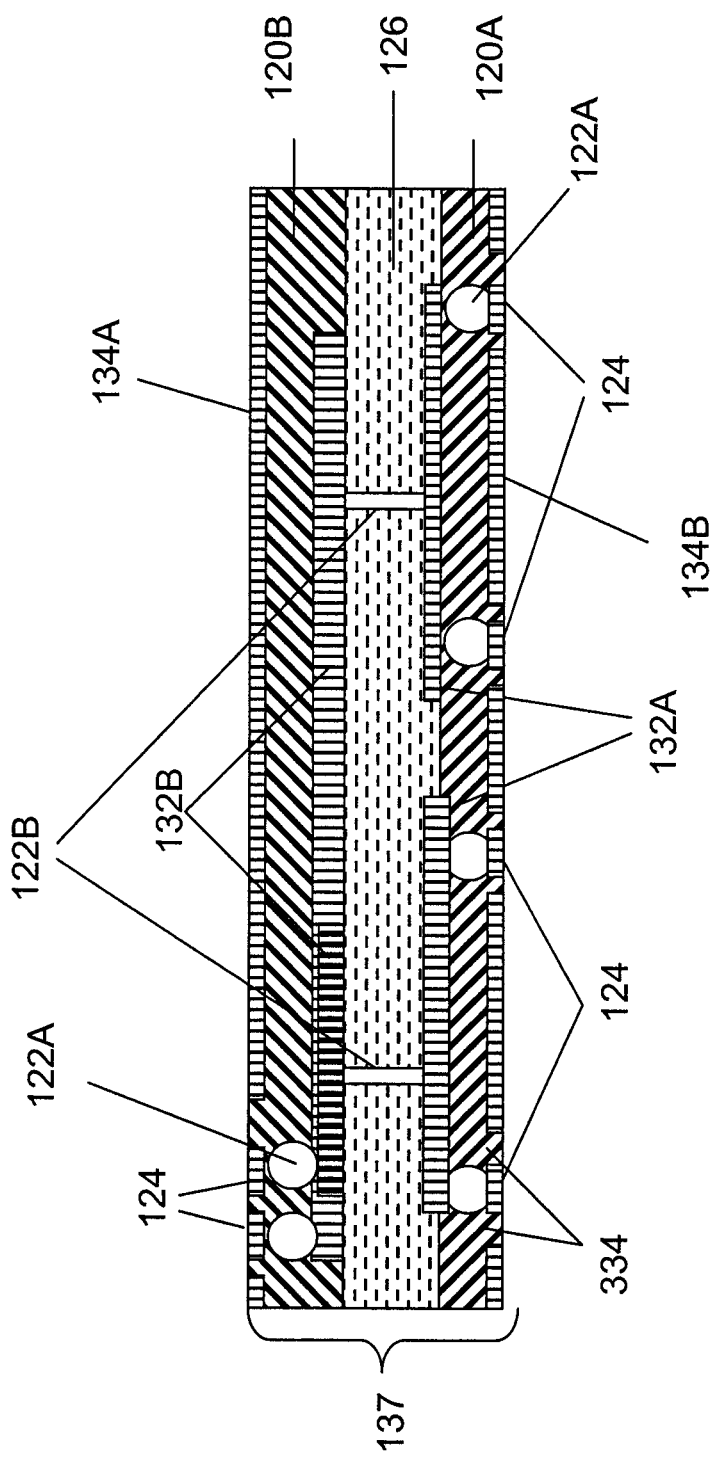
Figure 2E:
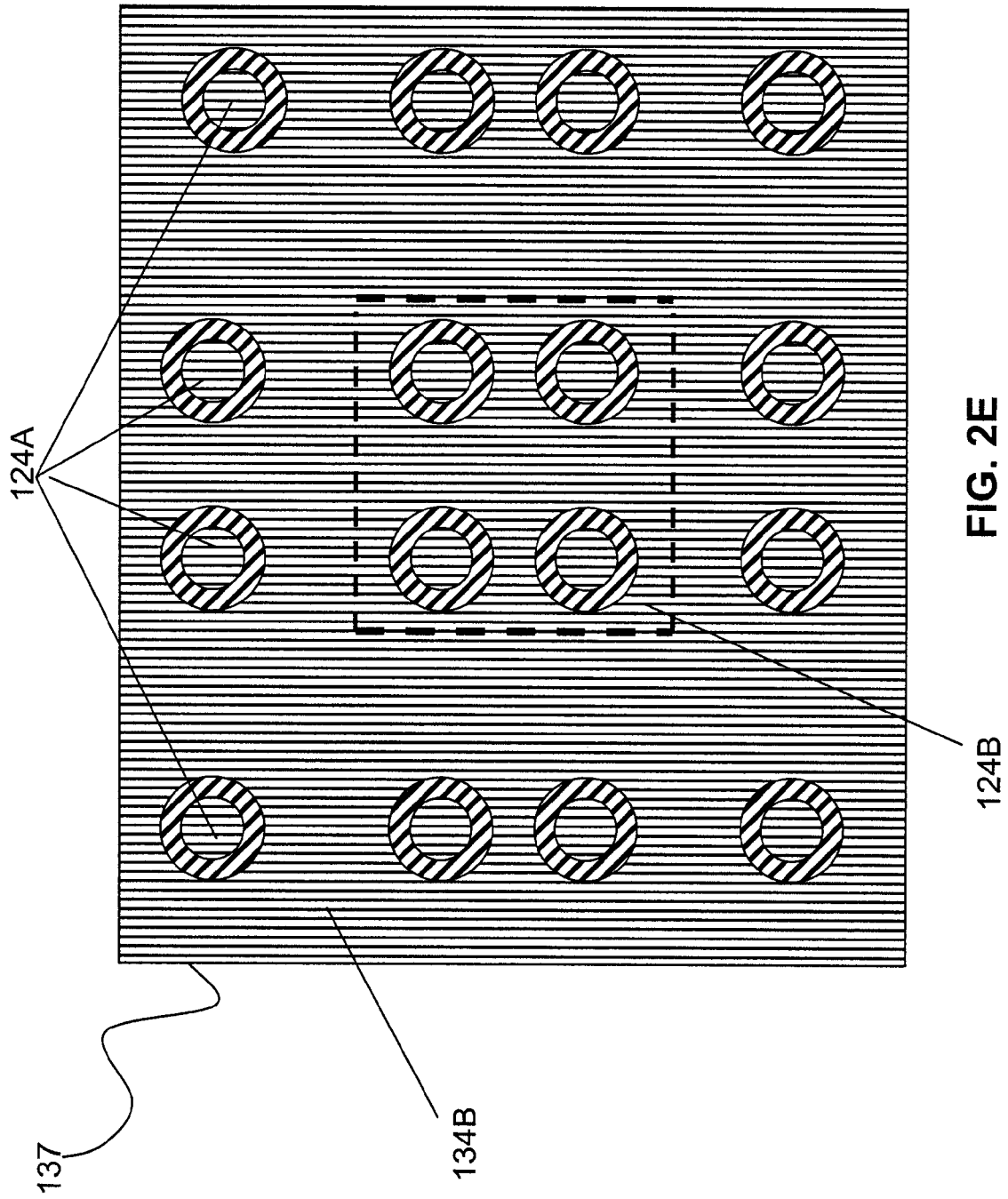

FIGS. 2C-E provide greater detail on the electrical interconnect structure used to establish electrical communication between the power amplifier (or other) semiconductor die 135 and the antenna element(s). As referenced above, the interconnect structure may be comprised of a conventional interconnect structure that has an impedance-matching network (as well as other components) integrated within it. In a preferred embodiment of the invention (see FIG. 2C), the electrical interconnect structure 137 contains a network of transmission lines 132 positioned at a uniform distance above one or more metallization layers including ground planes 134 located at the top 134A or bottom 134B of the electrical interconnect structure 137 and embedded between dielectric layers 120A,B. Electrical contact is established between devices located on the opposing major surfaces of the interconnect structure 137 by conductive means 122 inserted into the dielectric layers that attach the transmission line network 132 to contact pads 124 located in, but electrically isolated from, the metallization layer that forms the ground planes 134. The transmission line network 132 may optionally include pad structures (not shown) similar to 121A/B that might be alternatively used as terminations for transmission line structures, capacitive elements, or localized stop layers to provide a means to drill through a dielectric layer and insert conductive means 122 to make electrical contact with a conductive element (transmission line, antenna element or contact pad) situated on a dielectric surface placed in a position superior to the transmission line network 132. For impedance matching reasons described below, it is preferable that the transmission line network 132 have physical dimensions (diameter and cross-sectional form) similar to the antenna element, when that antenna element is formed from a discrete wire. In embodiments comprising small diameter ($\leq50$ μm) discrete wires, dielectric layers 120A,B composed of high-κ ceramic dielectric are required to provide an electrical interconnect structure with intrinsic impedance that is matched to the source impedance of the semiconductor die. High-K dielectric materials typically have high loss factors. Therefore, it is an additional preferred embodiment of the invention to insert a lower loss dielectric layer 126 between the dielectric layers 120A,B and the transmission line networks 132A,B associated with each dielectric layer as shown in FIG. 2D. This lower loss dielectric layer 126 may comprise a pure organic or ceramic dielectric material, or be a composite dielectric body comprising a pure organic or ceramic dielectric host material that contains dielectric inclusions that cause the effective relative permittivity of the lower loss dielectric layer 126 to increase or match the relative permittivity of the base dielectric. In this configuration, conductive means 122 is used to make electrical connection between the respective transmission line networks 132A,B and the contact pads 124. Alternatively, the base dielectric layers could also be composed of composite dielectric materials comprising a pure organic or ceramic dielectric host material that contains dielectric inclusions that cause the effective dielectric permittivity of the layers to become elevated. The present invention encompasses more complex interconnect structures that might require multiple interconnect structures 137 to be assembled one on top of one another to complete the circuit that is inserted between the semiconductor die 135 and the antenna element(s). The module is completed by affixing the at least one electrical interconnect structure 137 to at least one semiconductor die 135 mounted on a thermal reservoir device 139 and an external circuit 140 using additional conductive means 138, preferably through the use of a suitable underfill or adhesive agent 130. In order to minimize the module's footprint, it is preferable to position those contact pads used to make electrical connection to the external circuit 124A as a peripheral array, while locating those contact pads used to make electrical connection to the semiconductor device 124B to an interior region of the bottom ground plane 134B of the electrical interconnect structure 137. (See FIG. 2E). These principals may be alternatively applied to discrete wire ribbons or patch antenna elements without the need for extreme permittivity ($\in_R \geq 150$) as the lower self-inductance of these structures naturally leads to lower intrinsic impedance.

Although FIGS. 2A-2B depict a dual-band antenna module, wherein one of the dipole antennas 117, 123 might be used for transmit frequencies and the other used for receive frequencies or, alternatively, wherein they both might be used to manage transmission (or reception) over a single frequency band, dual frequency bands, or multiple frequency bands of a wireless interface, as is the case in 802.11g applications; i.e., the scope of the invention is not limited to single band, dual band or multiple band antenna modules, or folded dipoles. An antenna module in accordance with the invention might comprise a single straight dipole, an array of dipoles, a log-periodic dipole array, spiral antenna(s), trapezoidal, tear drop, or multiple dipole antennas folded in shapes that are different from those depicted in FIG. 2A. Unless otherwise stated, it should be assumed that a particular metallization layer, whether used to form an antenna element, a transmission line, a capacitor or contact pad, or a ground plane structure is formed using a thin film deposition technique, such as sputtering or evaporative deposition, or electroplating, or a lower cost thin/thick film deposition screen printing or ink-jetting technique that locally applies the metallization using a conductive paste or ink. The specific design of an individual antenna element or array would be appropriately determined by technical criteria for a specific application. The antenna module's construction and architecture, and methods used to narrow the bandwidth of an individual antenna element, provide sufficient spectral filtering to impart a high degree of frequency selectivity. Methods provided here allow miniaturization of overall dimensions, and improve performance efficiencies by minimizing power loss in comparison to conventional RF front-end assemblies. Additional options include shielding for the semiconductor die and individual antenna elements from spurious electromagnetic signals emanating from each other as well as ambient, or adjacent sources.

In general, the overall length of each dipole arm 117A, 117B is chosen such that the combined length of the two arms is resonant at an output/input frequency of interest. For a dipole in free-space, the resonant length, l, varies as:

$$l \sim \lambda/2, \qquad (2)$$

where λ is the free-space wavelength of the center frequency of interest. It is well known to practitioners skilled in the art of antenna design, that adding a capacitive load to the antenna will also shorten the resonant length, l, while increasing the antenna element's bandwidth. This could be achieved by adding the capacitive load as a parallel plate capacitor (not shown) formed between the ground layer 133 and the pads 121A, 121B terminating the dipole arms 117A, 117B. Since very thin layers of high-κ ceramic material separates the pads and ground layer, substantial capacitive loads could be added using very small surface areas, providing significant latitude to enhance miniaturization (by shortening the dipole arm length) and trim the antenna bandwidth.

It is well known to practitioners skilled in the art that dielectric loading will, for an infinite dielectric body, decrease the resonant length as:

$$l \sim \lambda/(2\sqrt{\in_R}), \qquad (3)$$

where $\in_R$ is the relative permittivity of the dielectric body. Thus, if an antenna element is embedded within an infinite dielectric body that has an $\in_R = 100$, the resonant length of the dipole is reduced by a factor of 10 compared to its free-space resonant length. The antenna element's bandwidth will decrease with increased dielectric loading, and a narrower bandwidth may also be achieved by constructing the antenna element with smaller diameter wire. One technique provided by the invention combines a wire bonding process, which positions discrete wires with small diameters (e.g., current standards can utilize 18 μm wires) very precisely, with a manufacturing process that produces ceramics having dielectric properties not known to occur in nature. Existing trace geometries used in prior art multilayer ceramic modules have minimum dimensions on the order of 2 mil (50 μm), which limits frequency selectivity, and imperfect surface roughness (≈5 μm RMS) and metallurgical purity, which contribute to phase noise and resistive loss at higher frequencies. In contrast, wire bond conductors provide nearly perfect micron scale geometric controls, negligible surface roughness and the highest metallurgical purity possible, characteristics useful in overcoming many of the high frequency limitations of conducting elements constructed from metallic pastes. These properties permit construction of antenna elements that are both frequency-selective (narrow bandwidth) and small in size, thereby eliminating the need for costly and loss generating filtering and switching components in an RF front-end, and reducing the footprint in mobile platforms, like cellular phones and laptop computers, where means that reduce occupied volume have great value. Numerical methods are used to determine precise specifications pertaining to the selection of the number of antenna elements, their wire diameters, the dielectric properties and volume of high-κ dielectric material used to surround the antenna elements, and the capacitive loading that is used to terminate the discrete wire antenna element to achieve certain size, bandwidth, and frequency performance targets.

It should also be noted that the terminating capacitive pads 121A, 121B should be designed to accommodate manufacturing tolerances to achieve reproducible control over the antenna element's center frequency. Mechanical deformation to wires used to form the antenna element(s) during the pay-out of a wire bond assembly can introduce slack in the length of the wire between stitch bonding steps that are used to bond the antenna element (discussed below). Minor variations in the wire's overall length can significantly alter the antenna's tuning. For instance, wire slack in an antenna embedded in a dielectric material 129 with an $\in_R = 100$ that induces the combined length of both dipoles arms to vary by ±10 μm will cause the resonant (center) frequency, to vary by ±1 MHz. Therefore, wire bond machines with systems to manage bond length are preferred assembly tools. Furthermore, the geometry and size of the capacitive pads should be designed not only to add capacitive load that tunes bandwidth and center frequency, but also to accommodate manufacturing tolerance for wire bond length by becoming an integral component that determines the dipole's resonant length. While there may be circumstances wherein the terminating capacitive pads are shaped as simple rectangles while still accommodating manufacturing tolerances affecting wire bond length, in a preferred embodiment it is desirable to use a specific region of the pad to accommodate potential variations in wire bond length that will not affect the capacitor pad's feed point, nor substantially alter capacitive loading on the pad. FIG. 3 shows a possible configuration for the terminating pad 139 that minimizes any capacitive load added to the pad structure to compensate for variations in wire bond length without substantially affecting the pad's electrical feed point. Pad 139 includes a narrow neck or "landing strip" 141 having width W that is slightly larger (approximately 5 μm or less) than the diameter of bonded wire 143 and is sufficiently long to accommodate the most probable wire length 145A, 145B deviations from the desired the wire bond termination point 147. The length of the "landing strip" is sufficiently long to provide a distance d that allows the point 148 at which the "landing strip' adjoins the main pad structure 149 becomes the effective feed point to the capacitive pad, regardless of whether the wire terminates at point 145A or point 145B. The landing strip is preferably placed in electrical communication with perpendicular pad areas 151A, 151B that comprise at least 95% of the capacitive load. The perpendicular pad areas 151A, 151B need not be square or rectangular as shown in FIG. 3, but could assume triangular, digital, circular or any arbitrary geometric form that provides sufficient capacitive load within space limitations provided by specified design criteria. As a consequence of this configuration, the wire, landing strip, and capacitor pad now determine resonant length $l_a$ of the dipole arm.

In one embodiment, low permittivity materials like pure amorphous silica ($\alpha$-SiO$_2$) or organic media (such as FR4, Rogers Duroid™, GTEK, or PFTE Teflon™) having $\in_R$=3.9 and 2.2≤$\in_R$≤4.6, respectively, can be used as the host dielectric body for electrically conducting elements used to form the antenna or transmission line structures as well as ceramic dielectric inclusions that act as meta-material modifiers. In this instance, it is preferable to select the dielectric inclusion from a group of materials having $\in_R$≥9.3, which can include pure alumina, titania (TiO$_2$), tantalum oxides, niobium oxide, neodymium oxide, zirconium oxide, hafnium oxide, or any admixture thereof. In other embodiments, a higher permittivity ceramic host (60≤$\in_R$≤100) having moderately low loss, such as pure alumina, tantalum pentoxide (Ta$_2$O$_5$, $\in_R$≅60) or titania ($\in_R$=90) might also be used as the host dielectric. In this instance, the dielectric inclusions would comprise high permittivity ceramics ($\in_R$≥200), preferably, but not exclusively, selected from the group consisting of barium-strontium titanate ceramic (Ba$_X$Sr$_{1-X}$TiO$_3$), barium-strontium zirconate-titanate (Ba$_X$Sr$_{1-X}$Zr$_Y$Ti$_{1-Y}$O$_3$), and lead-lanthanum zirconate-titanate (Pb$_X$La$_{1-X}$Zr$_Y$Ti$_{1-Y}$O$_3$), where 0≤X≤1 and 0≤Y≤1. The dielectric inclusions acting as meta-material modifiers in either organic or ceramic dielectric hosts may also comprise magnetic materials ($\mu_R$≠1), such as ferrite (Fe$_2$O$_3$), alkaline earth ferrites (MFe$_{12}$O$_{19}$), where M is selected from the group consisting of Mg, Ca, Sr, Ba, or lanthanum manganates (LaMnO$_3$) doped with any element from the periodic table.

Organic host materials are attractive because of their lower cost, but can often contribute higher loss and have dielectric parameters that are not as stable as a function of frequency or temperature, so the use of ceramic materials is preferred. The host dielectric body could also be composed of an admixture of amorphous silica ($\alpha$-SiO$_2$) and titania (TiO$_2$), having a chemical composition Si$_{1-x}$Ti$_x$O$_2$, where 0≤x≤1, or an admixture of amorphous silica and alumina [1−X].SiO2.X.Al2O3, where 0≤X≤1. The ceramic host dielectric body, layered structures, or ceramic dielectric inclusion can be fabricated using liquid aerosol spray processes, as disclosed in the de Rochemont patents discussed above, wherein the oxide ceramic is deposited at process temperatures ranging between 250° C.≤$T_{sub}$<475° C. using liquid aerosol sprays and a reactive gas atmosphere consisting of CO/CO$_2$ in an inert carrier gas. This method is preferred because it allows a limitless variety of very attractive ceramic compositions and metal components to be included into the finished product at atmospheric pressures and high manufacturing throughput rates. However, liquid aerosol sprays are not a suitable deposition technique when organic polymers are used as the dielectric host material. Organic dielectric hosts, which can be applied using a spray, require the use of low-temperature powder aerosol spray processes to form the ceramic dielectric inclusions. These powder aerosol spray processes, well known to practitioners skilled in the art of ceramic deposition, may consist of fine ceramic powders aerosolized in gas-jet spray that are deposited on a substrate held at temperatures as low as ambient (room) temperatures under a vacuum atmosphere. Powder aerosol spray processes can also be used to fabricate the dielectric host material as well. Both spray techniques can be applied to form modules in accordance with the present invention. However, the use of liquid aerosol metalorganic precursors is preferred for superior ability to control microstructure (grain size) properties of the deposited ceramic as discussed below.

Amorphous silica is among the most transparent electromagnetic materials available in nature. It has the lowest real dielectric permittivity ($\in_R$=3.9) among the environmentally safe ceramic oxides, and it has a room temperature dielectric loss tangent tan $\delta$=2×10$^{-5}$ that is roughly two orders of magnitude better than the ceramics used in tape cast assemblies. Titania is also a loss (tan $\delta$=9×10$^{-4}$) high-$\kappa$ ($\in_R$=90) dielectric. However, both materials have such highly refractory thermal properties that their use is prohibited in their pure form in conventional multilayer assemblies, as the temperatures needed consolidate disparate powders incorporated into green tapes would destroy any high conductivity metallic elements designed into the structure. Conventional silica-based or titania-based tapes must include chemical additives that lower the sintering temperature needed to consolidate a tape stack to temperatures below the melting point of the metals incorporated into the assembly. These additives increase both the dielectric loss tangent (tan $\delta$) and the real permittivity of a dielectric body. The ability to fabricate amorphous silica at temperatures ≤450° C. provides a means to incorporate this ultra-low loss material as a host material in a meta-material dielectric body, rather than as a supplemental layer, to increase the radiation efficiency of a miniaturized antenna embedded within the meta-material dielectric.

Figure 4:
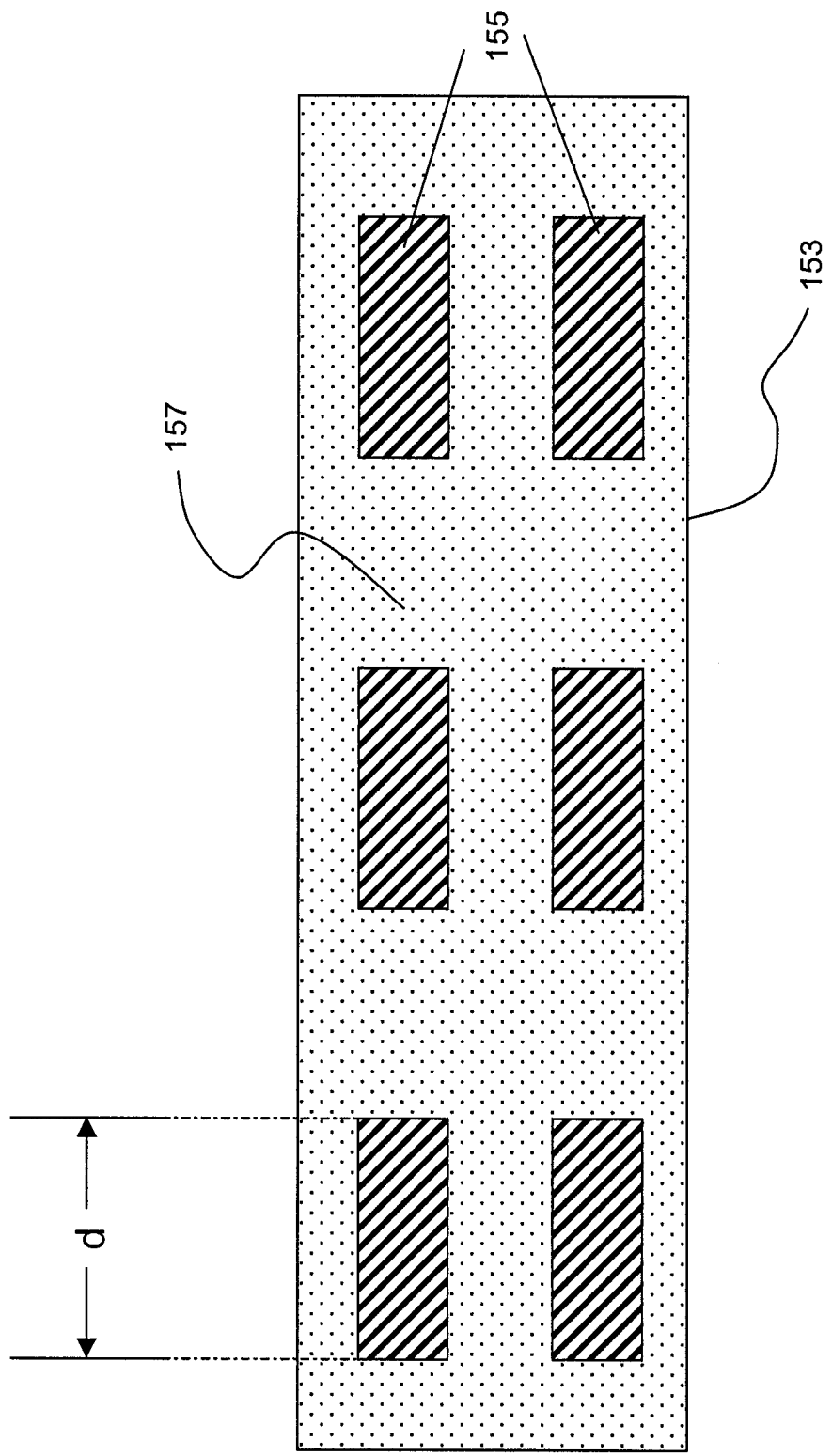
FIG. 4 is a meta-material dielectric body comprising secondary phase material regions embedded within an amorphous silica host.

FIG. 4 depicts a meta-material dielectric body 153 formed by incorporating one or more secondary phase material regions 155 within a pure amorphous silica host 157. Secondary phase material regions 155 preferably comprise ferrites, ferroelectric (comprising titanate, zirconate, tantalate, niobate) oxide ceramics, among others. The meta-material dielectric body 153 will assume an average dielectric response that is a weighted sum of the fractional percentage of each material region incorporated in the dielectric body for frequencies where the physical dimension d of the secondary phase material regions 155 is less than about ½0th of the free space wavelength ($\lambda$/20) of such frequencies, regardless of whether or not the secondary phase material regions 155 are randomly distributed or organized in a periodic array. Electromagnetic radiation will diffusely scatter from the meta-material dielectric body 153 when the secondary phase material regions 155 are randomly distributed throughout the dielectric host 157 and have a physical dimension d that is roughly equivalent to the radiation's free space wavelength, i.e., >$\lambda$/10. Conditions for Bragg scattering will be satisfied and an electromagnetic bandgap (EGB) material will be formed when these secondary phase material regions 155 have physical dimensions d that are roughly equivalent ($\sim$>$\lambda$/10) to the free space wavelength and are periodically arranged with an appropriate spacing. Table I demonstrates the factor reduction in dielectric loss, leading to improved radiation efficiency, which is achieved when amorphous silica and/or titania are used as the dielectric host, as compared to typical tape cast ceramic hosts in a meta-material dielectric. The values reflected in Table I are for meta-material bodies formulated to contain 23% high-$\kappa$ BST ceramic ($\in_R$=453) and are designed to have roughly the same effective real permittivity ($\sim$100), however, the amorphous silica host provides 50% or greater lower loss over the typical tape cast ceramic host. A similar improvement occurs when lower fractional volumes (5%) of higher permittivity, high loss lead lanthanum zirconate titanate (PLZT, $\in_R$=2000) is incorporated into the respective hosts. The inclusion of titania into the systems provides even more substantial improvements in real permittivity $\in_R$ with mild increases in dielectric loss tan $\delta$.

TABLE 1

| Dielectric Material | Pure Dielectric Properties | | Effective Dielectric Properties | |
|---|---|---|---|---|
| | $\in_R$ | tan$\delta$ | $\in_{REff}$ | tan$\delta_{Eff}$ |
| Amorphous Silica ($\alpha$-SiO$_2$) | 3.9 | $2 \times 10^{-5}$ | — | — |
| Titania (TiO$_2$) | 90 | $9 \times 10^{-4}$ | — | — |
| Polyfluorotetraethylene (PFTE) | 2.1 | $4 \times 10^{-4}$ | — | — |
| Rogers Duroid (Duroid) | 2.3 | $5 \times 10^{-4}$ | — | — |
| LTCC Green Tape (TAPE) | $\approx$5 | $2 \times 10^{-3}$ | — | — |
| Barium Strontium Titanate (BST) | 423 | $9 \times 10^{-3}$ | — | — |
| Lead Lanthanum Zirconate Titanate (PLZT) | 2000 | $5 \times 10^{-2}$ | — | — |
| $\alpha$-SiO$_2$ (58%)/TiO$_2$ (42%) | — | — | 40 | $4.3 \times 10^{-4}$ |
| PFTE (58%)/TiO$_2$ (42%) | — | — | 39 | $6.1 \times 10^{-4}$ |
| Duroid (58%)/TiO$_2$ (42%) | — | — | 39 | $6.7 \times 10^{-4}$ |
| TAPE (58%)/TiO$_2$ (42%) | — | — | 41 | $1.5 \times 10^{-3}$ |
| TiO$_2$ (54%)/$\alpha$-SiO$_2$ (46%) | — | — | 50 | $5.0 \times 10^{-4}$ |
| TiO$_2$ (54%)/TAPE (46%) | — | — | 51 | $1.4 \times 10^{-3}$ |
| $\alpha$-SiO$_2$ (77%)/BST (23%) | — | — | 100 | $2.0 \times 10^{-3}$ |
| TiO$_2$ (77%)/BST (23%) | — | — | 167 | $3.1 \times 10^{-3}$ |
| PFTE (77%)/BST (23%) | — | — | 99 | $2.4 \times 10^{-3}$ |
| Duroid (77%)/BST (23%) | — | — | 99 | $2.5 \times 10^{-3}$ |
| TAPE (77%)/BST (23%) | — | — | 102 | $3.6 \times 10^{-3}$ |
| $\alpha$-SiO$_2$ (95%)/PLZT (5%) | — | — | 100 | $2.3 \times 10^{-3}$ |
| PFTE (95%)/PLZT (5%) | — | — | 99 | $2.9 \times 10^{-3}$ |
| Duroid (95%)/PLZT (5%) | — | — | 99 | $3.0 \times 10^{-3}$ |
| TiO$_2$ (95%)/PLZT (5%) | — | — | 181 | $3.3 \times 10^{-3}$ |
| TAPE (95%)/PLZT (5%) | — | — | 102 | $4.4 \times 10^{-3}$ |

Similarly, when H-field considerations are important to the antenna design, it is advantageous for the meta-material to be composed of dielectric inclusions that comprise materials (described above) that have a relative permeability $\mu_R \neq 1$.

Figure 5A:
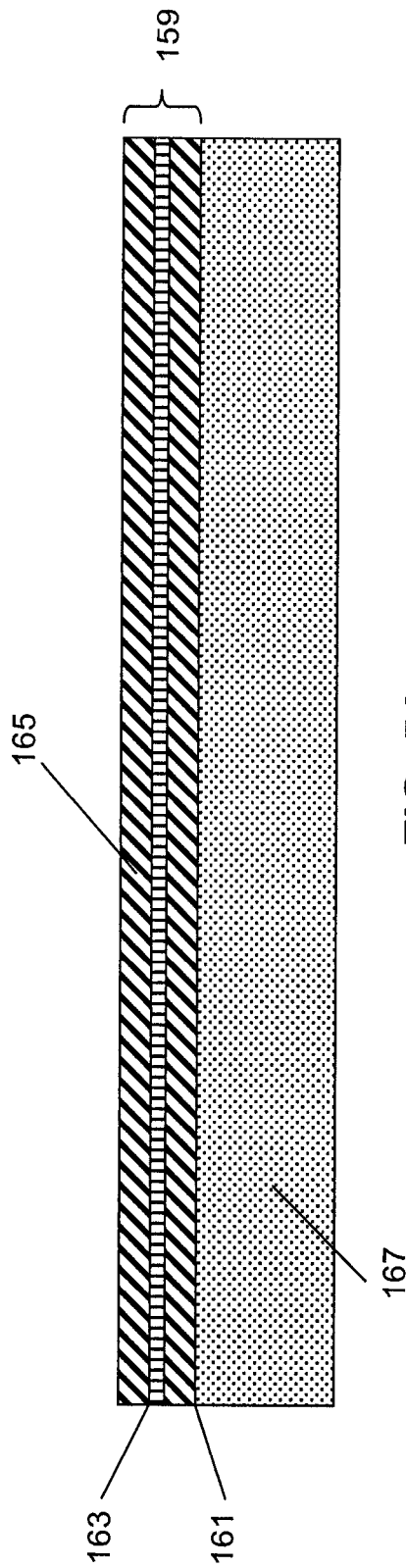
Figure 5B:
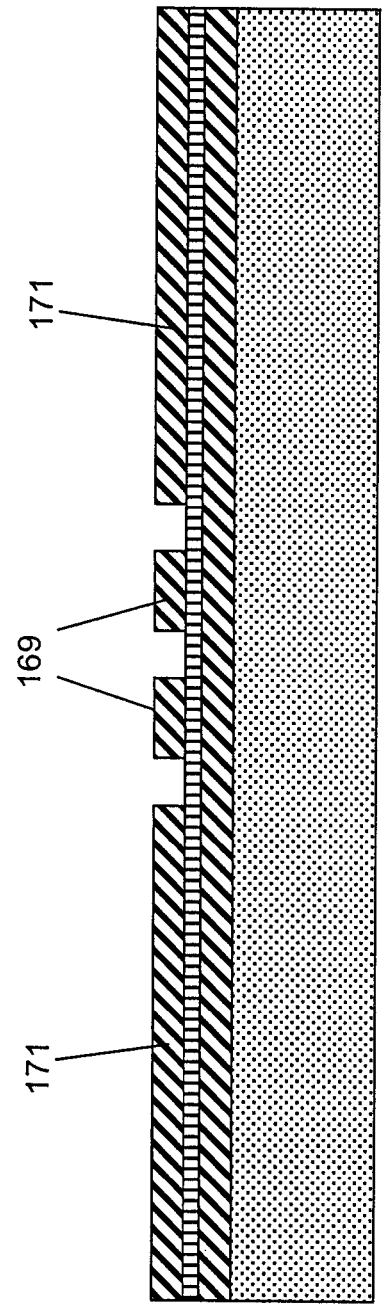

For ease of understanding, reference is now made to FIGS. 5A-H to illustrate construction steps that may be used to create antenna modules in accordance with the invention. A peel-apart metal foil 159, comprised of a carrier foil 161, an adhesive barrier layer (usually a chromate film) 163, and an electroplated conductive metal film 165, is rigidly attached to a flat, thermally conductive base 167. (See FIG. 5A). Foils provide a means to incorporate metallization layers that have extremely smooth surface textures ($\leq$0.5 $\mu$m RMS) that are not achievable when forming modules from ceramic green tape processes. Photolithography techniques are used to pattern contact pads 169 and ground plane structures 171 into the electroplated metal film 165 as need be to meet a specific design objective, as shown in FIG. 5B. A base dielectric layer 173 with thickness t (shown in FIG. 5C) is then deposited on the surface of the module using an aerosol spray process. The base dielectric layer 173 may comprise an organic dielectric, or a ceramic dielectric selected from the group consisting of amorphous silica, pure alumina, titania, tantalum oxide and any admixture thereof, or alternately may consist of a composite dielectric body comprised of one or more ceramic dielectric inclusions embedded in a an organic dielectric, or a ceramic dielectric selected from the group consisting of amorphous silica, pure alumina, titania, tantalum oxide, or an admixture thereof. Preferred liquid aerosol spray processes are described in U.S. Patent Nos. by de Rochemont et al. in U.S. Pat. Nos. 6,027,826, 6,323,549, 5,707,715, 6,143,432 and 6,742,249, the contents of which are all incorporated by reference in their entirety. As shown in FIG. 5D, the base dielectric layer 173 may comprise an organic dielectric, amorphous silica, titania, a high-$\kappa$ ceramic oxide, or a meta-material dielectric body further comprised of ceramic oxide dielectric inclusions 177 embedded in a host dielectric material 179. The choice of dielectric used to form the base dielectric layer 173, and its thickness t, is determined by electrical design requirements needed to match the impedance of electrically conducting elements that will be deposited on the surface of layer 173 with the source impedance of the semiconductor die to which the electrically conducting elements will eventually be electrically connected. In accordance with the present invention, the meta-material dielectric body comprising b dielectric layer 173 may be prepared by selectively spray depositing the dielectric inclusions 177, and subsequently spray depositing the organic dielectric, amorphous silica, pure alumina, or titania host material 179, in contrast to prior art methods that backfill secondary dielectric materials that are drilled into host dielectric materials. Ink-jet spray technologies are the preferred methodology to selectively deposit the dielectric inclusions 177, but other methods, such as spraying through a mask or screen, or spray a uniform layer that is selectively etched using photolithographic techniques can also be employed. Often, the sprayed dielectric material will have a rough or undulating surface, which can be flattened by applying one or more spin-coated layers 181 of the same or similar ceramic compositions when they are formulated from aerosolized metalorganic precursor solutions, in order to fill in voids or troughs and provide a surface finish that has a mean dielectric layer surface roughness of $\leq \pm 0.2$ $\mu$m RMS, preferably $\leq \pm 0.1$ $\mu$m RMS. A sprayed layer is required to form a covalent bond and strong adhesion with the metal foil 159. Spin-coated metalorganic liquid films generally do not adhere well to metal substrates after thermal decomposition, but do bond well when thermally decomposed on dielectric material that has the same or similar composition. Spray methods are generally preferred to build up thick deposits at significantly faster rates, whereas thermal decomposition of spin-coated films is applied typically when it is desirable to bring the oxide surface within a flatness or roughness tolerance. Thus, a layer of dielectric material may be spun coat upon the metallization layer to obtain, for example, a surface with a smoothness $\leq$1 $\mu$m RMS.

With reference to FIG. 5E, a variety of techniques such as, for example, thin film deposition, screen printing, etc., may then be used to affix terminating capacitor pads 183 to the oxide ceramic dielectric layer 173 (which may or may not include the smoothing layer 181.) Vias 185 may be laser drilled to expose the contact pads 169 that have been photolithographically patterned into the electroplated metal film layer 165. The transparency of amorphous silica facilitates machine indexing and circuit registration, thereby permitting minimization of the physical dimensions of the contact pads to a major axis size on the order of 50 µm. The reduced size contact pads provide a significant advantage in reducing signal reflections at GHz frequencies. Multilayer ceramic interconnects will typically require pad sizes on the order of 8-10 mil (200-250 µm). Optically transparent amorphous silica dielectric may be selectively applied to regions 182 in the immediate vicinity of the contact pads 169 (as shown in FIG. 5D) when forming the oxide ceramic dielectric layer 173, in order to facilitate the use of optical indexing techniques when forming the laser drilled vias. Immediate vicinity is understood to mean the area surrounding the contact pad extending a distance that is sufficient to resolve the pad fully from neighboring pad or ground plane structures upon optical inspection.

With reference to FIG. 5F, a microstrip transmission line structure (antenna or interconnect) can be formed by inserting a stud 187 can be inserted into each via 185 to make an electrical connection with a corresponding contact pad 169. The studs are roughly equivalent in physical size to the contact pad 169 and discrete wire conducting element 191, and respectively have heights that are roughly the same as the thickness t of the oxide ceramic dielectric layer 173. In cases where the thickness t of the oxide ceramic dielectric layer 173 is less than about 5 microns, a discrete wire can be stitch bonded directly to each exposed contact pad 169. Alternative means, such as back filling the vias with conductive paste or electroplated, or thin film metal deposits, can also be used and may be preferred in applications that require high I/O counts. Studs are preferred conductive means, however, in low I/O count module applications such as antenna where cost-value benefits are justified. In antenna module embodiment that comprise discrete wire conducting elements, polymeric bonding posts 189 are temporarily and selectively affixed to the surface of the base dielectric layer 173. These polymeric bonding posts allow precise stitch bonding of the discrete wire conductive elements 191 to the module. Each conductive element 191 is bonded between one of the studs 187 and a terminating capacitor pad 183. The polymeric bonding posts 189 are used to control sway in the discrete wire as it is drawn between the stud and termination pad, and typically are placed every 10 mil (254 microns) along a straight line path, or at inflection points where it planned to introduce a bend in the discrete wire conductor element 191. Each polymeric bonding post 189 is composed of low-temperature thermoset plastics that is sufficiently soft to allow the discrete wire conductor element 191 to sag into it when a bonding tool 193 is drawn and brought down to a touchdown position proximate the surface of the module along a desired wire path such that the spooled wire traverses the polymeric bonding post 189. The polymeric bonding posts 189 should, however, remain tacky enough to hold the wire in place as the bonding tool 193 is drawn to the next touchdown position. In physical embodiments that comprise ceramic base or host dielectric layers, polymer formulations for the low-temperature thermoset plastic may vary and will depend on the temperature used to stitch bond the discrete wire elements, which can range from 150-250° C., however many commercially available formulations are widely available. In these embodiments, the low-temperature thermoset plastic preferably contains additives that promote cross-linking after a UV-cure step that results in rigid fixation of the discrete wire conductor element 191 even at temperatures as high as 350° C. experienced in subsequent processing. Many such additives are well known to practitioners skilled in the art of polymer formulation.

Figure 5I:
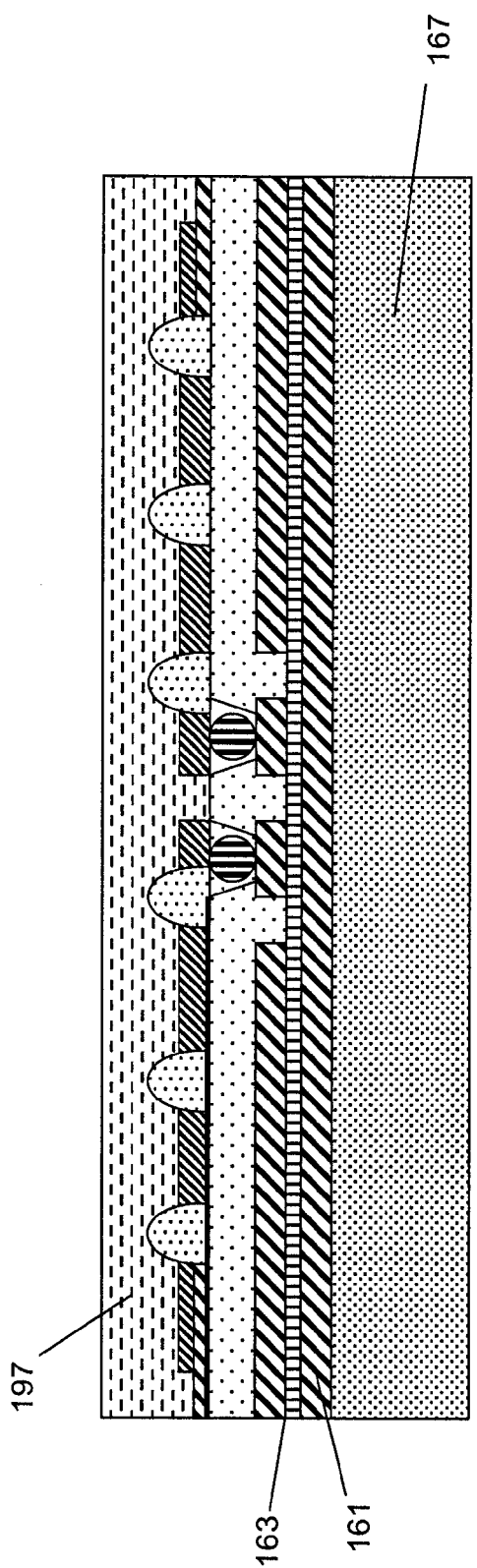
Figure 5J:
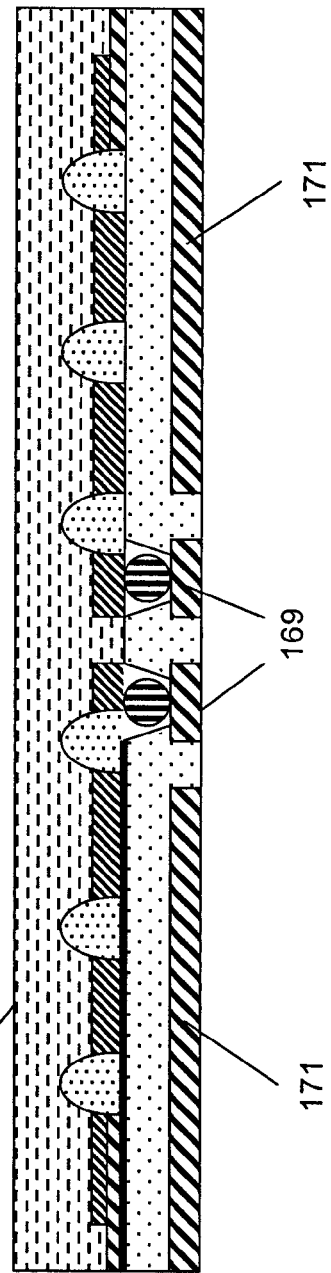

Reference is made to FIGS. 5G&H for embodiments that do not contain organic dielectrics. In this instance, once the discrete wire conductor elements have been stitched, the module is heated to a temperature between about 300° C. and 350° C. to in a processing step of selective deposition of ceramic bonding posts 195 using liquid precursors that permanently affix the discrete wire conductor elements 191. (See FIG. G). These ceramic bonding posts can also be applied at room temperatures using aerosolized powders. As shown in FIG. 5H, the polymeric bonding posts 189 are subsequently removed by thermal decomposition, and the module is then heated to temperatures ≤450° C. An additional dielectric layer 197 may be optionally sprayed on top of the module, as shown in FIG. 5I. The additional dielectric layer 197 may be composed of organic dielectric, amorphous silica, pure alumina, titania dielectric, or a metamaterial dielectric including an organic dielectric, amorphous silica, alumina, or titania host comprising dielectric inclusions, and the layer has a thickness judiciously selected to satisfy design objectives. FIG. 5J illustrates a fully assembled antenna module 199 that contains a dielectric inclusions selectively located in preferred regions of the module. In embodiments that do not include organic dielectric and are formed from aerosolized liquid precursors, the spray deposited ceramics will have an amorphous microstructure. These embodiments may then be heated to temperatures ranging between 500 and 900° for a period of about 15 to 60 minutes in a redox atmosphere in order to sinter the high-κ ceramic elements into a desired crystalline phase and real permittivity value, $\in_R$. An advantage to using an amorphous silica or an titania host is that it is negligibly affected by this sintering step. Crystallization may also be applied by localized heating using laser, or focused beams from infrared or ultraviolet light sources. In embodiments that contain an organic dielectric the ceramic dielectric inclusions are applied using a powder aerosol spray, wherein crystallization and microstructure control (grain size) is imparted to the ceramic dielectric inclusion in its powdered state prior to the aerosol spray deposition step and there is no need to apply subsequent thermal processing steps post aerosol spray deposition. The carrier metal foil 161 may then be separated from the flat, thermally conductive base 167, and then removed with the barrier layer 163 from the ceramic antenna module 199. As shown, the contact pads 169 and ground plane structures 171 remain embedded in the base dielectric layer 173 after the carrier metal foil 161 and barrier layer 163 are removed from the module. Similar methods are used to build the interconnect structure used as the electrical interconnect structure 137 described in FIG. 2 by adding the further steps of drilling additional vias through any additional dielectric layers 120B or 126 and 120B to expose a termination pad or transmission line network 132, inserting conductive means 122 into the vias exposing said transmission line network or termination pad. In single strip-line embodiments shown in FIG. 2C, a metallization layer is disposed on dielectric layer 120B to provide a ground plane 134A and contact pads 124. In double strip-line embodiments shown in FIG. 2D, the metallization layer is disposed on dielectric layer 126 to form a second transmission line network 132B that is in electrical communication with the first transmission line network 132A situated between base dielectric layer 120A and dielectric layer 126 by conductive means 122. In this instance, a second base dielectric layer 120B is then deposited on top of the second transmission line network 132B. Holes may be drilled through said second dielectric layer 120B into which additional conductive means 122 is applied to form a via that provides electrical communication with contact pads in metallization layer 134A that is also used to provide a second ground plane. Reproducing these steps to provide additional structures similar to electrical interconnect structure 137 on top of the existing one, as the case may be depending upon circuit complexity is a straightforward extrapolation and should be considered as falling under the scope of the present invention.

Figure 6A:
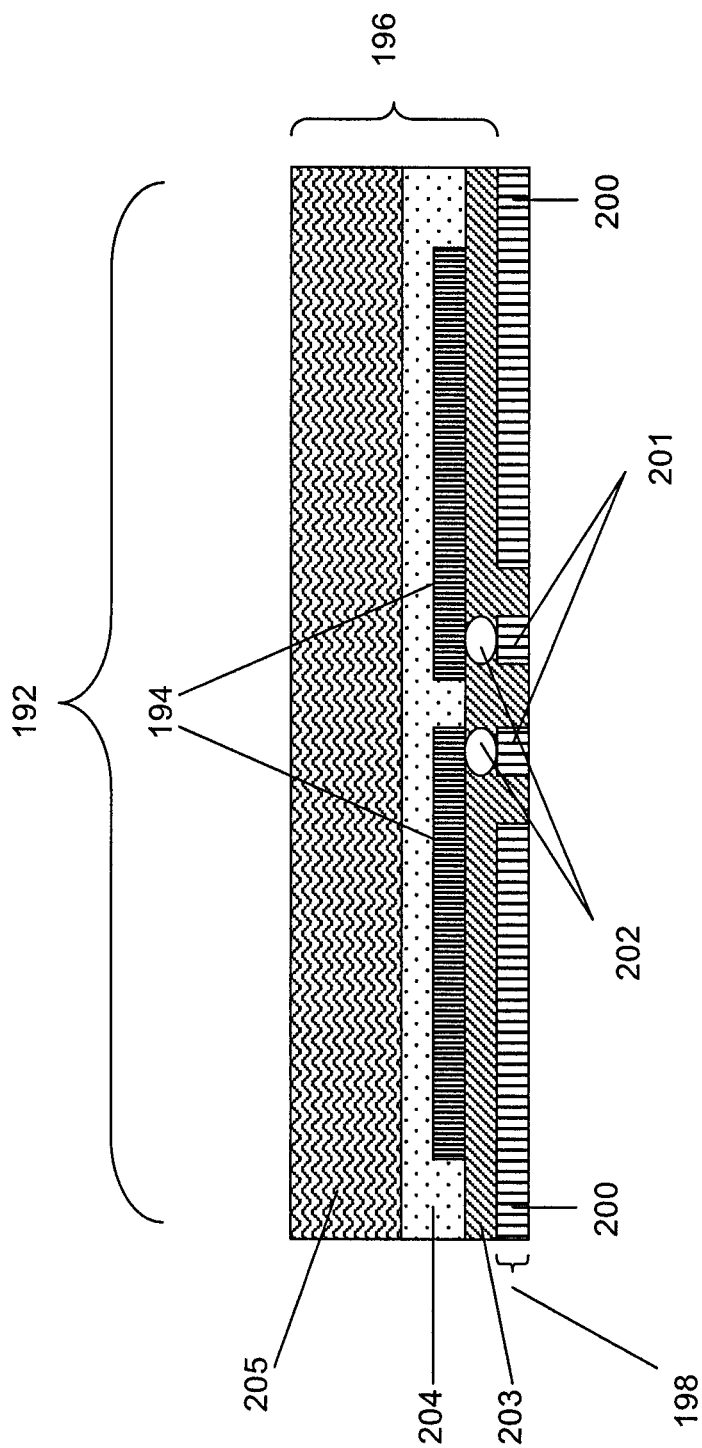
FIG. 6A-C are cross-sectional illustrations of various antenna modules that comprise antenna elements formed with conductive metallization other than discrete wire.
Figure 6B:
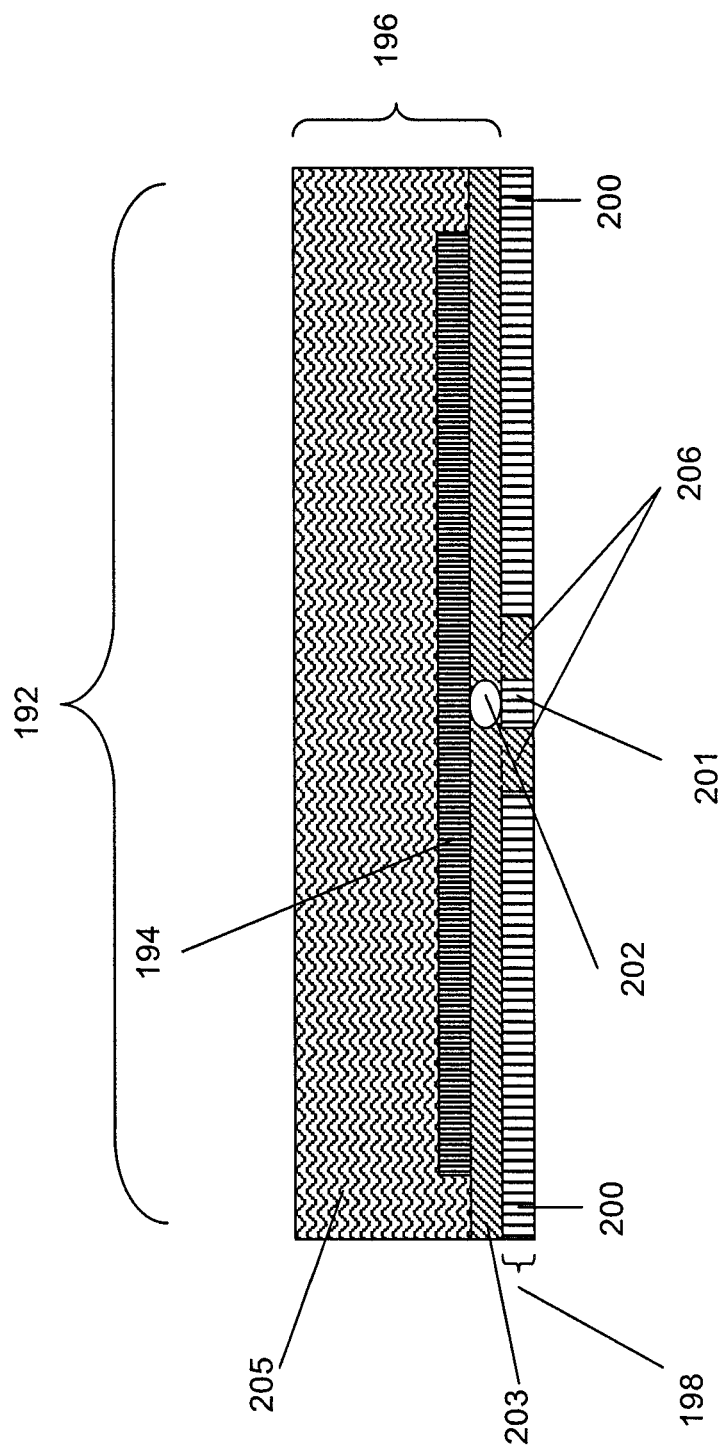
Figure 6C:
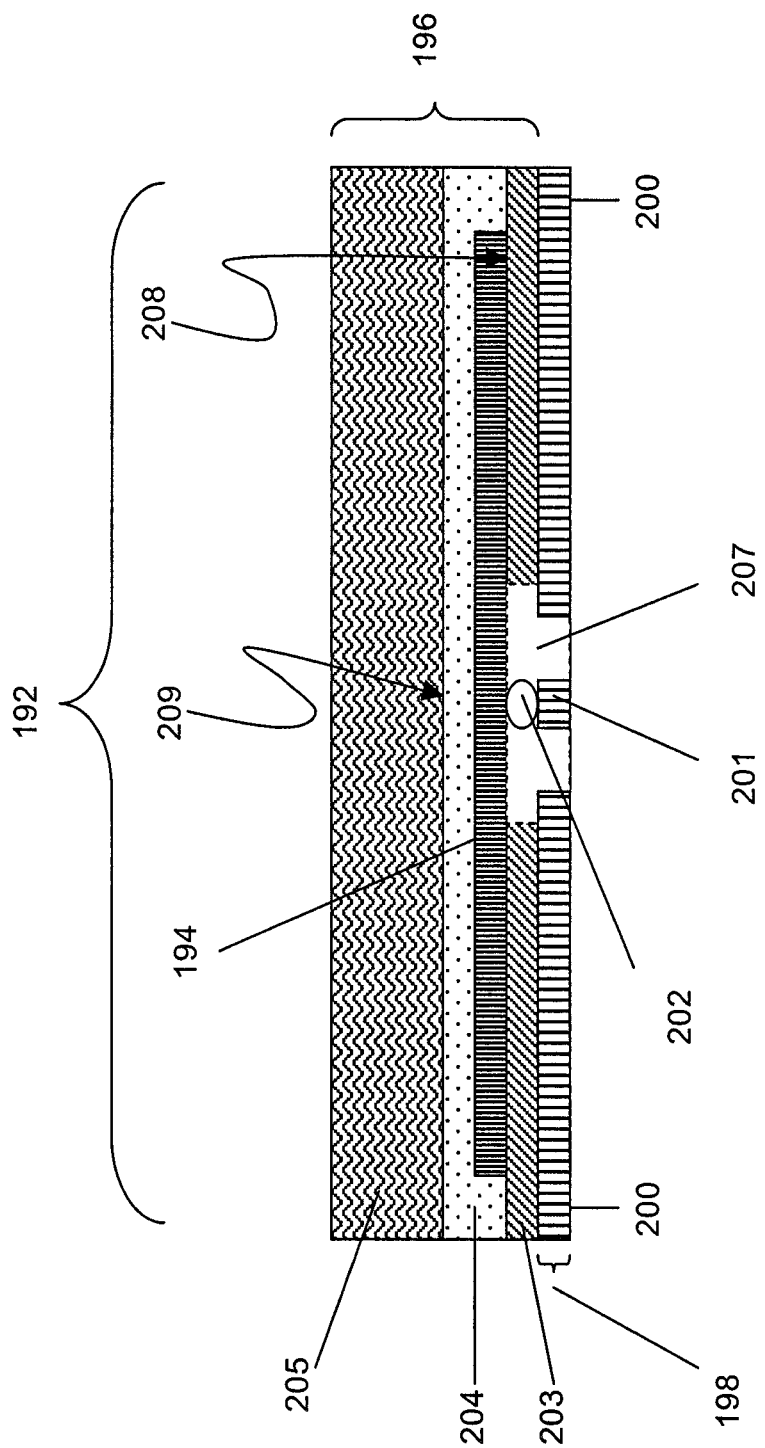

FIGS. 6A&B describe more generic embodiments, wherein the antenna module 192 may consist of one or more conducting antenna elements 194, which may comprise a thin or thick film or at least one discrete wire terminated on a capacitor pad, embedded in a composite ceramic dielectric body 196 situated on the surface of a metallization layer 198 that contains portions which act as a ground plane 200 and other portions that serve as contact pads 201 in electrical communication with the conducting antenna element 194 through a conductive means 202. The metallization layer 198 may alternatively, as discussed below, be integral to the surface or body of any additional electronic component, such as a semiconductor die or interconnect that acts as an electrical interconnect structure, or be fabricated as a detachable artifact as shown in FIG. 5, that is later assembled into a more complex module as shown in FIG. 2. The composite ceramic dielectric body 196 may comprise a single base dielectric layer 203 on which the conducting antenna elements 194 are positioned. It may alternatively comprise the base dielectric layer 203 and antenna elements 194 with an additional spacer dielectric layer 204 applied on top of both. Additionally, the antenna module 192 may comprise the base dielectric layer 203, spacer dielectric 204 and an additional dielectric layer 205, or the base dielectric layer 203 and the additional dielectric layer 205 without the spacer dielectric layer 204, as shown in FIG. 6B. The base dielectric layer 203 and the additional dielectric layer 205 can be selected from the group consisting of organic dielectric, or a ceramic dielectric selected from the group consisting of amorphous silica, pure alumina, titania, tantalum oxide and any admixture thereof, or alternately may consist of a composite dielectric body comprised of one or more ceramic dielectric inclusions embedded in a an organic dielectric, or a ceramic dielectric selected from the group consisting of amorphous silica, pure alumina, titania, tantalum oxide, or an admixture thereof. It is preferred that spacer dielectric layer 204 comprise organic dielectric, or a ceramic dielectric selected from the group consisting of amorphous silica, pure alumina, titania, tantalum oxide and any admixture thereof. As shown in FIG. 6B, the base dielectric layer may also be used to electrically isolate regions of the metallization layer 198 by situating it in regions 206 located between the ground plane regions 200 and contact pad regions 201. FIG. 6B also shows embodiments that comprise a monopole antenna where a single contact pad is used to establish electrical communication with the conductive antenna element 194. FIG. 6C shows a more specific embodiment of the invention wherein the base dielectric layer 204 comprises a composite dielectric body wherein optically transparent amorphous silica ceramic is located in the vicinity 207 of a ground plane region 200 where it is adjacent to a contact pad region 201 to improve registration while inserting a conductive means 202 to establish electrical communication between said contact paid and the conductive antenna element 194. FIG. 6C also makes reference to the application of spin-coated ceramic dielectric layers used to reduce surface roughness to levels less than or equal to ±0.2 μm RMS at the interface between a metallization and a ceramic layer 208 or the interface between one dielectric ceramic layer and another dielectric ceramic layer 209.

Figure 7A:
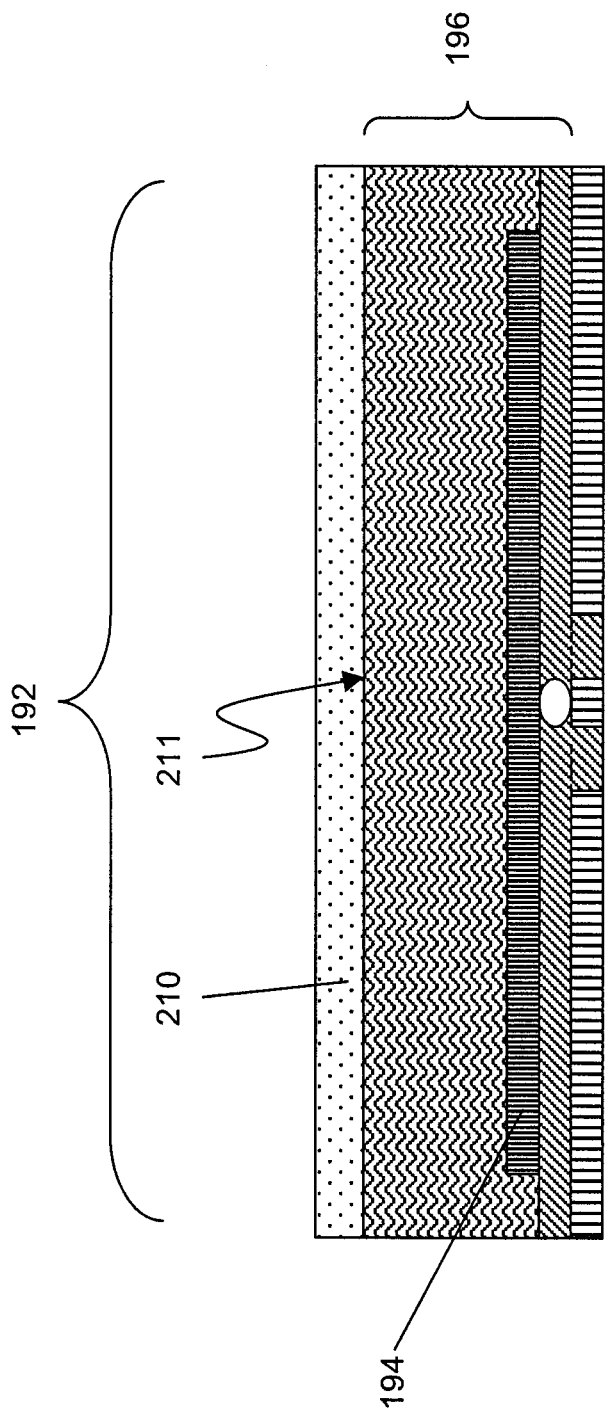
FIGS. 7A-7B are illustrations showing the use of anti-reflective cap layers used to improve EM transmission between the antenna module and an ambient dielectric medium.
Figure 7B:
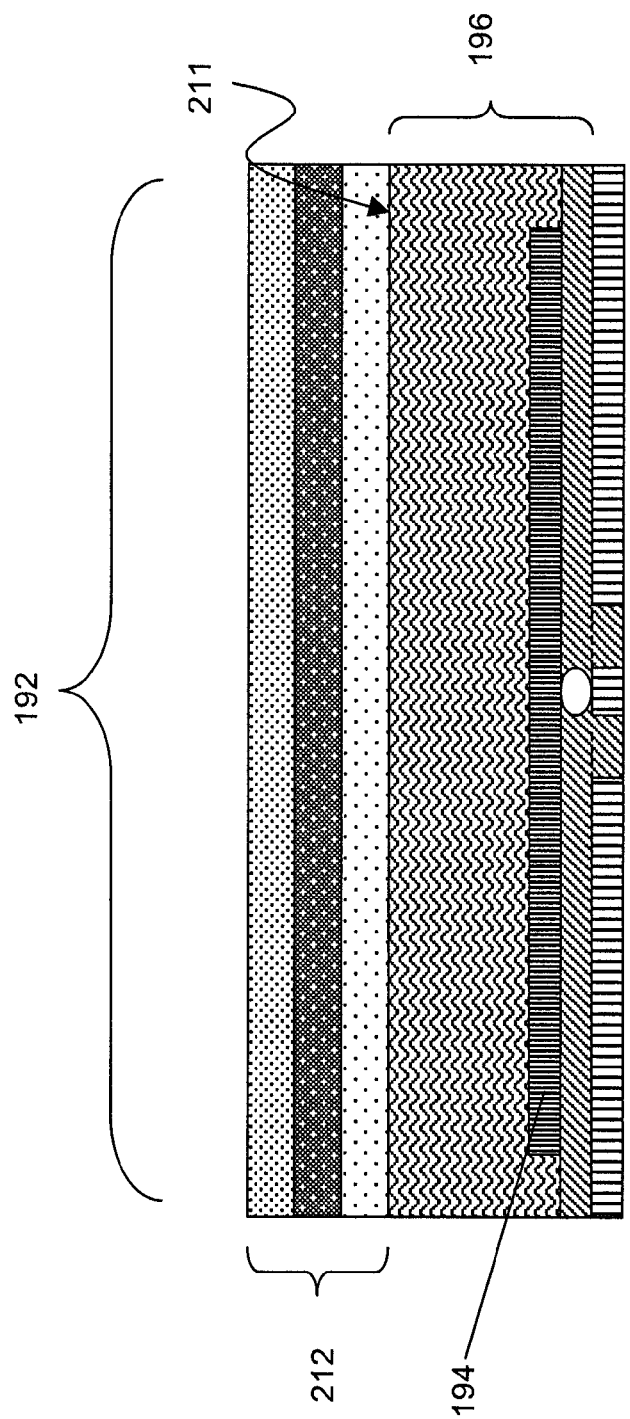
Figure 8:
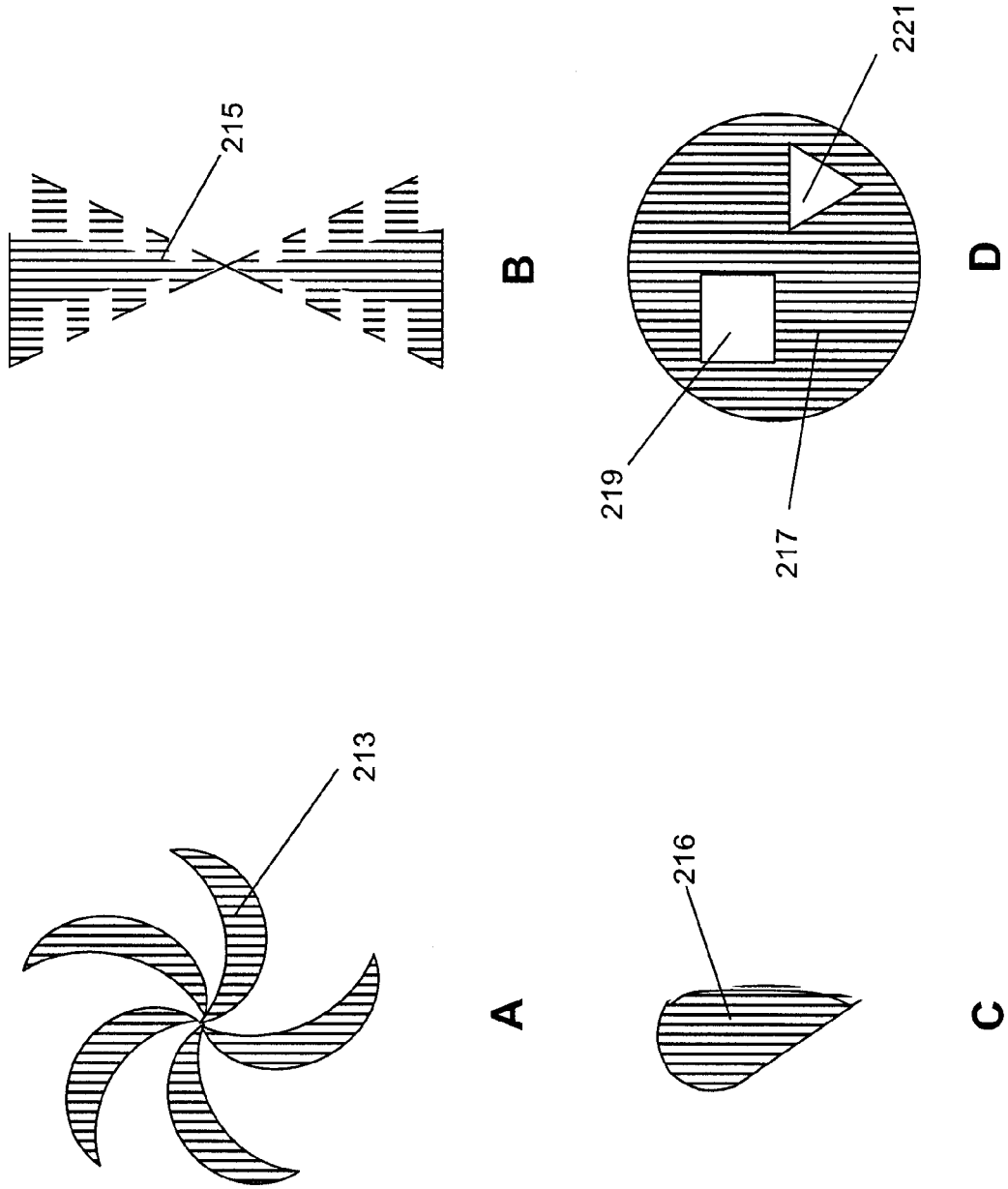
FIGS. 8A-8D represent various non-limiting antenna elements other than discrete wire that can be incorporated into the antenna module to achieve specific bandwidth design criteria.
Figure 9:
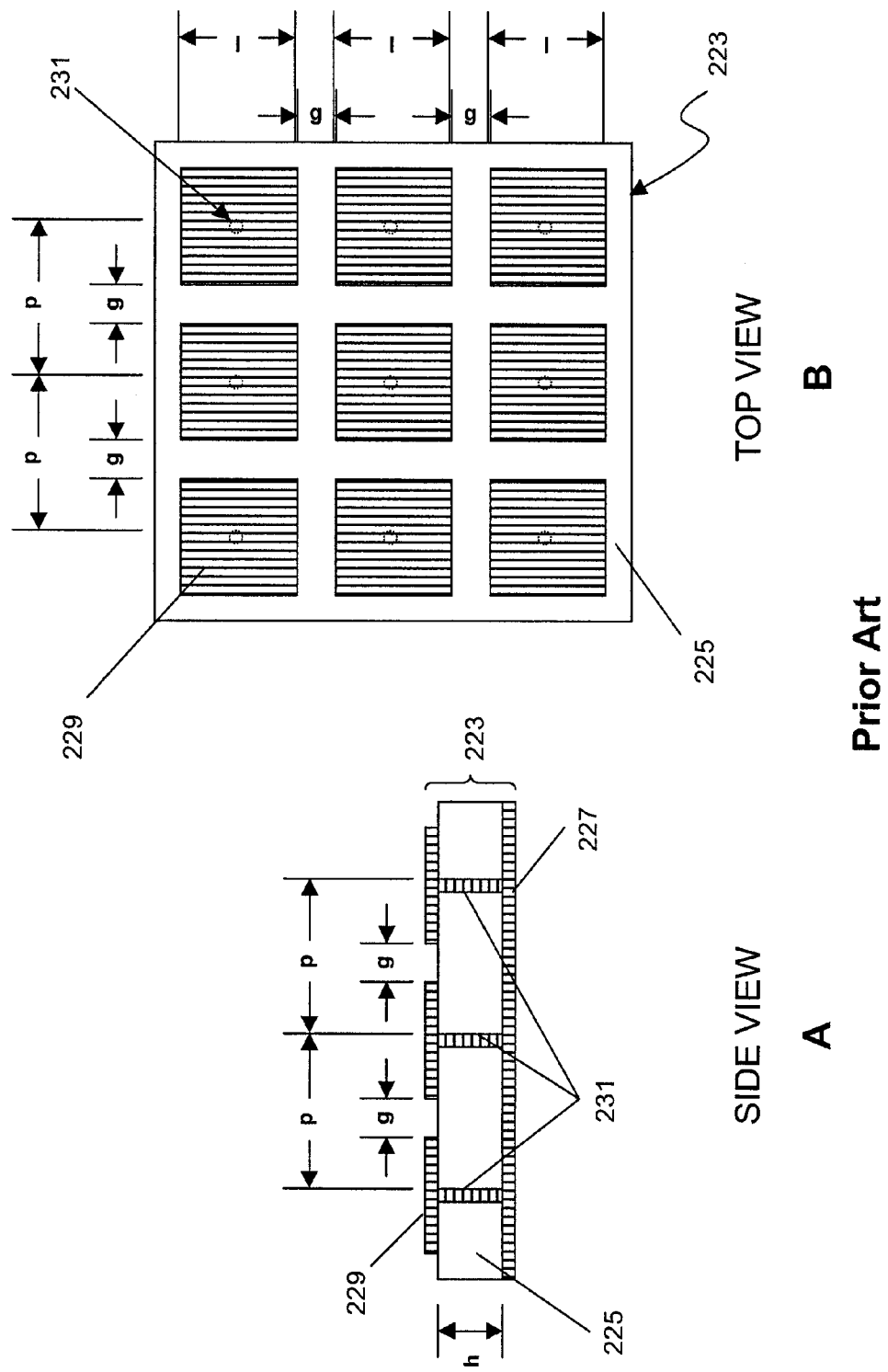
FIGS. 9A-9B represent artificial magnetic conductor (AMC) structures comprising amorphous silica or titania dielectric host materials that are used to boost gain in low-impedance antenna modules.

The present invention provides additional means for improving the radiation efficiency of an antenna by reducing reflective loss at dielectric interfaces incorporated into the antenna module. Electromagnetic waves traversing the interface between one dielectric region and another will have a portion of their energy reflected at the boundary in accordance with Snell's Law. Internal reflection becomes quite strong at dielectric boundaries that have large differences in relative permittivity, thus causing electromagnetic transmission across the interface to be sharply reduced. For instance, if the antenna element were embedded in a conventional (non-meta-material) high-κ ($\in_R \cong 100$) dielectric body, the difference in dielectric density between the high-x material and air ($\in_R \cong 1$) would cause 96% of the electromagnetic power to be internally reflected at the interface and only 4% of the energy to be transmitted across the boundary producing an unacceptably low radiation efficiency for the structure. The use of low permittivity dielectric hosts, such as organic media or amorphous silica which have $\in_R \leq 4.5$, provide a "clear window" that improves the power transmitted into the composite ceramic dielectric body. Dielectric inclusions can be added in sufficient number and volume to produce an effective relative permittivity ($\in_{REff}$) that will alter the antenna elements resonant properties. Amorphous silica is preferred as the host material for the composite dielectric body because it simultaneously provides low permittivity ($\in_R=3.9$) and ultra-low loss (tan $\partial=2\times10^{-5}$). A meta-material composite dielectric comprised of an amorphous silica host that contains finer scale repetitions of high-κ ceramic dielectric inclusions sufficient in sufficient quantity to produce an effective relative permittivity of $\in_R \cong 100$ forms a dielectric interface with air that allows 89% of the incident electromagnetic power to transmitted. 11% of the power is internally reflected back into the dielectric medium from which it originated. Strong internal reflections will occur at the interfaces between the amorphous silica host and the high-κ dielectric inclusions, but, as these bodies are small compared to the radiation wavelength, the reflections principally affect wavefront phasing in the manner described above when discussing the defect resonator. Maximal transmission efficiencies occur at a dielectric interface where the difference in the relative permittivity values between the lower dielectric density and the higher dielectric density materials is reduced. Therefore, as shown in FIG. 7A, a further embodiment of the invention comprises an antenna module 192 containing at least one low-κ cap layer 210, having a relative permittivity less than the module's composite ceramic dielectric body 196, or any host dielectric that is contained therein, that is applied on radiating surface 211 of the composite ceramic dielectric body 196 that improves the transmission efficiency of electromagnetic emissions emanating from a conductive antenna element 194. For example, if the low-κ antireflective cap layer 210 comprises polyflouro-tetraethylene (PFTE-Teflon), which has a relative permittivity ($\in_R \cong 2.2$), and the composite meta-material dielectric body contains amorphous silica ($\in_R=3.9$) as its host material, then 96% of the power incident upon the PFTE-Air interface will be transmitted across this first dielectric boundary, and 98% of the power incident upon the PFTE-Silica interface will be transmitted across this second dielectric boundary. Thus, the total power transmitted across the combined structure is 94% (98%×96%). Adding a plurality of cap lower permittivity layers 212 (FIG. 7B) to the structure to produce a step wise or continuous gradient in permittivity to further reduce internal reflections across the radiating surface further improves electromagnetic transmission efficiencies. Depending upon design objectives and the host dielectric material contained in the composite dielectric body 196, these lower permittivity layers may comprise organic, ceramic, or a combination of organic and ceramic materials. Specific lower permittivity layers useful in embodiments that comprise an amorphous silica dielectric host within the composite dielectric body 196 would include, but are not limited to, or more of the following materials polyfluoro-tetraethylene (Teflon) ($\in_R \cong 2.2$), bis-benzocyclobutene (BCB) ($\in_R \cong 2.7$), polyvinyl formal ($\in_R \cong 3$), polyvinyl butyral ($\in_R \cong 2.6$), Rogers Duroid ($\in_R \cong 2.3$), and polyimide Kapton ($\in_R \cong 3.1$).

With reference to FIGS. 8A-8D, the electrically conducting thin or thick film antenna elements applied to form a conducting antenna element 194 may take the form of spirals 213, log-periodic arrays 215, tear drop 216, or patches 217 (shown in circular form for example purposes only) with or without one or more voided or slotted regions of selectable geometric shapes, such as squares 219 or triangles 221, or any combination thereof, depending on the bandwidth specification of a particular design objective.

Reference is once again made to FIG. 2 to illustrate methods to tune the impedance of the antenna module 114 to match source or input impedance of a power amplifier (PA) or low noise amplifier (LNA) (or other) semiconductor die 135, respectively, that may be integrated within the module body. Often, the source or input impedance of these semiconductor die are in the range of 2-10Ω, so tuning the impedance of the antenna module 115 to match semiconductor die 135 requires the conducting element(s) 117,123, and 132 to be located very close to ground. This is particularly true when the semiconductor's impedance falls in the range of 2-5Ω and a round discrete wire having a very narrow diameter (~18-25 μm or less) is used as a conductive element in the circuit. In this instance, the base dielectric layers 120A/B and 131 should comprise a high-κ dielectric layer ($\in_R \geq 10$, preferably $\in_R \geq 60$) with a thickness t on the order of 1-3 μm or more to separate the conducting elements 117, 123, and 132 from any ground plane contained within metallization layers 133 or 134(A,B).

Often any gain that is realized in transmission line efficiency by matching the antenna's load impedance to the semiconductor die's output or source impedance is negated by the inefficiency of a radiating element when it is located that close to an electrically conducting ground. As is well known to practitioners skilled in the art of antenna design, an antenna element located over a perfect electrically conducting (PEC) ground plane will radiate roughly 50% of its power outwardly away from the ground plane, and roughly 50% of its power will be directed towards the ground plane, where it is reflected back towards the antenna element. The electrical component of the reflected electromagnetic wave undergoes a 180° phase shift as it is bounced off the ground plane. It is preferred to locate the radiating element a quarter wavelength (λ/4) above the PEC ground plane so that the phase of the reflected electromagnetic waves is phase delayed an additional 180° in phase and will, thus, constructively interfere with the signals emanating from the radiating element. Consequently, electromagnetic signals that are reflected from a PEC or electrically conducting ground plane that is located very close to the radiating elements will destructively interfere with signals emanating from the antenna in real time, causing the radiator to have zero or negligibly low radiation efficiency as nearly 50% of the radiated power destructively interferes with the 50% of the power that is reflected off of the ground plane.

This situation is reversed, when the radiating elements are located over a ground plane constructed to act as an artificial magnetic conductor (AMC). AMC's are alternatively described in the art as high impedance surfaces, Sievenpiper surfaces, or perfect magnetic conductors (PMC). With reference to FIGS. 9A&B, an AMC 223 is assembled by disposing a dielectric body 225 over an electrical ground plane 227, applying an array of capacitor pads 229 to the dielectric surface opposing the electrical ground plane 227, and inserting electrically conductive vias 231 between the array of capacitor pads 229 and electrical ground that place them in electrical communication with the electrical ground plane 227, wherein the array of capacitor pads 229 are centered on said electrically conductive vias 231. The capacitor pads 229 need not be square as shown, and can possess arbitrary shape or form that has a maximal physical dimension I<P such that a gap of dimension g exists between said capacitor pads Resonant characteristics of the AMC are determined by the specific properties of the dielectric body 225 and the configuration of the capacitor pad array. Under resonant conditions, the E-field components of electromagnetic (EM) waves incident upon the AMC surface are reflected from the ground plane without a shift in phase. As a result, placing the antenna closer to the AMC ground plane enhances conditions for constructive interference between those reflected EM components with the E-field components radiated by the antenna in directions away from the ground plane surface. The incorporation of AMC structures into the antenna module's ground plane, therefore, allows the intrinsic impedance of radiating antenna elements to be reduced to levels that more closely match the impedance of PA/LNA (or other semiconductor) die. This embodiment of the present invention enables the construction of a transmit/receive (T/R) module with far greater overall system efficiency compared to conventional systems, as it eliminates the need for impedance matching networks and additional loss generating components.

Figure 10:
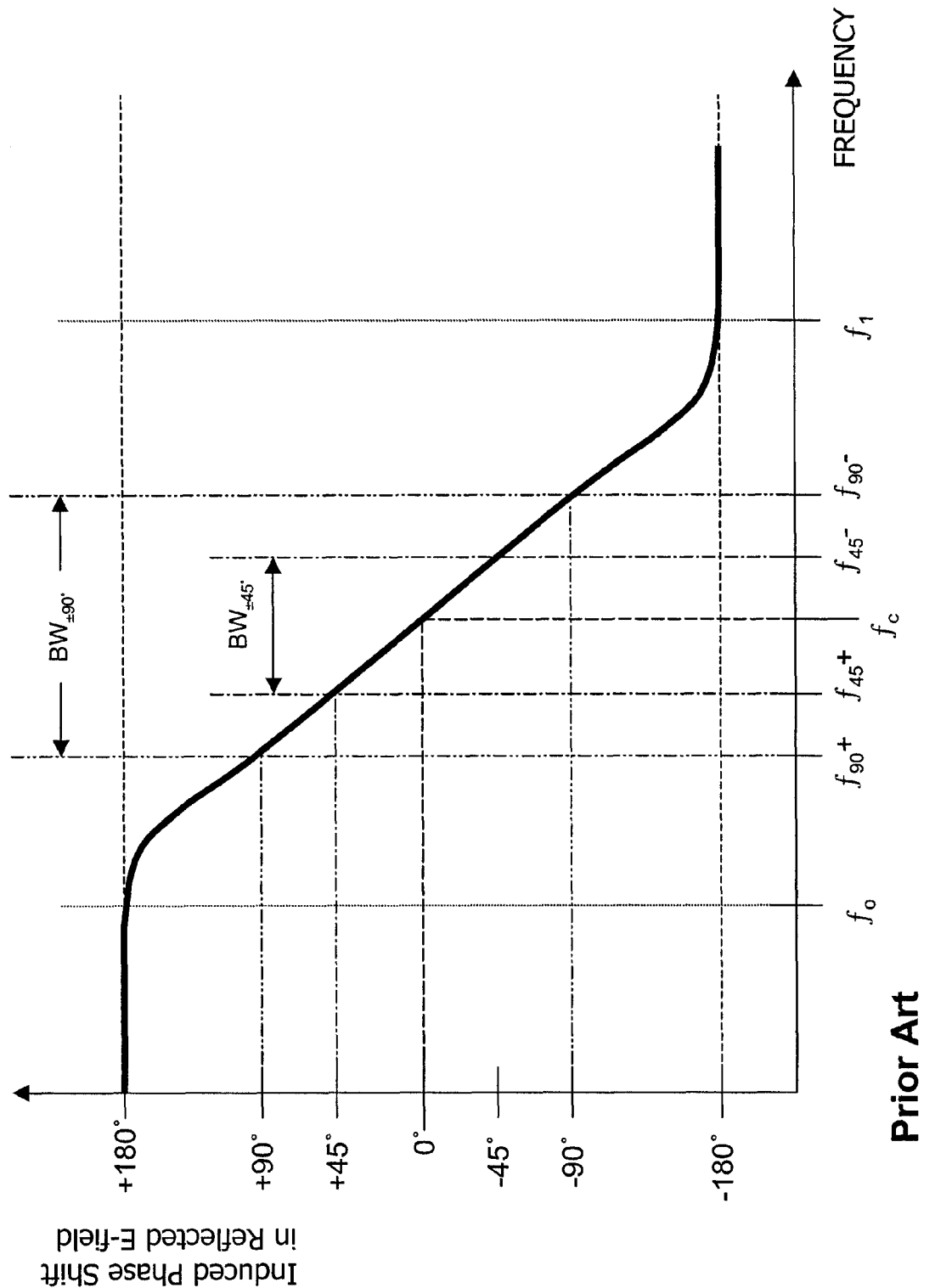
FIG. 10 is a graph illustrating the representative phase shift versus frequency that is characteristic of an electromagnetic wave reflected from the surface of an artificial magnetic conductor.
Figure 11:
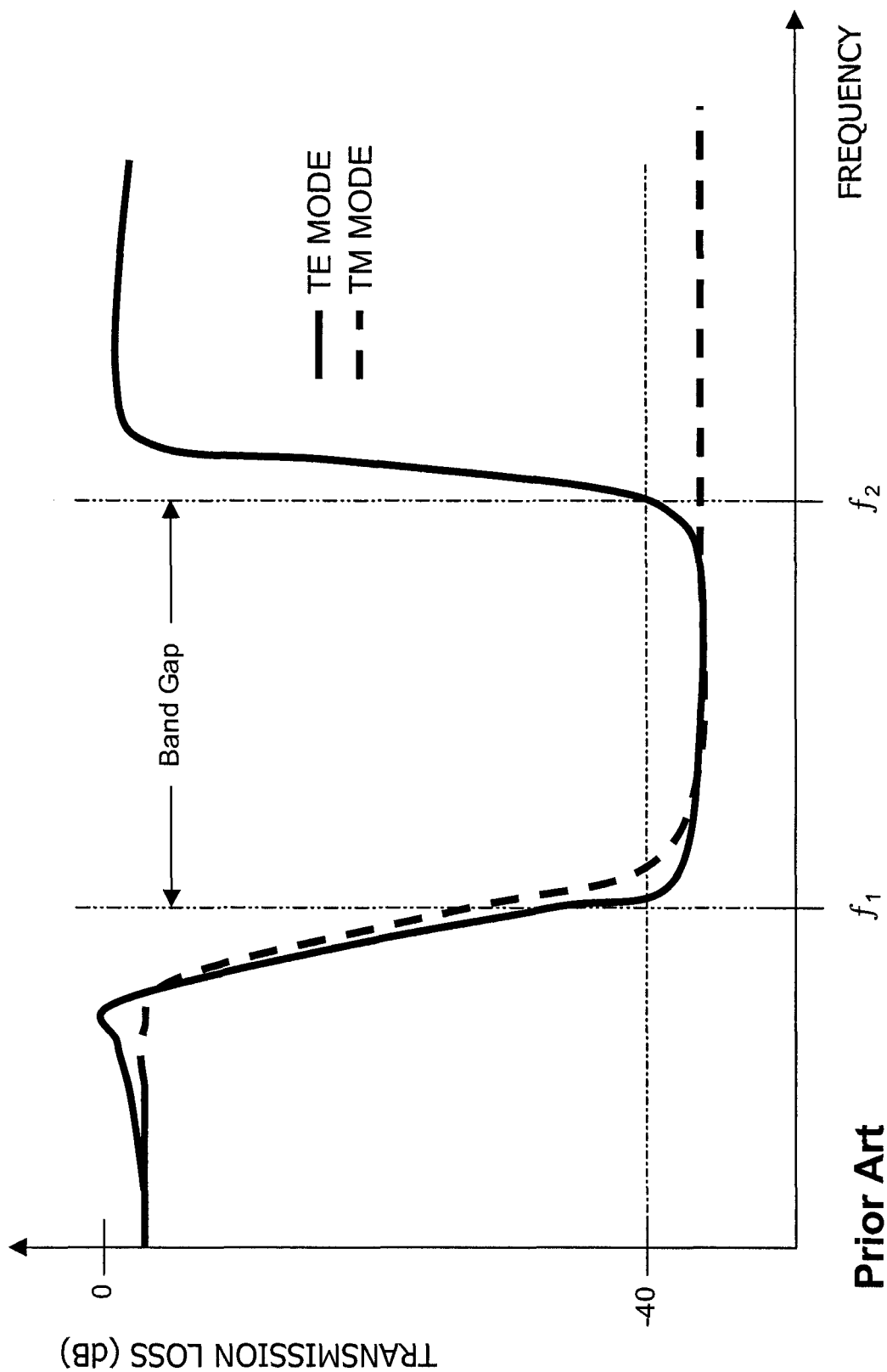
FIG. 11 is a graph illustrating the characteristic band gap as a function of frequency that suppresses electromagnetic surface modes from propagating along the surface of an artificial magnetic conductor.

The characteristic frequency response of AMC surface to EM waves incident upon it and propagating across the surface is depicted in FIGS. 10 and 11, respectively. The reflection coefficient of EM waves incident upon the AMC ground plane induces a phase shift in the reflected electric field component that varies from +180° to −180° over a frequency band, $f_0$ to $f_1$, producing a 0° phase shift at a center frequency $f_c$. The radiation efficiency of an antenna element configured parallel to and very near to the AMC ground plane is maximized at $f_c$. While it is preferable to configure the AMC ground plane such that $f_c$ coincides with the antenna's resonant frequency, this is not always possible when multiple antennas operating at multiple frequencies are configured over the same AMC ground plane. Therefore, it is generally advantageous to design the AMC ground plane such that the operational frequencies of one or more antennas positioned over the AMC overlap the range of frequencies wherein the AMC induces a ±90° phase shift in reflected electric field components, with a ±45° phase shift being preferred.

The AMC ground plane will also suppress the propagation of parallel electric and magnetic components of EM waves across the AMC surface over a range of frequencies $f_2$ to $f_3$. This suppression of surface-wave modes thereby allows multiple antennas to operate independently of one another (without inductive interference) when configured over the same AMC surface, whether or not the antennas operate at the same or nearly similar frequencies. The range of frequencies, $f_2$ to $f_3$, over which radiation will not couple into adjacent components is an attribute of the AMC's design and does not necessarily related to or match the phase shift frequency band. This range of frequencies, $f_2$ to $f_3$, is alternatively referred to as the AMC bandgap. Thus, the AMC ground plane may be designed such that the operational frequency band(s) of one or more antennas configured upon it overlap(s) the AMC bandgap.

Figure 12D:
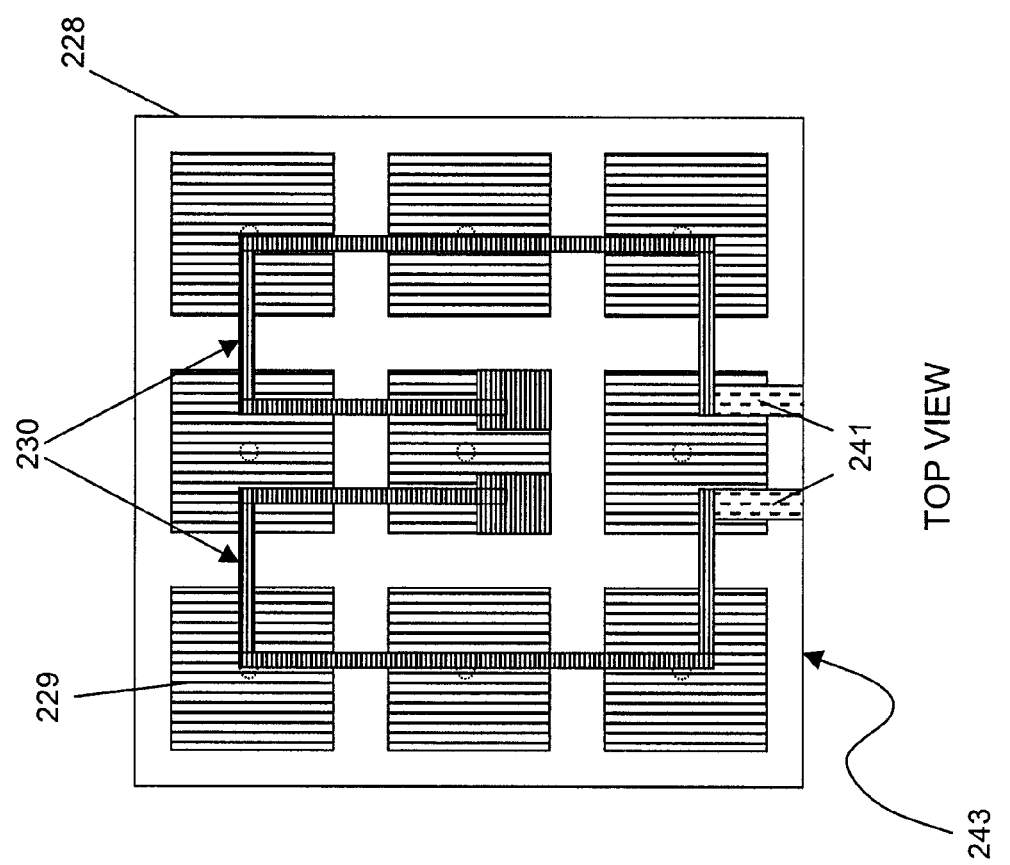
Figure 12E:
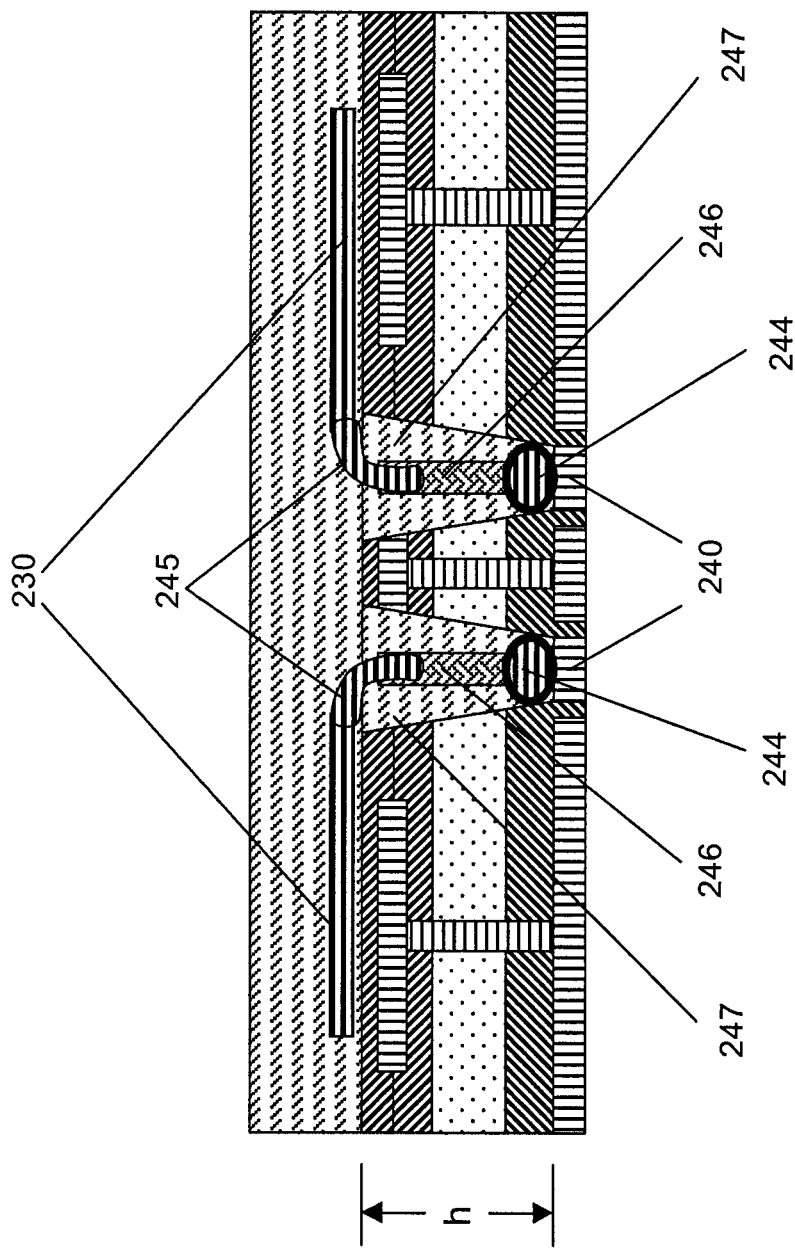

The design of the AMC ground plane 223 is influenced primarily by the surface area of the ground plane and periodicity P of the capacitor pads, the gap g between the capacitor pads 229, the height h (length) and diameter of the vias 231, and the properties of the dielectric medium 225 separating the capacitor pads 229 from the electrically conducting ground plane 227. The AMC center frequency is generally determined by:

$$f_c = \sqrt{(L/C)}, \qquad (4)$$

where L is the inductance generated by the electrically conductive via 231 short to electrically conducting ground plane 227 within an individual capacitor pad 229, and C is the capacitance of the individual capacitor pad. The AMC bandwidth is generally affected by the properties of the dielectric medium 225. In general, a broader AMC bandwidth is achieved when the dielectric medium 225 has low dielectric loss and low real permittivity. Amorphous silica provides the lowest real permittivity ($\in_R = 3.9$) and lowest dielectric loss (tan $\delta = 2 \times 10^{-5}$) of all known ceramic dielectric materials. AMC bandwidth is also broadened when high permeability materials ($\mu_R \neq 1$) are incorporated into the structure. The large size of resonant AMC structures imposes a practical limitation against deploying them in mobile devices. As described above, high permittivity materials can be used to reduce the physical dimensions of resonant structures. Therefore, methods and products enabled by the present invention that combine high permittivity ($\in_R \geq 9.3$) ceramics, with high permeability ($\mu_R \neq 1$) materials and amorphous silica to minimize an AMC's physical dimensions while maximizing the bandwidth are highly desirable. A specific objective of the invention is to construct a meta-material antenna module that incorporates an AMC ground plane to improve impedance matching with semiconductor die to which the antenna element is coupled. A further embodiment claims an AMC ground plan structure that comprises the high permeability and high permittivity dielectric layers and/or inclusions embedded within or disposed upon a dielectric host having a loss tangent less than $5 \times 10^{-3}$, or what is generally possible with green tape ceramic structures. Suitable hosts include organic dielectrics, such as PFTE Teflon, Rogers Duroid, and Rogers GTek, which will typically have loss tangents in the range of $1.5$–$3 \times 10^{-3}$. The use of an amorphous silica host is a preferred embodiment of the invention as it has a loss tangent of $2 \times 10^{-5}$. Specific reference is now made to FIGS. 12A thru E to detail this aspect of the invention, which describes an antenna module 228 that comprises at least one reduced impedance conducting antenna element 230 situated directly upon a high-κ ceramic dielectric layer or inclusion 232A and an AMC 233 acting as the ground plane for the module, wherein the AMC 233 may comprise conventional dielectric materials or composite dielectric bodies enabled by this invention. In another aspect, the invention describes an AMC 233 having a composite dielectric body 234 that comprises a low-loss dielectric component, in whole or in part, having a loss tangent less than $5 \times 10^{-5}$, preferably less than $1 \times 10^{-3}$. A specific objective of the present invention is the construction of an AMC ground plane 233 comprised of a composite dielectric body having dielectric components selected from the group consisting of amorphous silica, organic dielectrics, high permittivity ceramic dielectrics having $\in_R \geq 9.3$, high permeability ceramic dielectrics having $\mu_R \neq 1$, that has a physical size ≤80% and an operating bandwidth greater than or equal to a similarly configured AMC constructed without the use of amorphous silica or high-κ or high-μ ceramic dielectrics. In addition to the details described above, this embodiment might optionally incorporate a composite dielectric body wherein the high-κ or high-μ ceramic dielectrics are incorporated as discrete inclusions within a low loss dielectric host 235. Alternatively, the ceramic dielectrics may be included within the composite dielectric body 234 as a high permittivity ceramic layer 232B or high permeability ceramic layer 236. The ceramic dielectric layers and/or inclusions may be located anywhere within composite dielectric body 234 that optimizes the resonant characteristics of the AMC to meet design specifications for a particular application. The composite organic dielectric body 234 could be constructed by applying dielectric layers inclusions to a pre-fabricated sheet of organic dielectric, drilling through holes through the structure and applying metallization using techniques well known to practitioners skilled in the art, such as plating techniques, among others, to form the capacitor pad array 223, vias 231, and electrical ground plane 227. Similarly, composite ceramic AMC's may alternatively be fabricated by starting with a substrate, such as quartz or any other suitable inorganic material listed above, wherein the additional ceramic/metallization components are similarly applied using powdered or liquid aerosol techniques. Alternatively, dielectric components of the AMC may be fabricated entirely from aerosol spray processes deposited on a metallization layer, with optional patterning if needed, wherein the metallization layer itself may comprise a detachable layer, such as a peel-apart foil, or may be affixed to a surface of a component, such as an interconnect or semiconductor die, that remains integral to the finished antenna module. In cases where an organic dielectric body is assembled using a peel-apart foil to formulate a ground plane 227 and contact pads 240 in electrical communication with vias 239 (if needed), the ceramic dielectric layers and/or inclusions are applied by a powdered aerosol spray techniques, and organic dielectrics are applied by liquid aerosol deposition, preferably. Vias are formed by drilling through the deposited dielectrics. Metallization is applied to the holes and to form the pad array using plating or other means. Metallization foils can also be used to fabricate AMC structures containing ceramic host dielectrics. Although the ceramic structures can be fabricated entirely with liquid or powder aerosol techniques, the ability to prepare highly uniform dielectric host materials comprised of amorphous silica, titania, pure alumina, tantalum oxide, niobium oxides or admixtures thereof, and high-κ/high-μ ceramic dielectrics with controlled grain size/microstructure is a principal advantage to using liquid aerosol spray techniques. An additional benefit to the use of liquid precursors and all-ceramic structures is the optional ability to apply spin-coated layers to form extremely smooth surfaces 237, having roughness less than or equal ±0.2 μm RMS at an interface between a sprayed ceramic dielectric and any additional material body (metal, dielectric, air) that might be disposed thereupon to improve physical characteristics that are influenced by interfacial quality. The antenna module, as depicted in FIGS. 12A thru E, may optionally include an additional composite ceramic dielectric body 238 disposed thereupon that may comprise any one or all of the attributes depicted in FIGS. 6&7, and the conducting antenna element 230 may comprise a dipole antenna element, patch, or monopole antenna, as described herein. Electrical communication with the conducting antenna element 230 is managed with electrical feeds that may optionally be configured as vias 239 embedded within the AMC body 233 to provide electrical contact between at least one contact pad 240 within metallization layer 230, wherein the via 239 and the contact pad 240 are electrically isolated from the electrical ground plane 227 and the array of capacitor pads 240. Alternatively, the electrical feeds may comprise transmission lines 241 that traverse the surface of high-k 232A rather than penetrating the AMC body 233 to make electrical connection through at least on side 243 of the antenna module as shown in FIGS. 12 A&D. The via(s) 239, contact pad(s) 240, and transmission lines 241 need be located as depicted in FIG. 12, but positioned anywhere within the antenna module 228 that provides optimal design characteristics. These vias can be backfilled with conductive pastes, or, preferably loaded with a column of studs to build via structures that have roughly the same physical dimensions as the antenna element and the contact pads. There are, however, certain instances when it is advantageous to use a discrete wire to maintain electrical communication with the at least one contact pad 240 to the conducting antenna element 230. For example, when the antenna element(s) 230 consist of discrete wire, it is preferable to use a continuous discrete wire to connect the contact pad 240 to the terminating capacitor 222. As shown in FIG. 12E, a ball bond 244 is formed by inserting the wire bonding tool's capillary into the laser drilled via and bonding the wire to the at least one contact pad 240. In this instance, it is preferred to construct an AMC ground plane structure 233 that that has a height h greater than 100 microns, preferably greater than 150 microns, so that the discrete wire may having flexible bending point 245 that allows the wire to be folded and stitched, as shown in FIGS. 5A-J, along the AMC surface. This minimum height is preferred to avoid mechanical weakness generated in the discrete wire as the ball is flamed off of the wire's end. The flame-off procedure causes mechanical weakness in a region 246 identified by practitioners skilled in the art of wire bonding as a Heat Affected Zone (HAZ), which can extend 100-150 microns beyond the ball, depending upon flame-off conditions. There is a high incidence of wire fracture at kinks or bends that are applied to the HAZ part of the wire, so it is preferred to deposit wire for a length greater than the HAZ before bending the wire to run parallel to the AMC (or other) ground plane structure. After completing the electrical contact between the contact pads 240 and the discrete wire antenna element's termination pad 222, the drilled vias in which the discrete wire and ball bond 244 are subsequently filled with the dielectric host material 247.

It is well-known to practitioners skilled in the art of antenna design that resonant antenna elements provide enhanced performance at multiple frequencies where the reactive component of the antenna's impedance is close to zero. For instance, the reactive component of a resonant dipole's input impedance will be zero-valued at resonant frequencies, defined as those frequencies wherein the combined length of the dipole arms, l, are sequenced multiples of the frequencies' half-wavelengths given by:

$$l \approx \{\lambda_R(n+1)\}/2, \ n=0,2,4, \quad (5)$$

Figure 13:
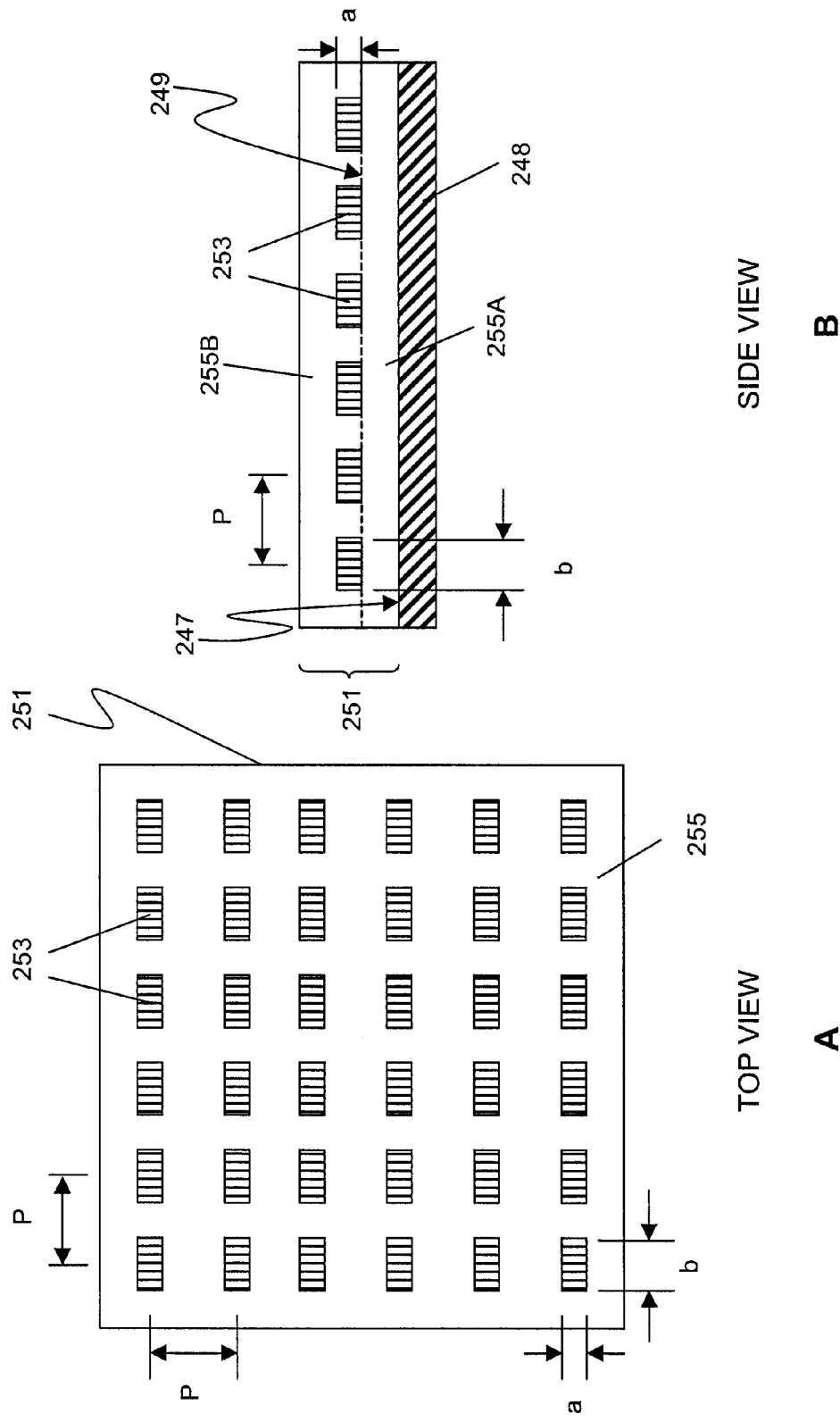
FIG. 13A-B is an illustration of a meta-material body comprising ultra-low loss silica or titania as a dielectric host constructed as an electromagnetic band gap (EBG) material that satisfies conditions for Bragg scattering.
Figure 14:
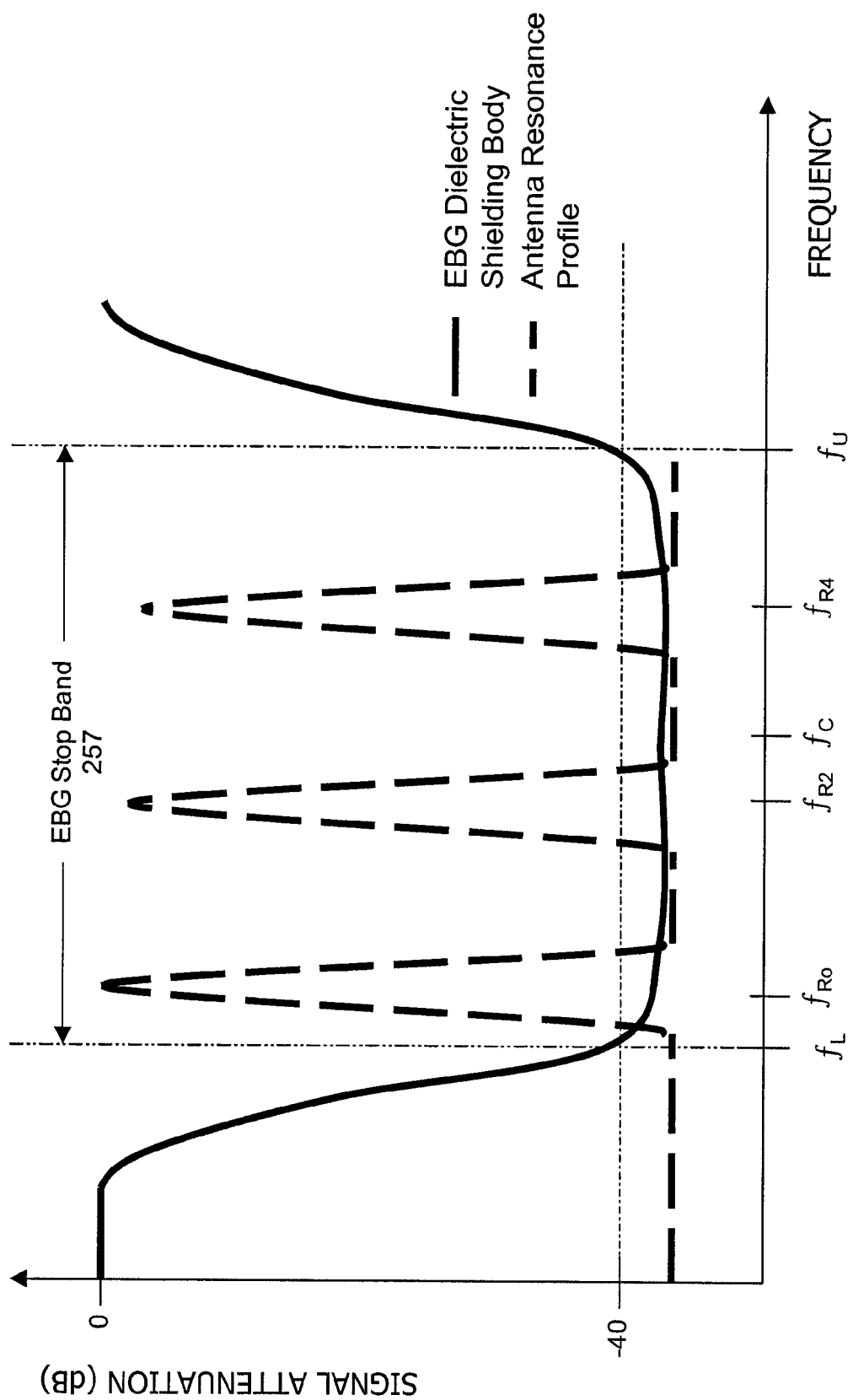
FIG. 14 is a graph illustrating the electromagnetic band gap characteristics of a meta-material body structured to satisfy conditions of Bragg scattering and the optimal filtering characteristics of a EBG material created from such a body.

As a consequence, an antenna module (configured either as 192 or 228) designed to operate exclusively at a primary resonant frequency may also be susceptible to higher order resonant frequencies. In the case of the dipole, the primary resonant frequency would have a wavelength $\lambda_{Ro} \approx 2l$, but will also be sensitive to signals at electromagnetic frequencies having wavelengths corresponding to $\lambda_{Rn} \approx 2l/(n+1)$, where n=2, 4, 6, . . . , that can cause noise and interference when not properly filtered. An antenna module deployed in a wireless communications system is usually surrounded by additional microelectronic components placed adjacent to the antenna module that will radiate spurious signals that have the potential to correspond to both the primary and higher order resonant frequencies. A specific objective of the present invention is the construction a reduced component-count antenna module as shown in FIGS. 6 and 12 that does not require additional components to isolate the signals of primary interest to the wireless communications device. To address this need, the composite dielectric body 196 and 238 optionally added to embodiments 192 and 228, respectively, may be engineered to act as a frequency filter that rejects the higher order resonant frequencies from near and far-field sources, as well as spurious signals at resonant frequencies from microelectronic components in the vicinity, but not placed directly in front, of the module's conducting antenna element. A composite dielectric body 196 or 238 may be configured as an electromagnetic band gap (EBG) meta-material dielectric to establish a means for suppressing such spurious signals. With reference to FIGS. 13&14, an EBG meta-material dielectric 251 comprises a periodic array of high-κ dielectric inclusions 253 within a lower-r host dielectric host 255. The EBG produces a stop band 257 to electromagnetic (EM) frequencies that have a wavelength $\lambda_c$ comparable to the spacing period P between the dielectric inclusions 253. The dielectric inclusions 253 contained within a low permittivity host dielectric 255 will strongly scatter/reflect EM waves incident upon them. Electromagnetic wave propagation is inhibited when the periodic spacing P between the inclusion causes the scattered components to destructively interfere with the transmitted EM wave components, those not incident upon the inclusions, over frequencies ranging between $f_L$, the band's lower stop frequency, and $f_U$, the band's upper stop frequency. A stop band will typically be characterized by the frequency, $f_c$, located at the center of the band. The width of the EGB stop band 257 varies as a function of the ratio of the relative permittivity between the dielectric inclusions 253 $\in_{R(incl)}$ and the low-k dielectric host 255 $\in_{R(host)}$. Conditions for destructive interference over a broad frequency band is generally maximized when the ratio of the relative permittivity between dielectric inclusion and the dielectric host is in the range $10 \leq \in_{R(incl)}/\in_{R(host)} \leq 50$, and when low loss materials are used to form the inclusions as well as the host. The EBG meta-material composite dielectric 251 is fabricated by applying an optional base host dielectric layer 255A to a substrate 248 using an aerosol spray.

The substrate 248 may be an independent dielectric or conducting layer, or such a layer that is part of an antenna module, semiconductor die, microelectronic devices, etc., or it may be a sacrificial layer that allows the EBG meta-material composite dielectric 251 to be separated from the substrate 248 as a free-standing body. The present invention uses an organic dielectric, preferably a low-loss organic like Rogers Duroid, GTek, or PFTE Teflon, or a ceramic dielectric, preferably a ceramic dielectric having loss less than $5 \times 10^{-3}$, as the host material for the EGB meta-material composite dielectric body 196/238. In instances, where large size reductions of the antenna module (compared to its free-space equivalent) is desired, titania, which is reported to have a relative permittivity $\in_R \leq 90$ and a loss tangent of $9 \times 10^{-4}$, tantalum oxide, pure alumina, or any admixture thereof with amorphous silica, is preferred as a dielectric host medium. Dielectric inclusions 253 are selectively deposited on the optional base host dielectric layer 255A or the substrate 248. Titania ($TiO_3$) is preferred as the dielectric inclusion 253 material in low permittivity host dielectrics, like organic media or amorphous silica. The dielectric inclusions 253 can have any shape, ceramic composition, and physical dimension that maximize stop band performance for a specific design objective. The center frequency $f_c$ of an electromagnetic wave having wavelength $\lambda_c$ is used to fix the band location. In general, the period P should not be greater than $0.15\lambda_c$ or less than $0.05\lambda_c$, and preferably, not greater than $0.12\lambda_c$ or less than $0.08\lambda_c$. The high-κ dielectric inclusions 253 may assume any geometric form, rectangular, circular, etc., and comprise a single ceramic composition, giving them all uniform dielectric properties, or multiple ceramic compositions, wherein the inclusions' dielectric properties are varied in accordance with their relative position within the inclusion array. It is generally preferred to define the inclusions 253 by a major dimension a and a minor dimension b, where the major axis a is generally not greater than $0.075\lambda_c$ or less than $0.025\lambda_c$, preferably not greater than $0.06\lambda_c$ and less than $0.041\lambda_c$, and the minor dimension b is generally in the range of 0.5a to 0.01a, preferably 0.25a to 0.075a. The various parameters P, a, b, and $\in_{R(incl)}$ are selected by numerical analysis to suppress the interfering signals anticipated from spurious emissions by neighboring components to penetrate the module and shield the antenna elements. In embodiments that incorporate an organic dielectric host, the inclusions 253 are formed using aerosol powder spray deposition. Selective location can be applied using a variety of methods, such as spraying through a mask, or spraying a uniform layer and selectively removing portions of the sprayed layer using photolithographic techniques to reveal the appropriate inclusion form and dimension. Aerosolized powder deposition techniques may also be used to form inclusions in all-ceramic embodiments, however, liquid aerosol deposition methods are preferred for its superior microstructure control and faster processing speeds. Ceramics sprayed from liquid aerosols may also be applied through masks or with photolithographic processing, however, the use of ink-jet spray deposition methods is preferred to improve manufacturing efficiencies and when inclusion complexity (multiple dielectric compositions) is a design objective. Laser trimming methods are applied to ensure inclusion size and shape meet design tolerances. The EBG meta-material dielectric 251 is completed by applying dielectric host materials over the assembly using liquid or powder aerosol techniques. In all-ceramic embodiments, spin-coated layers having surface roughness ≤±0.2 μm RMS may be optionally applied at interfaces 247 and 249 to improve design tolerances.

Figure 15:
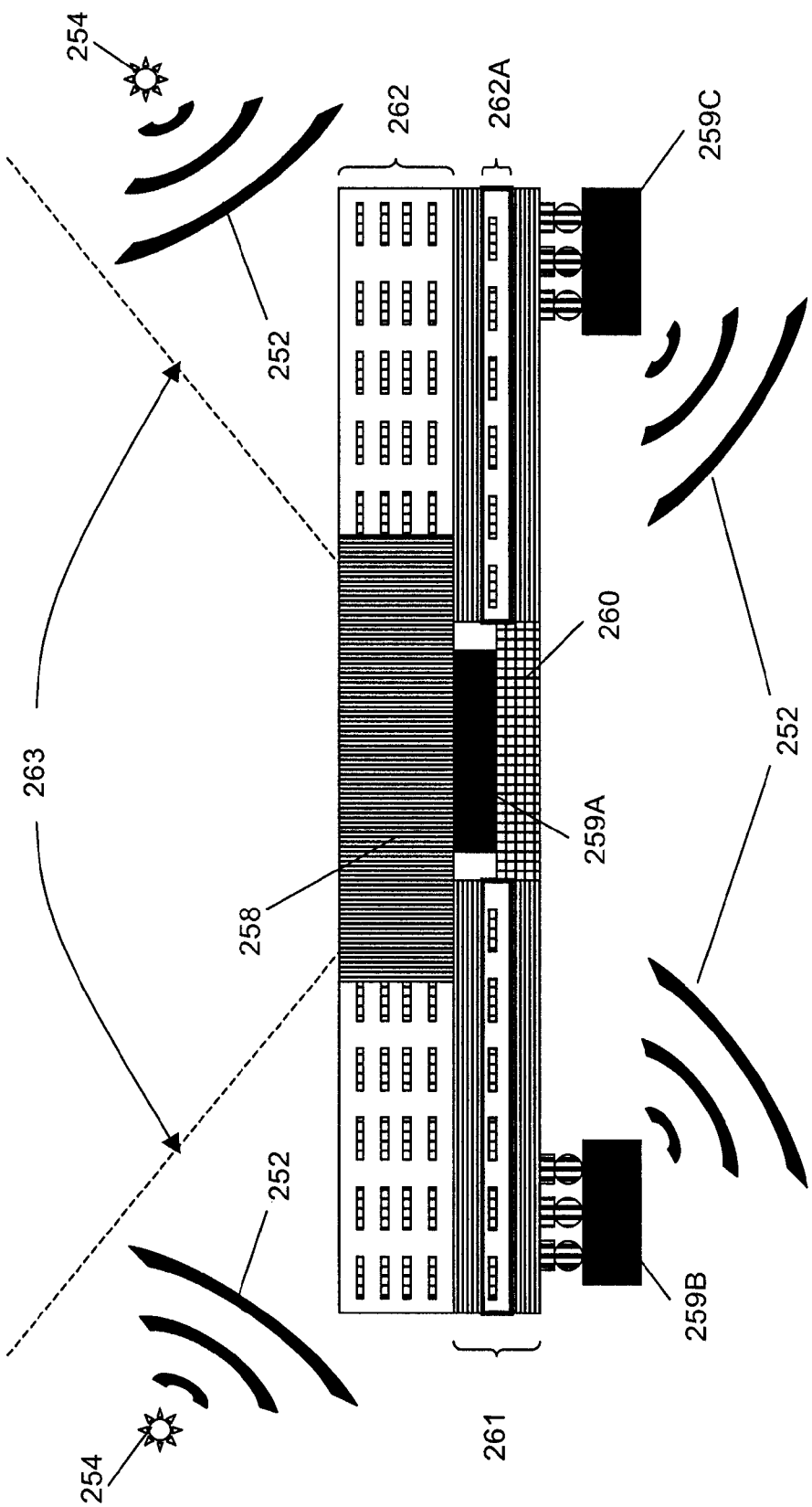
FIG. 15 is an illustration showing the use of electromagnetic band gap meta-materials to isolate the antenna element from noise sources by suppressing spurious signals and ground loops.

Reference is now made to FIGS. 15&14, which depicts an antenna module 258, additionally comprising at least one semiconductor die 259A and a heat sink 260, in electrical communication with an interconnect circuit 261 and additional semiconductor die 259B,C, wherein at least one EBG meta-material dielectric body 262 is situated in the vicinity of the antenna module 258 to isolate spurious electromagnetic signals 252 emanating from neighboring semiconductor die 259A,B or discrete EM sources 254 that are not located in the antenna module's radiation beam profile 263. The EBG meta-material dielectric body 262 may also be located as a dielectric shielding layer 262A that is part of any interconnect circuit 261 to which the antenna module is connected or situated near, or as a shielding material affixed to a container (not shown) in which these circuits are housed. The EBG meta-material dielectric body will completely null the electromagnetic emissions at frequencies falling within the stop band. This provides a superior alternative to conventional shielding methods which can introduce system and phase noise through ground loop perturbations. An EBG meta-material dielectric body 262 so used should be engineered to have a stop band 257 with a lower stop frequency $f_L$ that is less than the antenna's fundamental (n=0) resonant pass band, and extends to an upper stop frequency $f_U$ that is greater than pass band(s) one of the higher-order (n=2, 4, 6, . . . ) resonant frequencies $f_{R2}$, $f_{R4}$, $f_{R6}$, . . . , etc.

Figure 16:
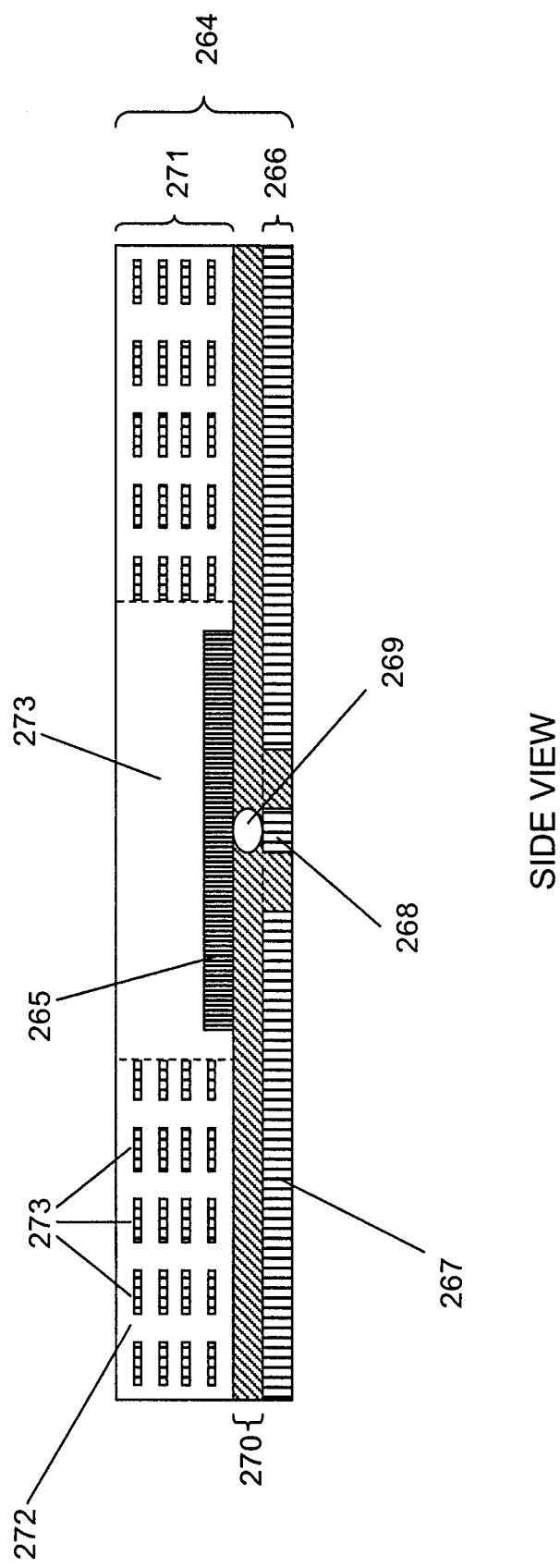
FIG. 16 is an illustration showing the use of electromagnetic band gap materials in conjunction with a dielectric body of an antenna module in a manner that is used to isolate or filter electromagnetic signal frequencies of antenna elements positioned on the surface of or within said EBG dielectric body.
Figure 17:
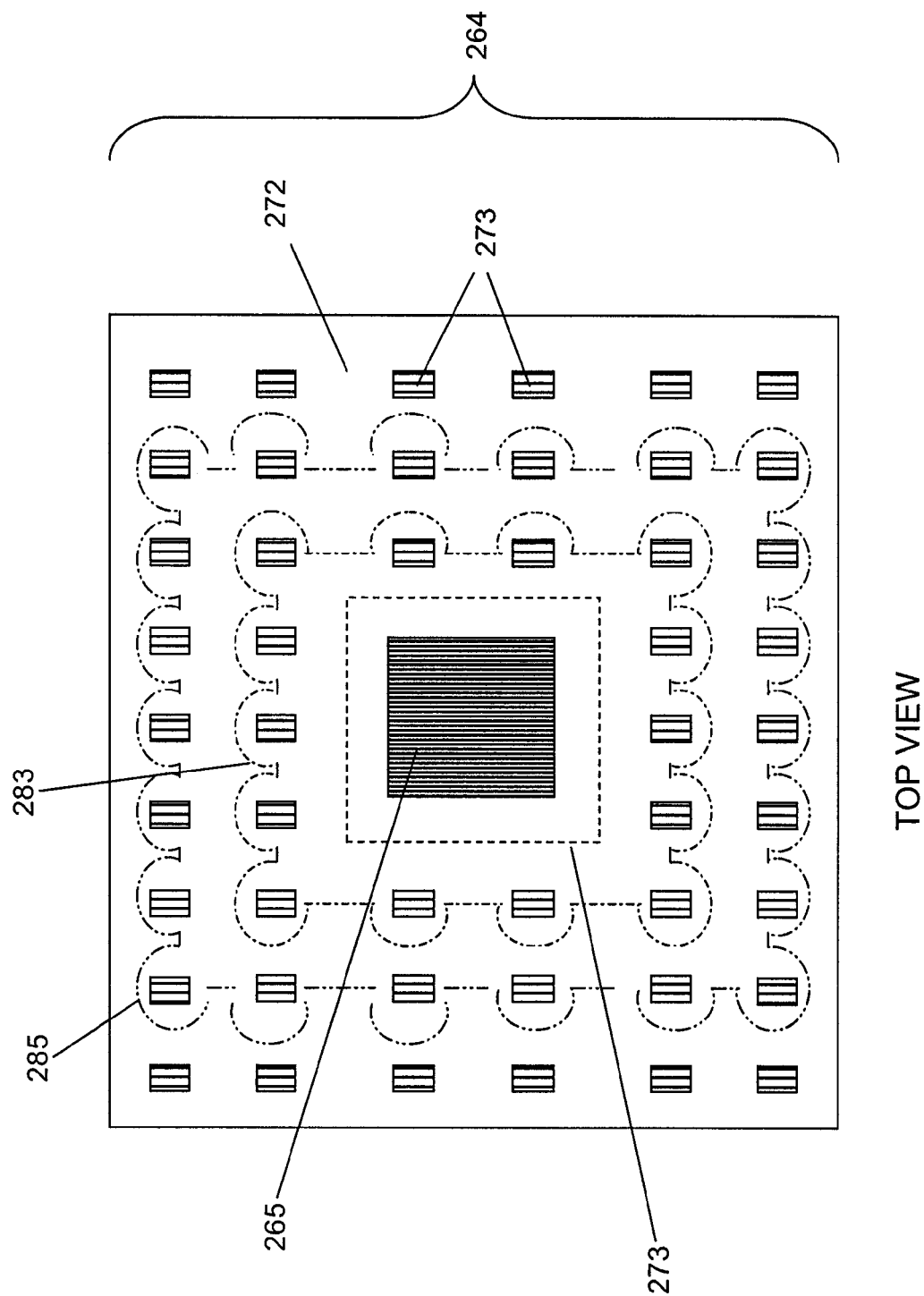
FIG. 17 is a top view of EM field localization around an antenna element that is electrically isolated from spurious signals at frequencies not of interest to transmission or reception in the antenna environment by located said antenna element at the center of a defect resonator.
Figure 18:
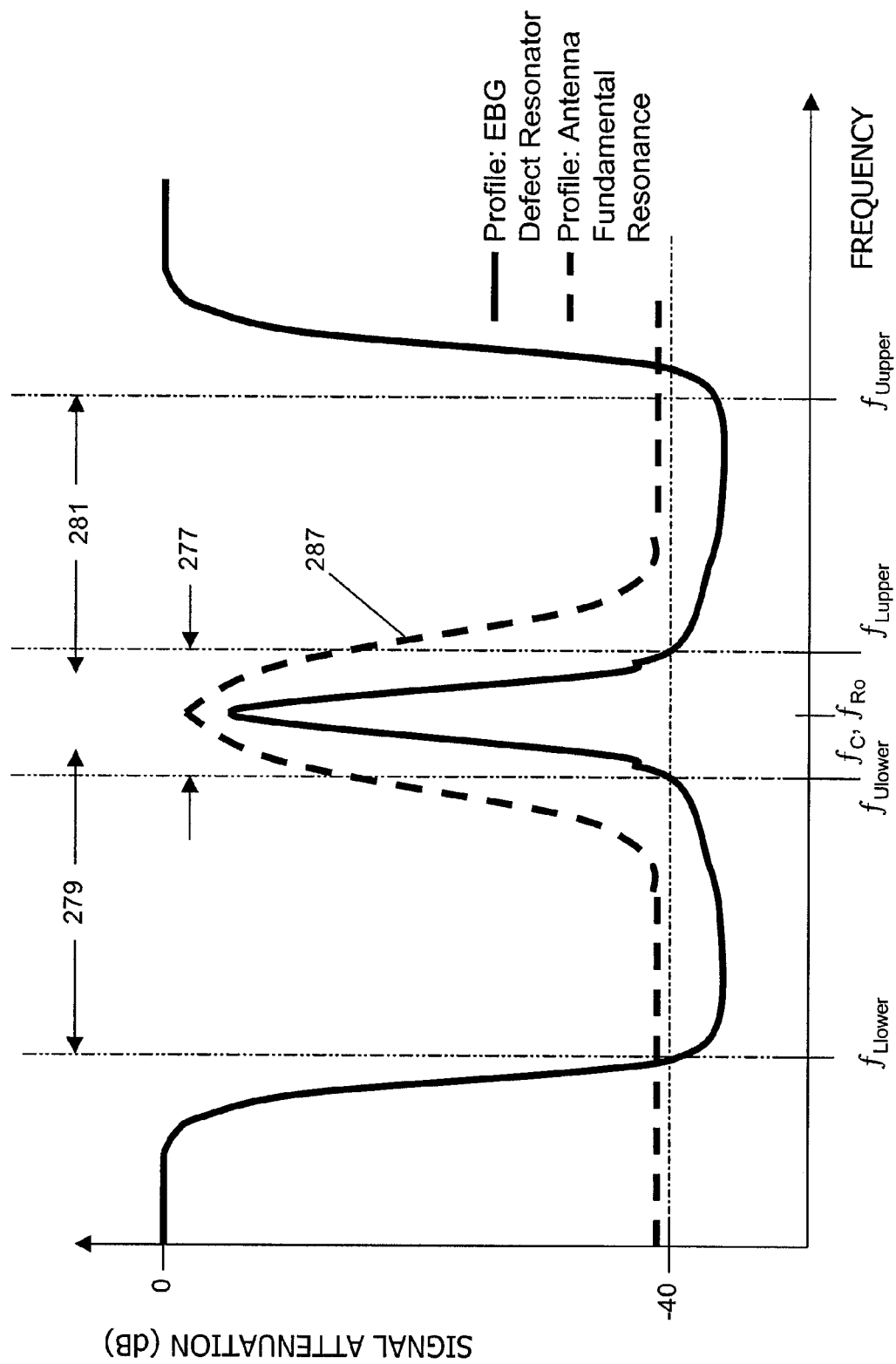
FIG. 18 is an illustration of characteristic contours in the attenuation pattern of electric field intensity around an inclusion-free zone of a defect resonator.

Making reference to FIGS. 16, 17, & 18, an additional embodiment of the invention claims an antenna module 264 that comprises a conducting antenna element 265 separated from a metallization layer 266, which contains portions that function as a ground plane 267 and contact pads 268 in electrical contact through conductive means 269 with the conducting antenna element 265, by a base dielectric layer 270. This embodiment further comprises a composite dielectric body 271, consisting of a dielectric host 272 and a plurality of dielectric inclusions 273 having relative permittivity greater than the dielectric host 272, wherein the composite dielectric body 271 is configured to act as an EBG defect resonator and the conducting antenna element 265 is located within an inclusion-free zone 273 of the composite dielectric body 271. An EBG resonator comprises a standard EBG 251 (see FIG. 13) with at least one dielectric inclusion 253 removed from the periodic array contained within the host dielectric 255. The defect resonator substantially limits propagation of electrical fields to a narrow pass band 277 of frequencies around the center frequency $f_c$ of the stop band that would exist if the EGB meta-material did not contain a defective "inclusion-free zone". In effect, the inclusion-free zone causes the EBG stop band to split into a Lower Stop Band 279 (between $f_{Llower}$ and $f_{Lupper}$) and an Upper Stop Band 281 (between $f_{Ulower}$ and $f_{Uupper}$). The EM field components of the pass band frequencies are also strongly localized to regions within the inclusion-free zone, and will typically be attenuated by 5-20 dB within a first perimeter 283 extending beyond the first nearest row of dielectric inclusions 273 (roughly a distance of one (1) period P from the center of the inclusion-free zone), and be attenuated by >40 dB beyond a second perimeter 285 extending beyond the second nearest row of dielectric inclusions 273 (roughly a distance two (2) periods P from the center of the inclusion-free zone). The field localization and the width of the narrow pass band 277 is a complex function of the ratio of the real permittivity $\in_{R(incl)}/\in_{R(host)}$ of the high-κ dielectric inclusions 273 and the dielectric host 275. Superior localization and frequency filtering is achieved when the dielectrics used for form the composite dielectric body 264 have reduced loss tangent. In this embodiment of the invention, the conducting antenna element 265 is situated in the center of the inclusion-free zone 273 and the composite dielectric body serves a dual purpose: in one aspect it is used as a high effective permittivity dielectric that miniaturizes the antenna elements size while providing high radiation coupling efficiency, in another aspect it shields the antenna element from undesirable signal noise and interference. In this instance, it is advantageous to tune the resonant conducting antenna element 265 to have its fundamental resonance frequency, $f_{R0}$, to be near (≤±2%) the center frequency $f_c$ of the EBG defect resonator. Often, it is not possible to design an antenna to have a sufficiently narrow band profile that roll-offs as sharply with frequency as it is de-tuned from resonance to meet specific design objectives. A specific embodiment of the invention comprises an antenna module 264, wherein the composite dielectric body configured as a defect resonator 271 is designed to have a narrow pass band 277 that is narrower than the antenna element's resonant band profile 285. Preferred embodiments of the invention utilize an EBG defect resonator structure that uses low loss (loss tangent $\leq 5 \times 10^{-3}$) materials in the dielectric host 273 and the high-κ dielectric inclusions 273. These embodiments would comprise Rogers' Duroid, GTek or PFTE Teflon organic dielectrics, and low permittivity amorphous silica ceramic as host materials, and low-loss titania-based ($TiO_2$) inclusion dielectrics. These titania inclusion compositions could alternatively by modified to obtain optimal relative permittivity ratios, $\in_{R(incl)}/\in_{R(host)}$, with minor concentrations (0-5 mol %) of tantalum oxide ($Ta_2O_5$), zirconium oxide ($ZrO_2$), neodymium oxide ($Nd_2O_5$), hafnium oxide ($HfO_2$), and lead oxide (PbO) additives, by mixing said additives with titanium oxide precursors in the formulation that is spray deposited to form a periodic array of high-κ dielectric inclusions. Said additives are added in amounts such that the ratio between the relative real permittivity of said sprayed high-κ dielectric inclusions to the amorphous silica host falls within the range $25 \leq \in_{R(incl)}/\in_{R(host)} \leq 40$.

Figure 19:
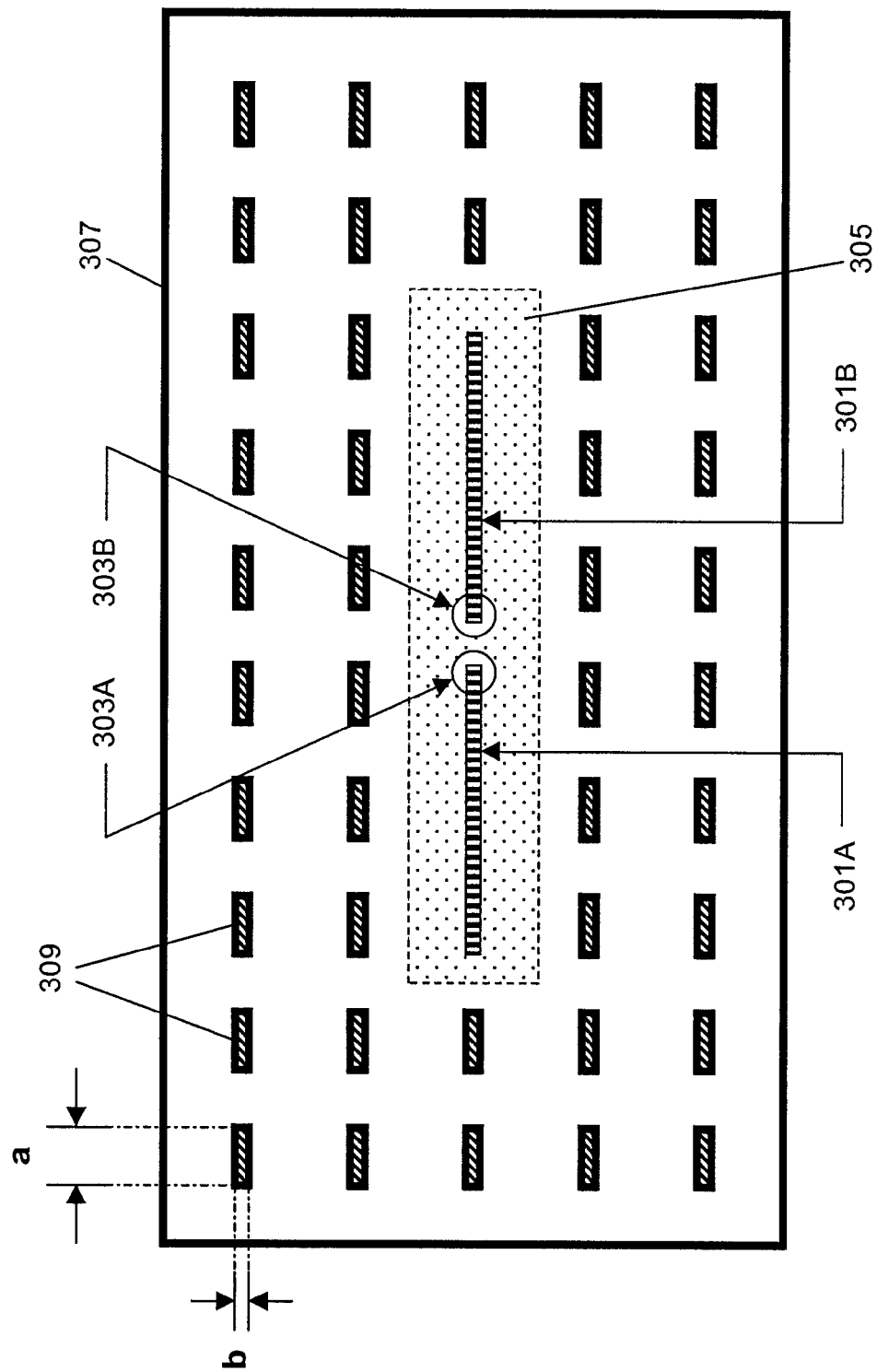
FIG. 19 is an illustration a dipole antenna located within the inclusion-free zone of a defect resonator.
Figure 20:
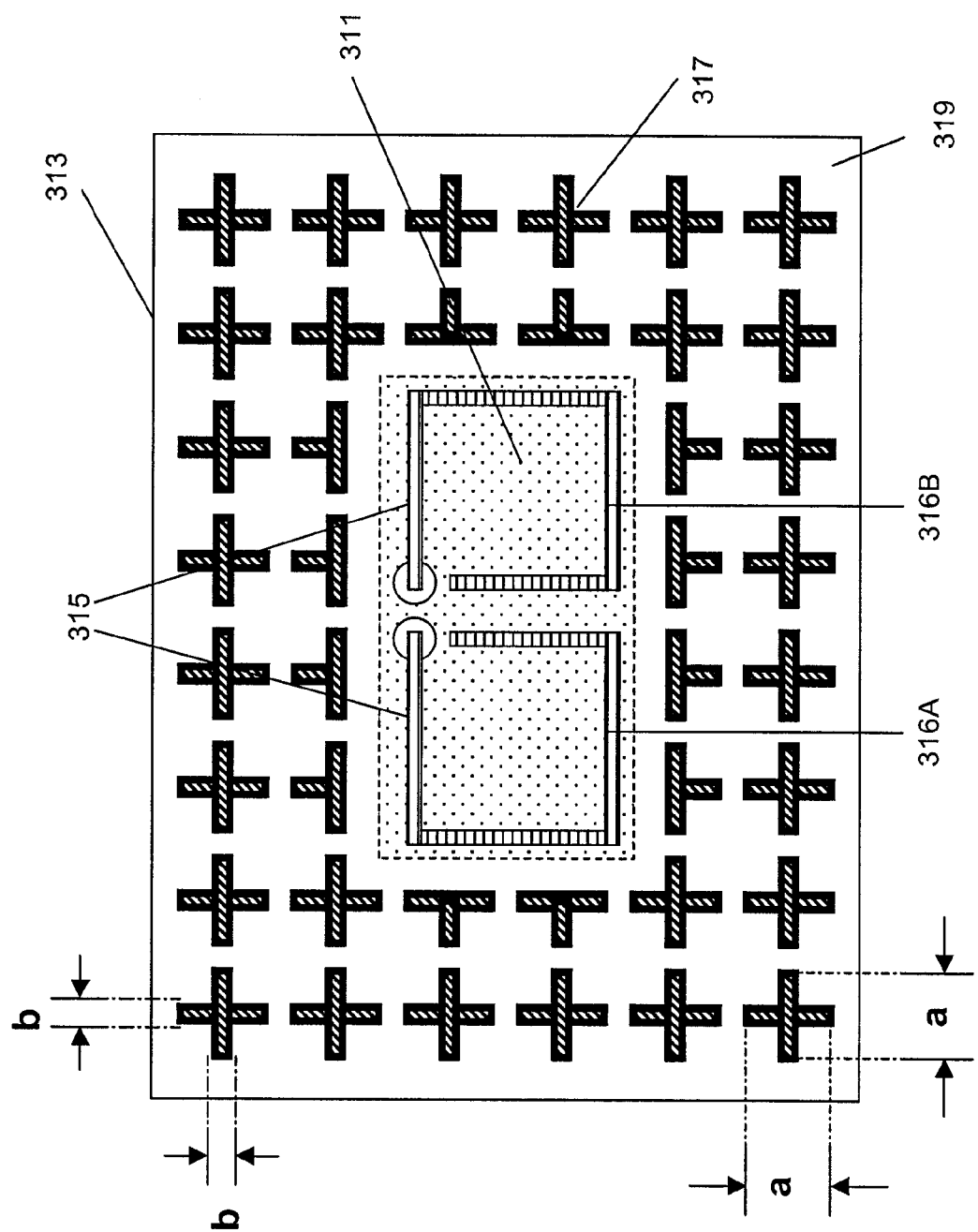
FIG. 20 is an illustration of a folded dipole antenna located within the inclusion-free zone of a defect resonator.
Figure 21:
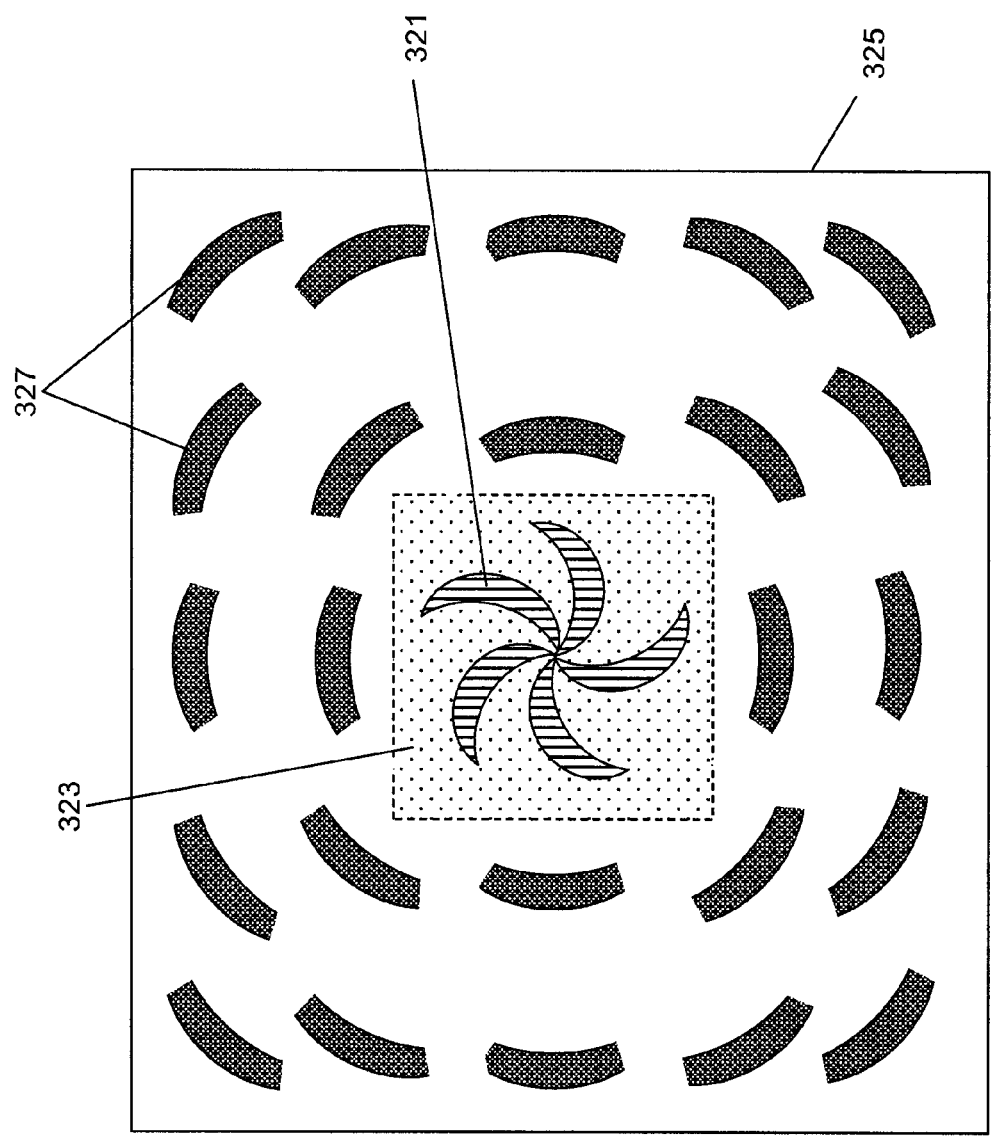
FIG. 21 is an illustration of a spiral dipole antenna located within the inclusion-free zone of a defect resonator.

It is often desirable to maximize the efficiency of the module for selected EM field polarizations. FIG. 19 shows a dipole antenna having anus 301A, 301B and their associated feed points 303A,303B co-located within the inclusion-free zone 305 that is centered within an EBG meta-material dielectric defect resonator 307. The arms 301A, 301B of the dipole are straight and may be oriented such that the major dimension a of the high-κ dielectric inclusions 309 are parallel with the major dimension of the arms 301A, 301B. In another configuration shown in FIG. 20, the antenna may be centered within an inclusion-free zone 311 of an EBG meta-material defect resonator 313 as a folded dipole 315, such that folded antenna arms 316A,316B have conductive segments of nearly equal lengths oriented in the x and y direction and, therefore, the antenna is receptive to circularly polarized, or cross-polarized electromagnetic waves. In this instance, high-x dielectric inclusions 317 may be embedded within the reduced permittivity host dielectric 319 in the shape of crossed rods (+), having two major axes that are aligned to be parallel with the major dimensions of the folded dipole arms 316A,316B. Alternatively, a spiral or circular antenna element or elements 321 (see FIG. 21) may be configured within or on top of the inclusion-free zone 323 of the EBG meta-material defect resonator 325, and cylindrical symmetry may be imparted to the shape of the high-κ dielectric inclusions 327 consistent with the electrical field patterns generated by the circular or spiral antenna element(s), which similarly have their feed points at and through the center of said inclusion-free zone. In each embodiment incorporating the antenna element at the center of the inclusion-free zone of an EBG meta-material defect resonator, it is a preferable to provide a meta-material dielectric array that contains at least two rows of high-κ dielectric inclusions around said inclusion-free zone(s).

Figure 1:
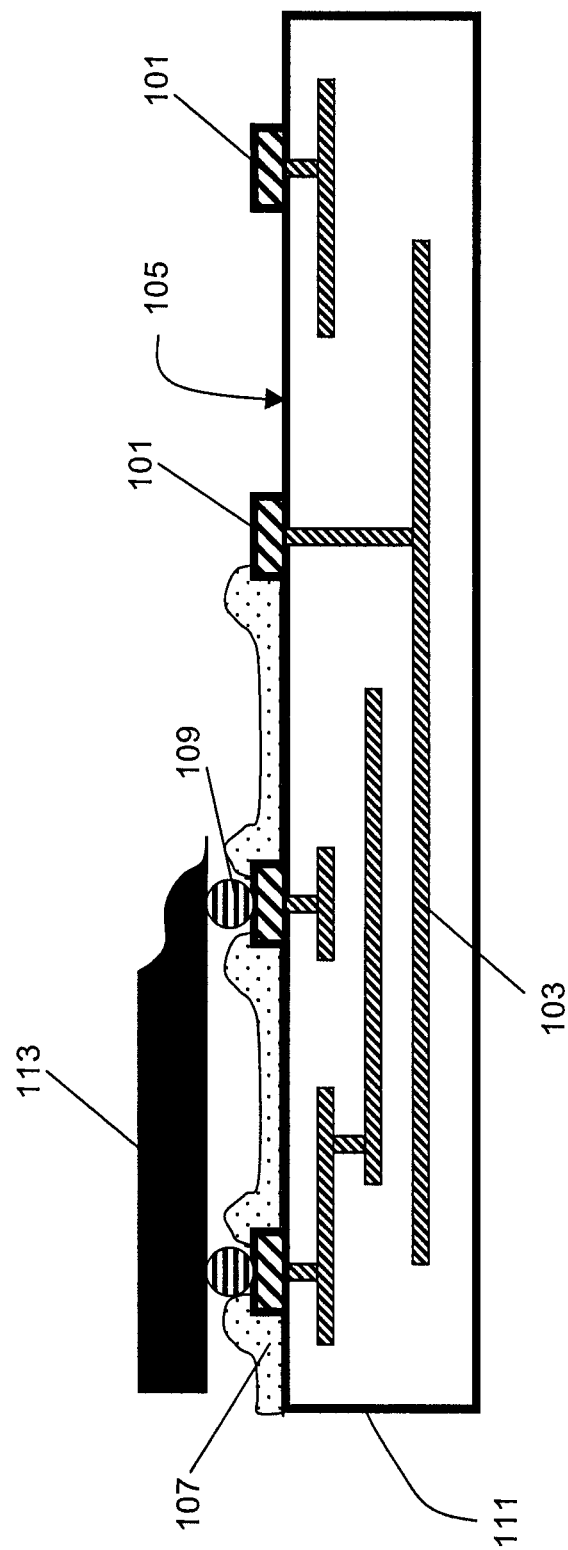
FIG. 1 is an illustration of represents prior art modules wherein the contact pads used to connect flip-chip mounted semiconductor die to the interconnect structure that protrude from the feed network's dielectric surface.
Figure 22:
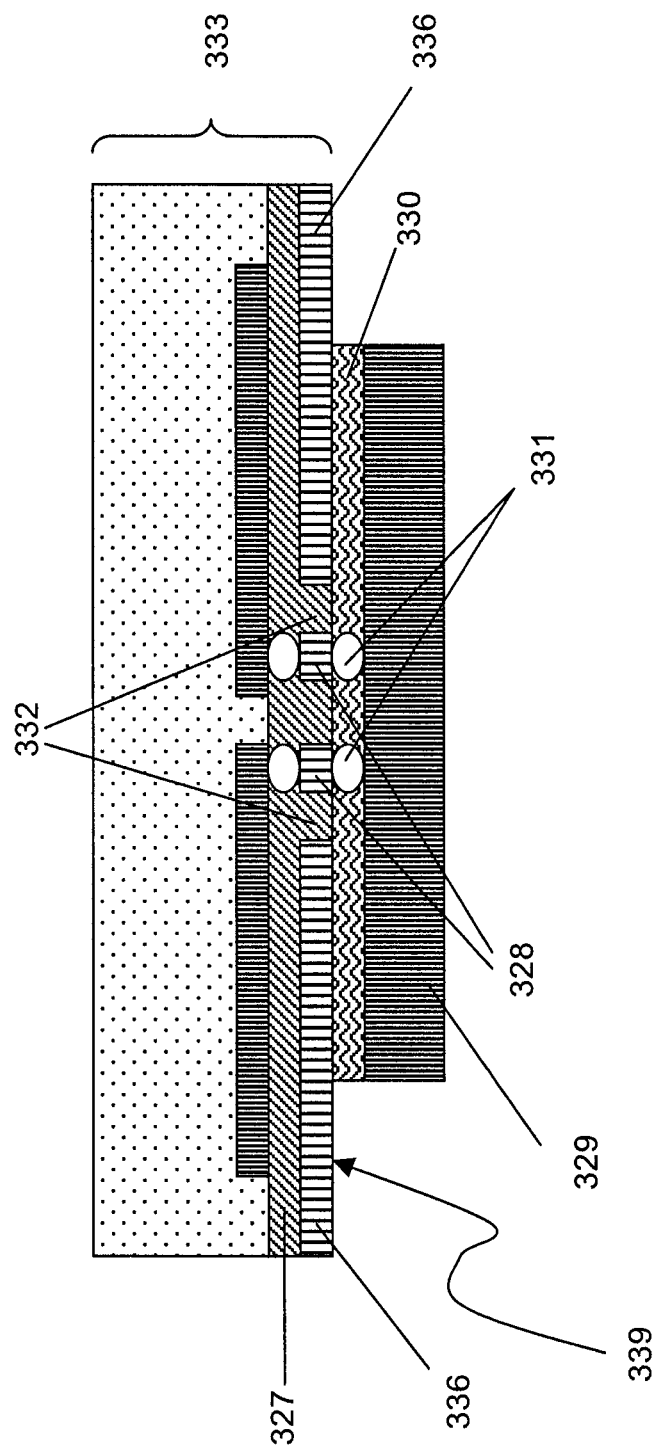
FIG. 22 is an illustration of an antenna module comprising a power amplifier (or other semiconductor) die attached to an antenna structure.

Four non-limiting approaches will now be described by which a wireless circuit module 115 comprising at least one PA/LNA (or other) semiconductor die 135 may be connected through an interconnecting electrical interconnect structure to the antenna element 114 (see FIG. 2B) in accordance with the present invention. With reference to FIG. 22, semiconductor die 329 may be flip-chip mounted through conductive means 331 directly to the antenna module 333, wherein the contact pads 328 are embedded in the surface of a base dielectric layer 327 to allow dielectric material 332 to be situated between metallization material used to form contact pad 328 and ground plane 336 structures, such that contact pads 328 and ground planes 336 do not protrude from surfaces 339 of the antenna module. An adhesive underfill 330 is used to secure the die's placement to the module and to protect metal contacts from environmental corrosion. This configuration is only suitable when the die's signal inputs/outputs (I/Os) are designed and engineered to mate with the antenna I/O's without requiring a separate interconnecting electrical interconnect structure 137 as shown in FIG. 2B or when an interconnecting electrical interconnect structure is integrated into the semiconductor die 329/135. However, this is rarely the case, and there is often the need to interpose an interconnecting interconnect structure 137 between the die 135 and the antenna module 114 to complete the wireless circuit module 115. Although the present invention describes novel embodiments and methods to provide an electrical interconnect structure 137 several interconnecting interposer interconnect structure structures composed of organic or ceramic dielectric currently available in the marketplace and could be used and fall within the scope of the present invention. Conventional interconnect structures contain contact pads 101 (see FIG. 1.), that protrude from the dielectric surface 100 and require the use of solder masks 107 to effectuate flip-chip mounting. The use of the solder mask 107 often places an upper limit on the pad density that can reliably applied when the die is flip-chip mounted. Semiconductor devices with high pad densities will often be backside mounted to the interconnect network, and wire bonds will be used to establish electrical connection between the high-density pads on the die and the electrical interconnect circuit. Wireless circuits are frequently used in mobile platforms, where it is advantageous to minimize the size/footprint of the circuit. Therefore, it is desirable to develop a means to eliminate the need to apply a solder mask to allow high-density semiconductor die to be flip-chip mounted to wireless circuit module. In addition, currently available interconnect structures will also contain pad structures having physical dimensions that are substantially different from the conductor traces and vias to which they are electrically conducted, thereby causing undesirable signal reflections and losses internal to the interconnect at higher signal frequencies.

Figure 23A:
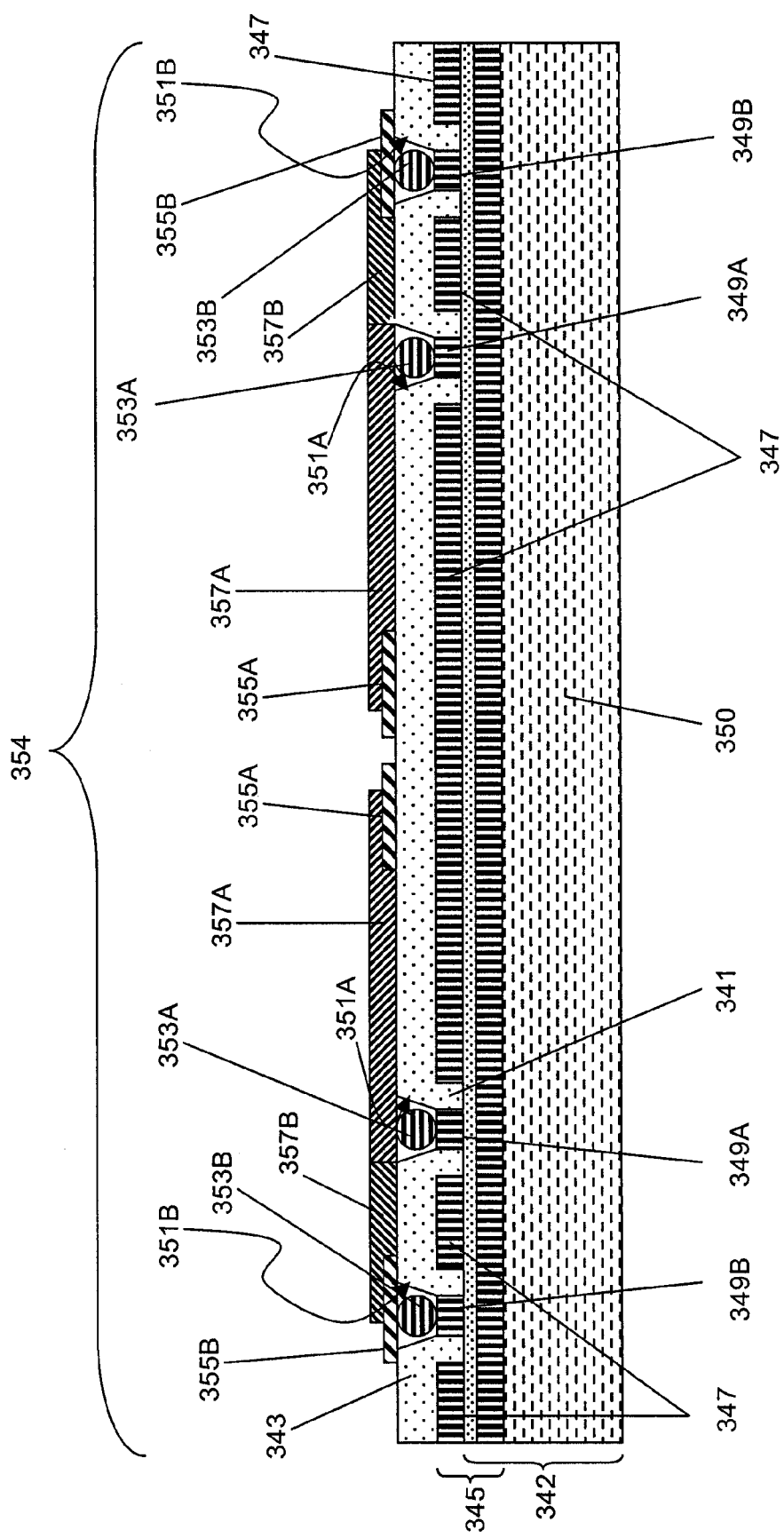
FIG. 23A-E are illustrations of an antenna module, and methods to make same, comprising a power amplifier (or other semiconductor) die attached to an antenna structure through an interconnecting feed network.
Figure 23B:
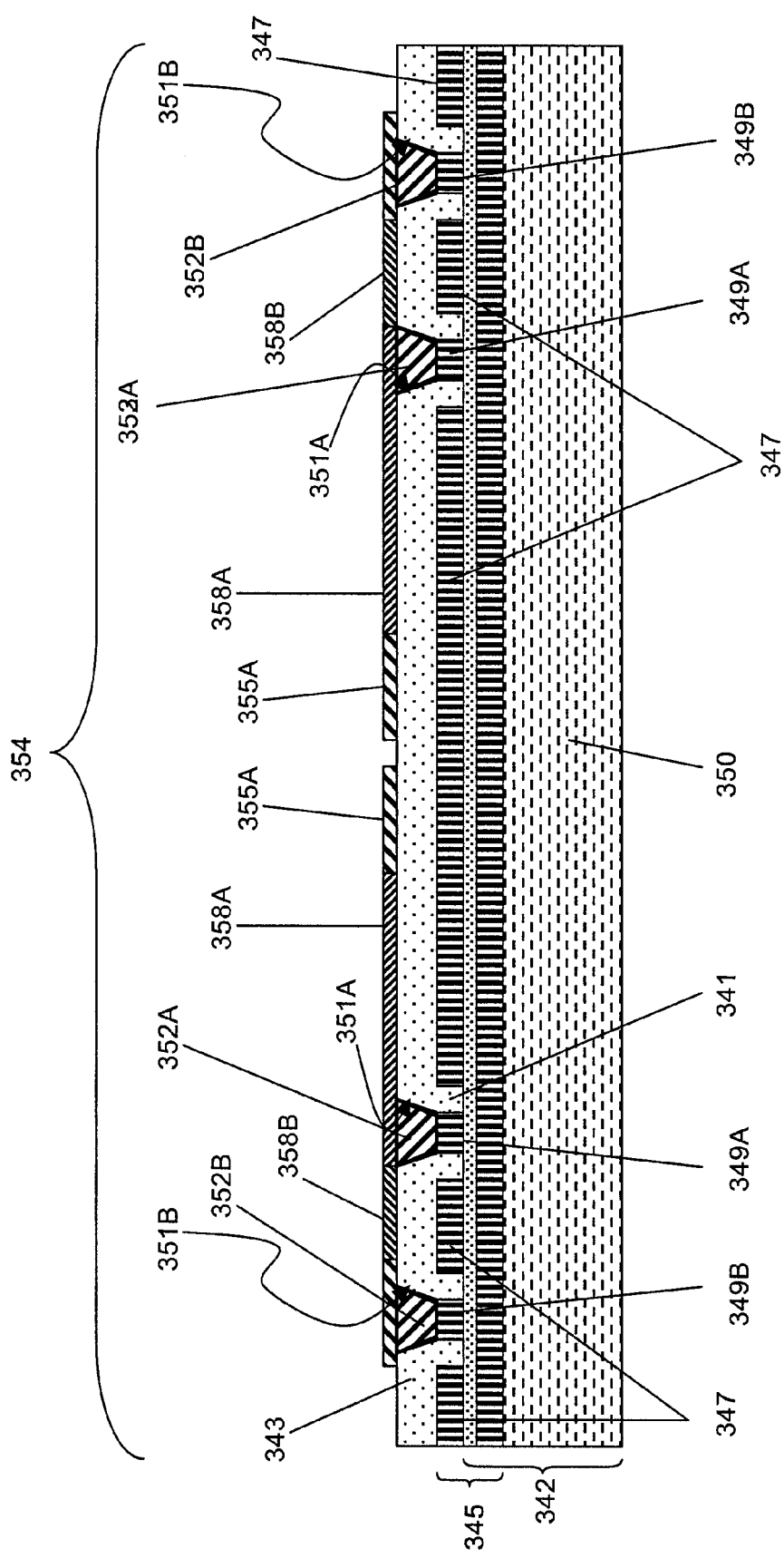
Figure 23C:
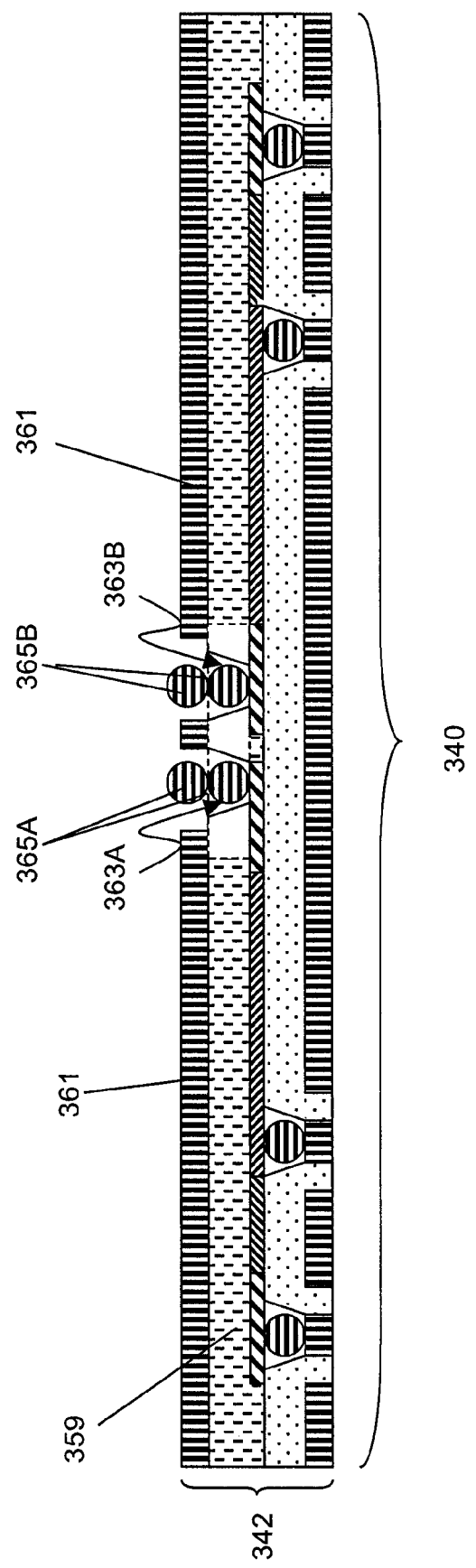
Figure 23D:
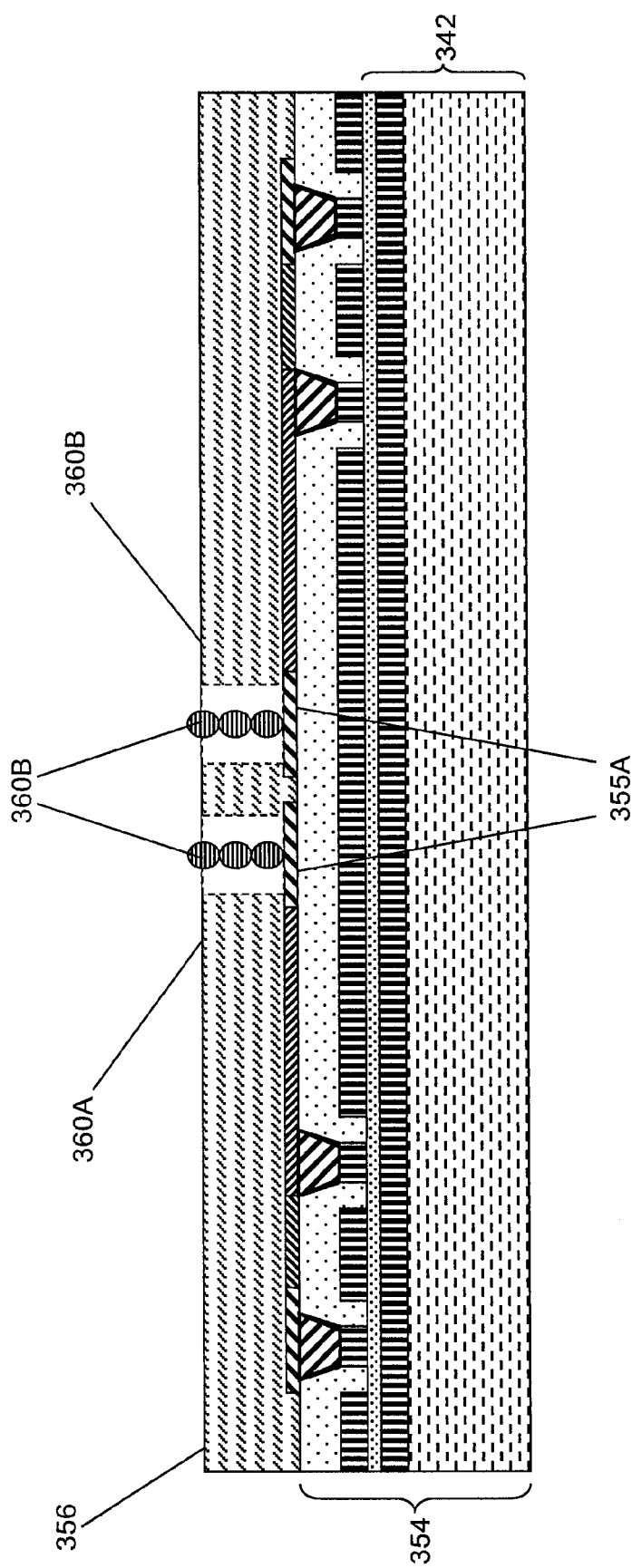
Figure 23E:
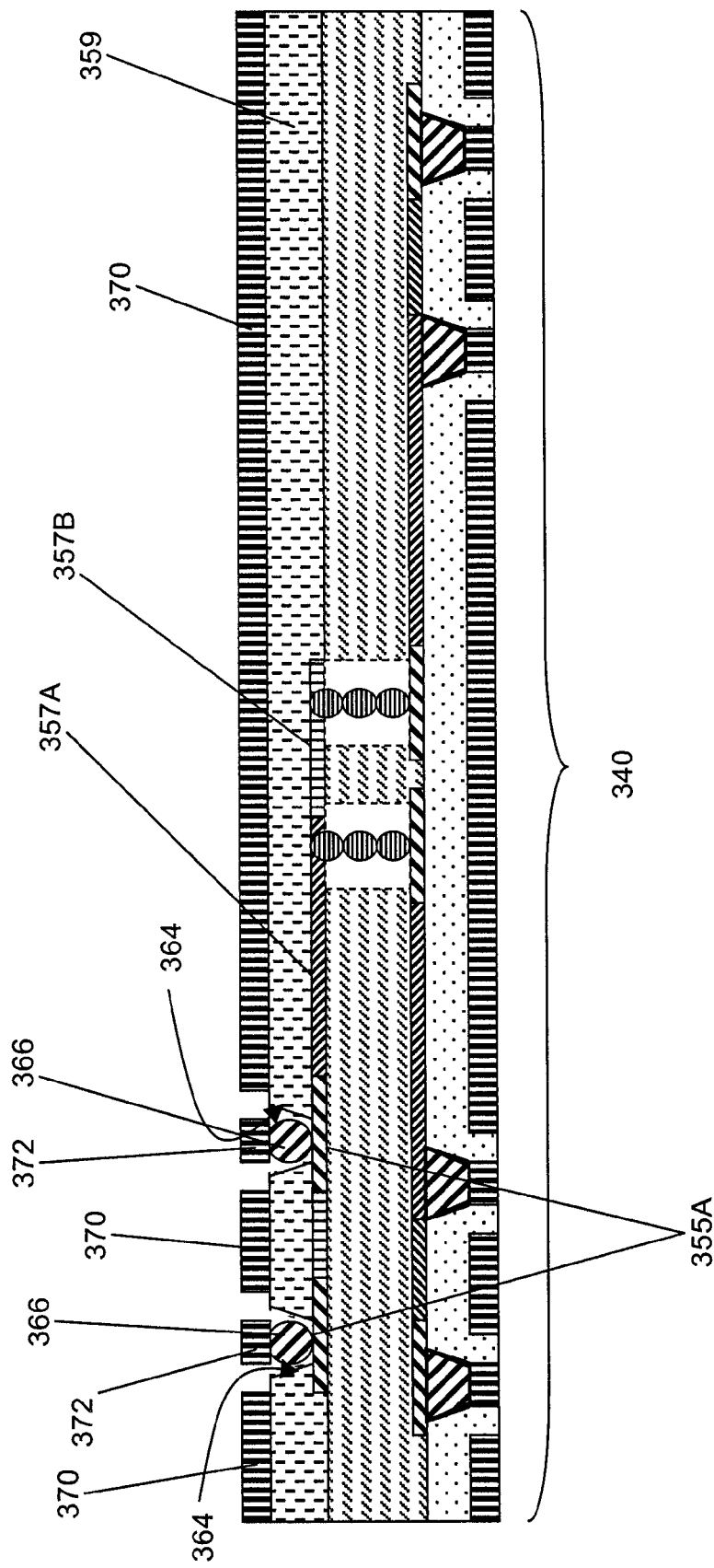
Figure 24:
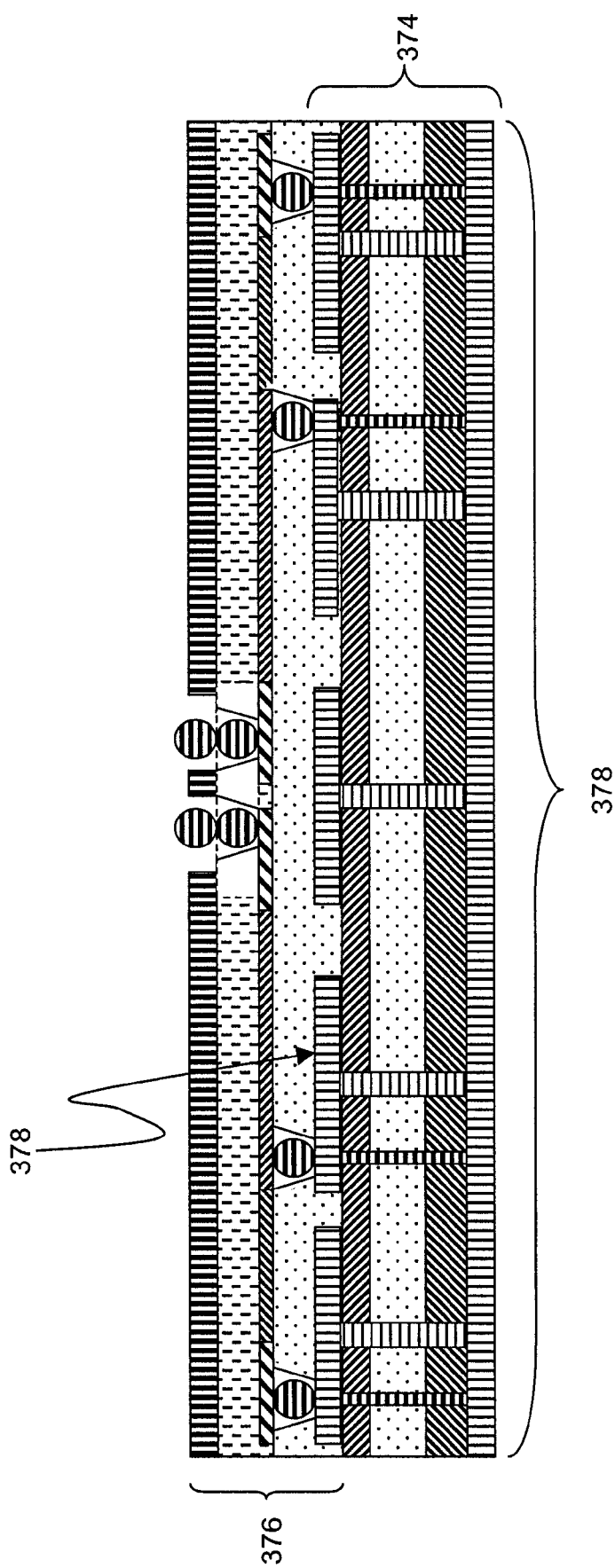
FIG. 24 is an illustration of an interconnect structure incorporating an AMC ground plane.

Reference is now made to FIGS. 2B-D & 23A-E, to illustrate an objective of the present invention that provides a wireless circuit module 115 comprising an antenna module 114, an interconnecting electrical interconnect structure 137, with contact pads 124 that are embedded in the surface of a base dielectric layer 120 to allow dielectric material 341 to be situated between metallization material used to form contact pad and ground plane structures, such that contact pads and ground planes do not protrude from surfaces of the interconnect structure or antenna module. It is a further objective of the invention that contact pads 124/328 have dimensions roughly equivalent to the size of the transmission lines to which they maintain electrical communication. FIGS. 23A-E, depict the methods used to construct an interconnecting electrical interconnect structure 342 as a separate body by depositing a base dielectric layer 343 on the surface of a peel-apart metal foil 345 that is affixed to a substrate tool 350 that provides thermal control and mechanical stability to the assembly constructed thereupon. Ground plane structures 347 and internal contact pads 349A used to connect the semiconductor die with electrical interconnect structure and external contact pads 349B used to connect the system to the electrical interconnect structure 342 are been patterned into the electroplated film of the peel-apart foil. The base dielectric may comprise amorphous silica, pure alumina, titantia, a tantalum oxide, and an admixture thereof, or it may comprise a meta-material dielectric that incorporates amorphous silica or an organic polymer as the host dielectric. To construct low impedance (2-5Ω) transmission lines using very narrow diameter wire, the base dielectric layer should comprise a thin layer of high-κ ceramic oxide (such as layer 173 as shown in FIG. 6). This base dielectric layer may also comprise a meta-material dielectric body that with the requisite effective permittivity, however, a base dielectric layer consisting of a high-κ ceramic with uniform dielectric properties is preferred. Holes 351A,351B are drilled into the base dielectric layer 343 to expose contact pads 349A,349B, to which conductive means, preferably studs, 353A,353B are attached. Conductive inks or pastes are applied to affix metallic termination pads 355A used to make vertical electrical contacts. Termination pads 355B may be optionally applied near the conductive means 353B to insure the quality of electrical communication with external connections 349B. Methods similar to those described above to place discrete wire conducting elements may be utilized in constructing discrete wire transmission lines 357A,357B, except that the capacitor pads described above that terminate the conducting wire would here would also comprise termination pads 355A, 355B that serve as transmission line termination points. It is preferred that the termination pads 355A,355B have roughly the same dimension as the transmission lines 357A,357B, and, optionally, the studs 353A,353B. As shown in FIG. 23B, it is also possible to use conventional trace structures 358A,358B fabricated from conductive inks or pastes, that may optionally including inductor coils, to electrically connect backfilled vias 352A,352B and termination pads 355A. The interconnecting interconnect structure is completed by depositing a second base dielectric layer 359 and, optionally, a patterned ground plane structure 361 using screen printing techniques over the embedded conductor structure. Wells 363A,363B may be drilled through the second base dielectric layer 359 to expose the termination pads 355A,355B. The vertical connection to the top surface of the interconnecting interconnect structure can be made by filling the wells 363A,363B with a conductive material, though it is preferable to deposit studs 365A,365B into the wells in order to minimize the physical dimension of the via structure. The interconnecting interconnect structure is completed by removing the carrier layer and stop layer of the peel-apart foil from the assembly, resulting in the structure shown in FIG. 23C. The assembly of an interconnecting interconnect structure that comprises an additional low loss dielectric layer 126 as shown in FIG. 2D is a straightforward extension from the base structure 354 assembled in FIGS. 23A&B. Making reference to FIGS. 23D&E, a low loss dielectric layer 356 from the group consisting of amorphous silica, pure alumina, titania, tantalum oxide and any admixture thereof, or a meta-material dielectric comprising an organic, amorphous silica, or pure alumina host dielectric, is applied to the base structure 354. It is a preferred embodiment to spray deposit regions of optically transparent amorphous silica 360A,360B in the vicinity of termination pads 355A used to make vertical interconnections so that automated optical imaging (AOI) techniques can be used to employ high precision laser drilling techniques to construct vias 362 filled with conductive means that may either be a metal plating, a stack of coined studs (as depicted in FIG. 23D), or backfilled conductive pastes or inks. The interconnecting electrical interconnect structure 340 is completed by applying transmission lines 357A/357B, optionally applying termination pads 355A to make additional vertical interconnections, and a second base dielectric layer 359. As shown in FIG. 23E, the interconnecting electrical interconnect structure 340 is completed by drilling holes 364 through the second base dielectric layer 359, inserting a conductive means 366, which may comprise a stud, plated metal, or backfilled conductive paste or ink, a top metallization layer 368 that is used to form ground plane regions 370 an contact pad regions 372, and separating the assembly structure from the sacrificial bodies 342 used as a thermal/mechanical substrate to support the build.

In certain instances, it desirable to eliminate inductive coupling and crosstalk, over specific frequency bands, between transmission lines assembled within the interconnecting electrical interconnect structure. Making reference to FIGS. 24&23A-E, the methods used to assemble an AMC ground plane described above (see FIG. 12A) are employed to construct a base AMC ground plane 374, upon which an interconnecting electrical interconnect structure 376 is assembled. Substituting the base AMC ground plane 374 for the sacrificial layers 342 described above provides a means to suppress surface modes that cause inductive coupling between adjacent components, such as transmission lines, situated upon the AMC surface 378. The base AMC ground plane thus remains integral to the body of the reduced-crosstalk interconnecting electrical interconnect structure 380.

Figure 25A:
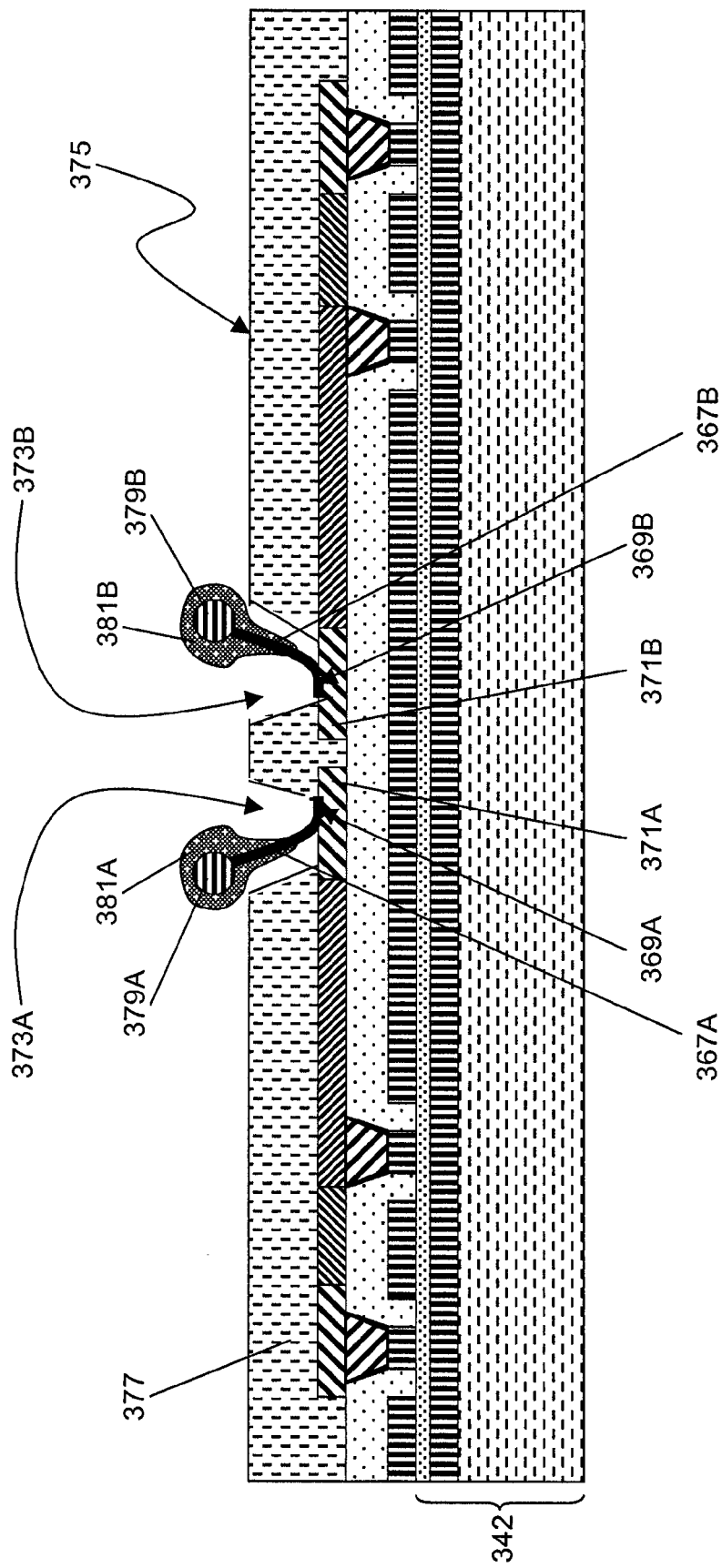
FIGS. 25A-25D are illustrations showing the construction of a low-loss interconnecting feed network as an independent body separate from the power amplifier (or other semiconductor) die and the antenna structure or other electrical component that is used to electrically connect and mechanically decouple said power amplifier (or other semiconductor) die to said antenna structure or other electrical component.
Figure 25B:
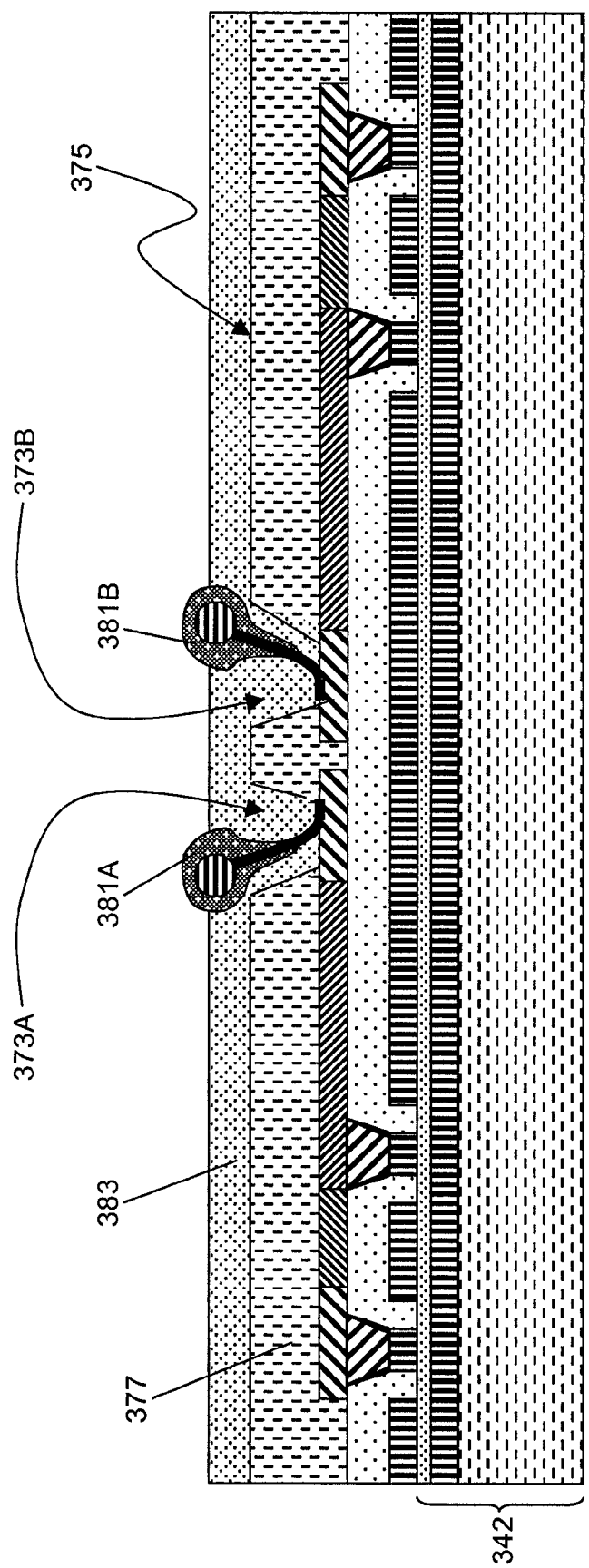
Figure 25C:
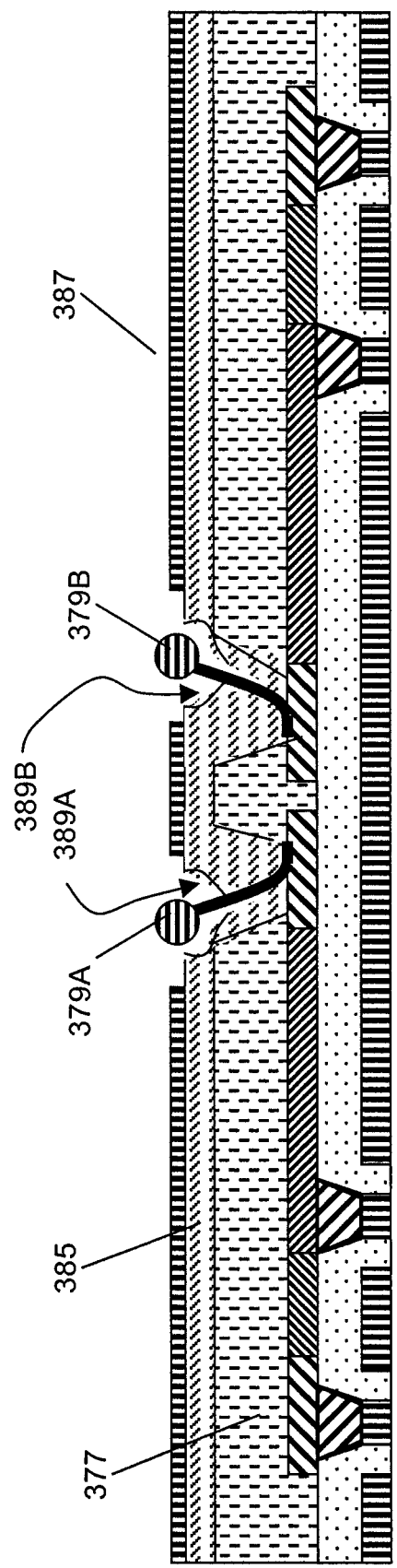
Figure 25D:
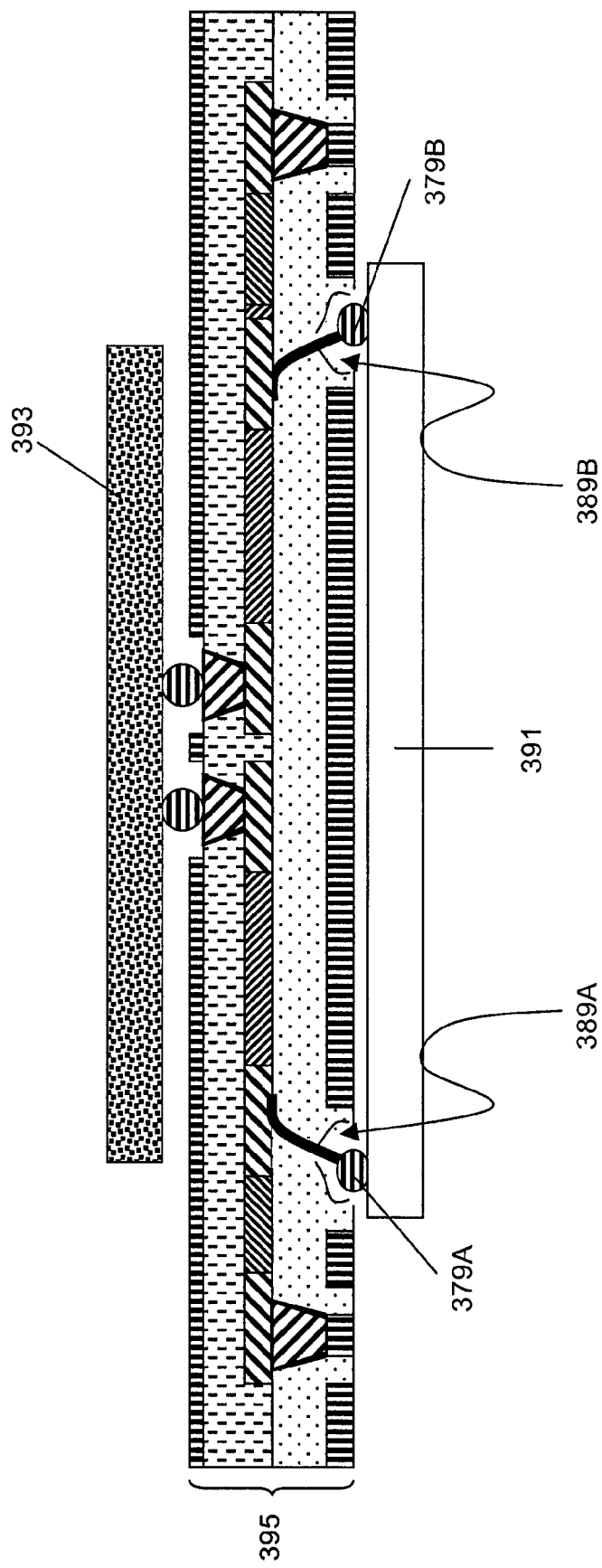

With reference to FIGS. 25A-D, wire bonding methods may be employed to produce an interconnecting interconnect structure that electrically connects but mechanically decouples the PA (or other semiconductor) die from the antenna (or other) circuit. Wires 367A,367B may be attached by means of stitch bonds 369A,369B to terminating pads 371A,371B at the bottom of wells 373A,373B and controlled lengths of wire may be spooled so as to protrude from the top surface 375 of the second base dielectric layer 377. Balls 379A,379B may be formed at the end of the wire(s) using flame-off techniques. The wire structures depicted are sometimes referred to as "inverted ball bonds" or "teed golf balls." The ball and wire of the inverted ball bonds are then wick-coated with organic material coatings 381A,381B of a type known to those skilled in the art as an addition polymer, which have the property of remaining intact until it is heated to a pyrolytic temperature, at which point the addition polymer decomposes cleanly, leaving no measurable residue on the coated surface. The interconnecting interconnect structure is completed by applying a liquid coating 383 of metalorganic precursors to a ceramic oxide to the top surface 375 of second base dielectric layer 377 in sufficient quantities to fill the wells 373A,373B and to produce a liquid coating that rises to at least 25% of the height of the ball in the inverted ball bond. (See FIG. 25B,C). The addition polymer coatings 381A,381B are selected to have a pyrolytic temperature that exceeds 250° C., in order to permit thermal decomposition of the liquid metalorganic precursor coating 383 into a solid ceramic oxide layer 385 (as shown in FIG. 25C). A ground plane metallization layer 387 is selectively applied. The addition polymer coatings 381A,381B are subsequently removed from the inverted ball bonds by heating the structure to a temperature above 250° C., thereby exposing balls 379A, 379B which are disposed within mechanically protective wells 389A,389B, and the interconnecting electrical interconnect structure is separated from the sacrificial layers 342. This interconnect structure configuration solves a significant mechanical problem experienced in RF circuits. Frequently, PA (or other semiconductor) die generate a great deal of heat (>10 W). Silicon-based die have low coefficients of thermal expansion (CTE=2.6×10$^{-6\circ}$ C.$^{-1}$). Considerable shear stress is induced in RF amplifier die when they are coupled to conventional tape cast interconnecting interconnect structures, which typically have coefficients of thermal expansion on the order of CTE=8-10×10$^{-6\circ}$ C.$^{-1}$. Therefore, the heat generating amplifier (or other semiconductor) die may be coupled to an interconnecting interconnect structure formed from amorphous silica (CTE≈1×10$^{-6\circ}$ C.$^{-1}$). However, as illustrated in FIG. 25D, in instances where it is necessary to electrically connect a PA (or other semiconductor) die 391 to circuit element 393 with which there is a strong CTE mismatch between the semiconductor die 391 and the other circuit element 393, but there is a good CTE match between the circuit element 393 and the interposing connector, an interconnecting electrical interconnect structure 395 may be included that contains inverted ball bonds 379A,379B that provide a mechanically decoupled electrical connection between the CTE-mismatched elements, as the inverted ball bonds can mechanically flex within the wells 389A,389B that remain after the decomposition of said addition polymer organic material.

Figure 26:
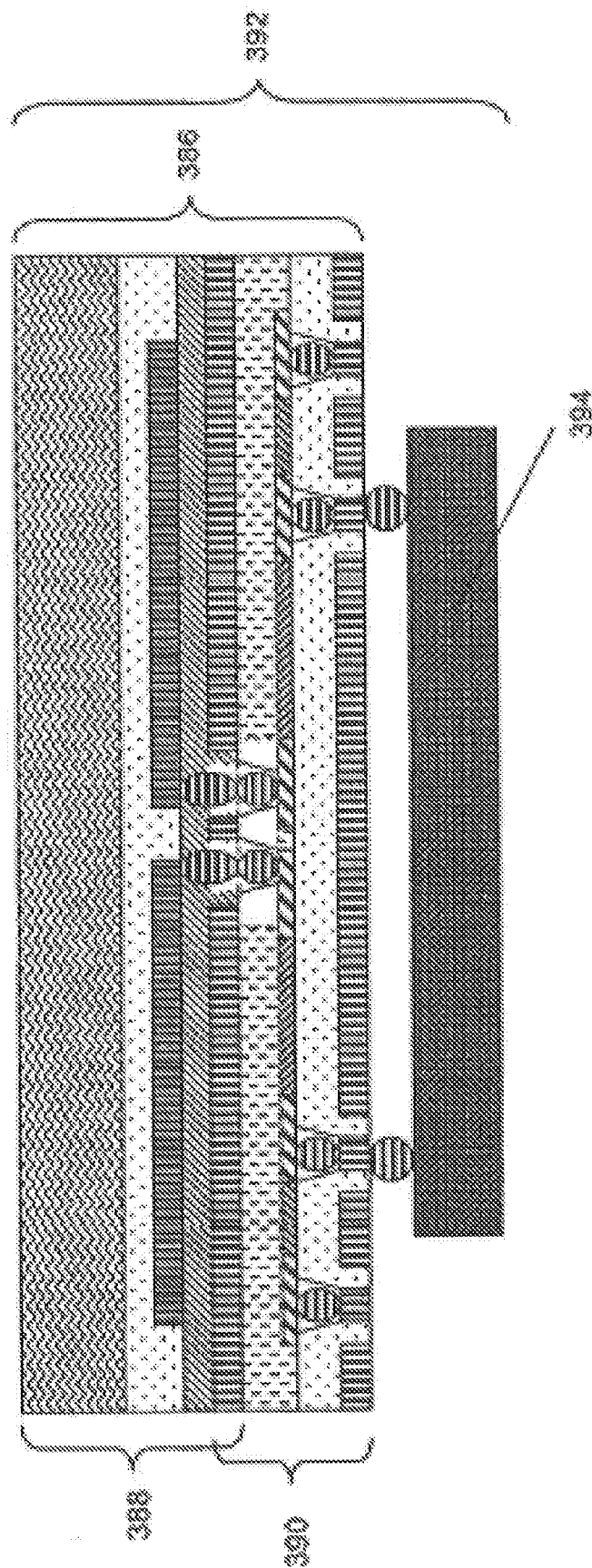
FIG. 26 is an illustration showing the use of an interconnecting feed network integrated within an antenna module that electrically connects to a power amplifier (or other semiconductor) die or other electrical component.

FIG. 26 depicts an alternative embodiment to the wireless circuit module 115 in which the methods described in the present invention to assemble an antenna module (see FIGS. 5A-J, FIGS. 12A-E, and FIGS. 6A-C) and those methods described to form an interconnecting electrical interconnect structure (see FIGS. 23A&E and FIG. 24) are consolidated to fabricate an antenna module 386 that comprises an elemental ceramic antenna portion 388 and an interconnecting electrical interconnect structure 390 integral to the module's body. In this embodiment, the wireless circuit module 392 consists of one (or more) semiconductor die 394 in electrical communication with the antenna module 386.

Figure 27A:
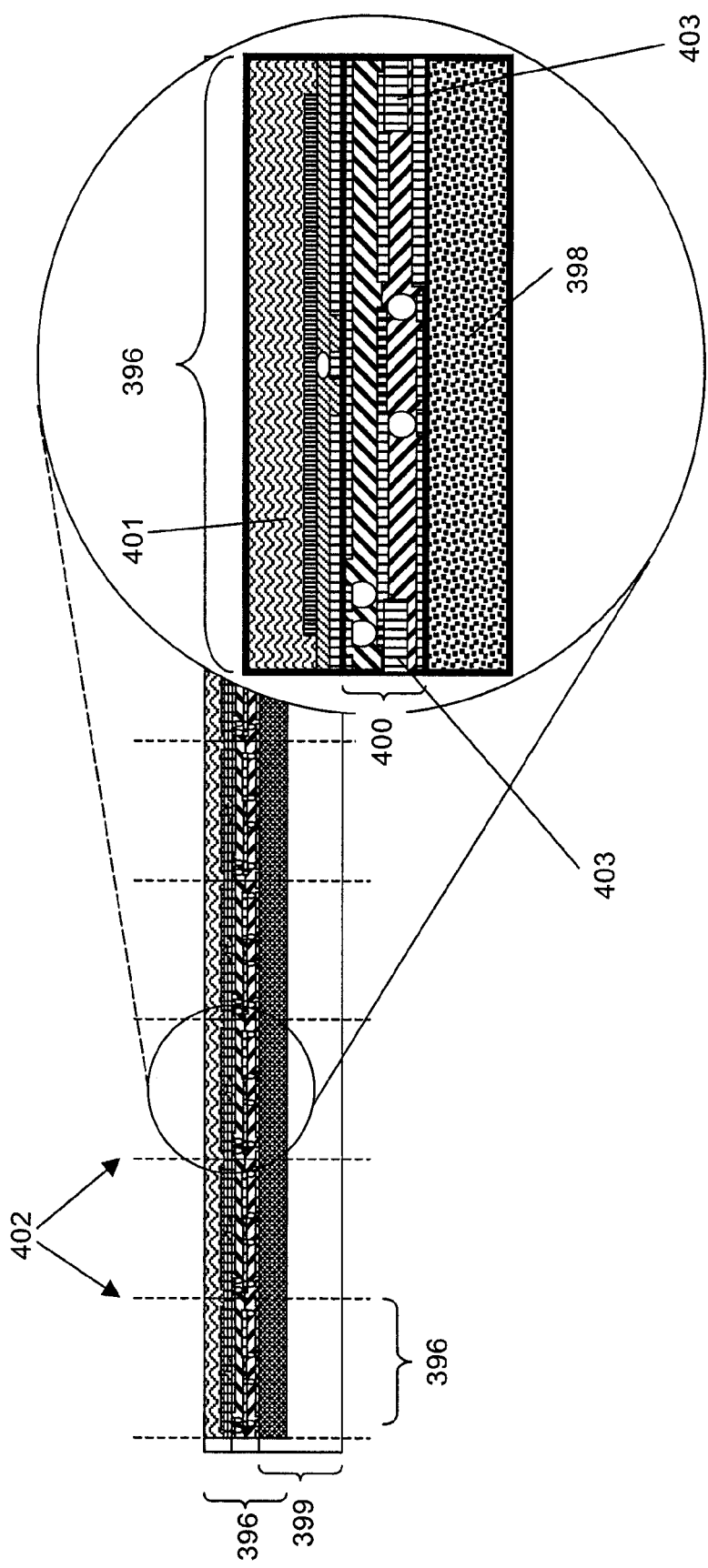
FIG. 27A,B are illustrations of an interconnecting feed network and antenna structure that is assembled directly on the surface of the power amplifier (or other semiconductor) die.
Figure 27B:
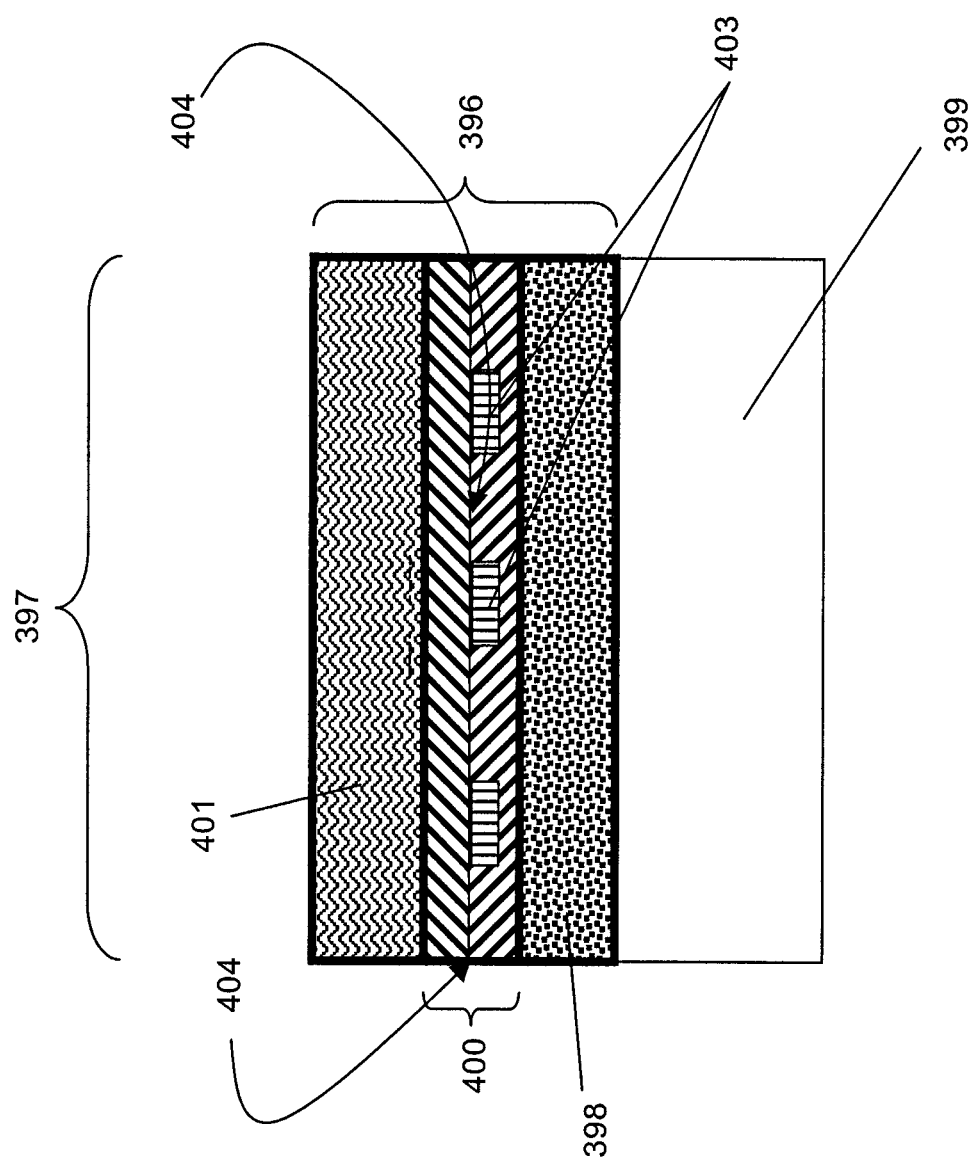

Reference is now made to FIGS. 27A&B, which depicts a wireless circuit module 396 that, by virtue of the low deposition temperatures (<450° C.) of ceramics formed with aerosol sprays, is monolithically integrated at the wafer scale onto a singulated semiconductor die 397. The wireless circuit comprises an integrated circuit 398 embedded into the semiconductor wafer 399, an electrical interconnect structure 400, and an antenna module 401. Circuit cells defined by reference lines 402 are defined to identify the physical boundaries of an individual integrated circuit 398 and mark where the semiconductor wafer 399 will be scribed to form singulated die 397. The electrical interconnect structure 400 and antenna module 401 portions wireless circuit module 396 are constructed on top of each integrated circuit 398 using the methods described above prior to scribing the wafer semiconductor 399, into singulated die 397. To provide for a direct off-chip electrical connection to the wireless circuit module 396, conductive means 403 that penetrates the reference lines 402 may be optionally embedded into the electrical interconnect structure 400 prior to die singulation so that said conductive means 403 remains exposed on a surface 404 of the singulated die. The low process temperatures enabled by the invention provides a means to prepare the fully integrated structure without substantially altering delicate dopant or materials structures that are implanted, diffused, or deposited in or on the semiconductor material. Fully integrated structures may be assembled on silicon-based wafers (MOS or CMOS), silicon-germanium semiconductors, III-V compound semiconductors, and II-VI compound semiconductors, as well as carbon-based semiconductors.

Figure 28:
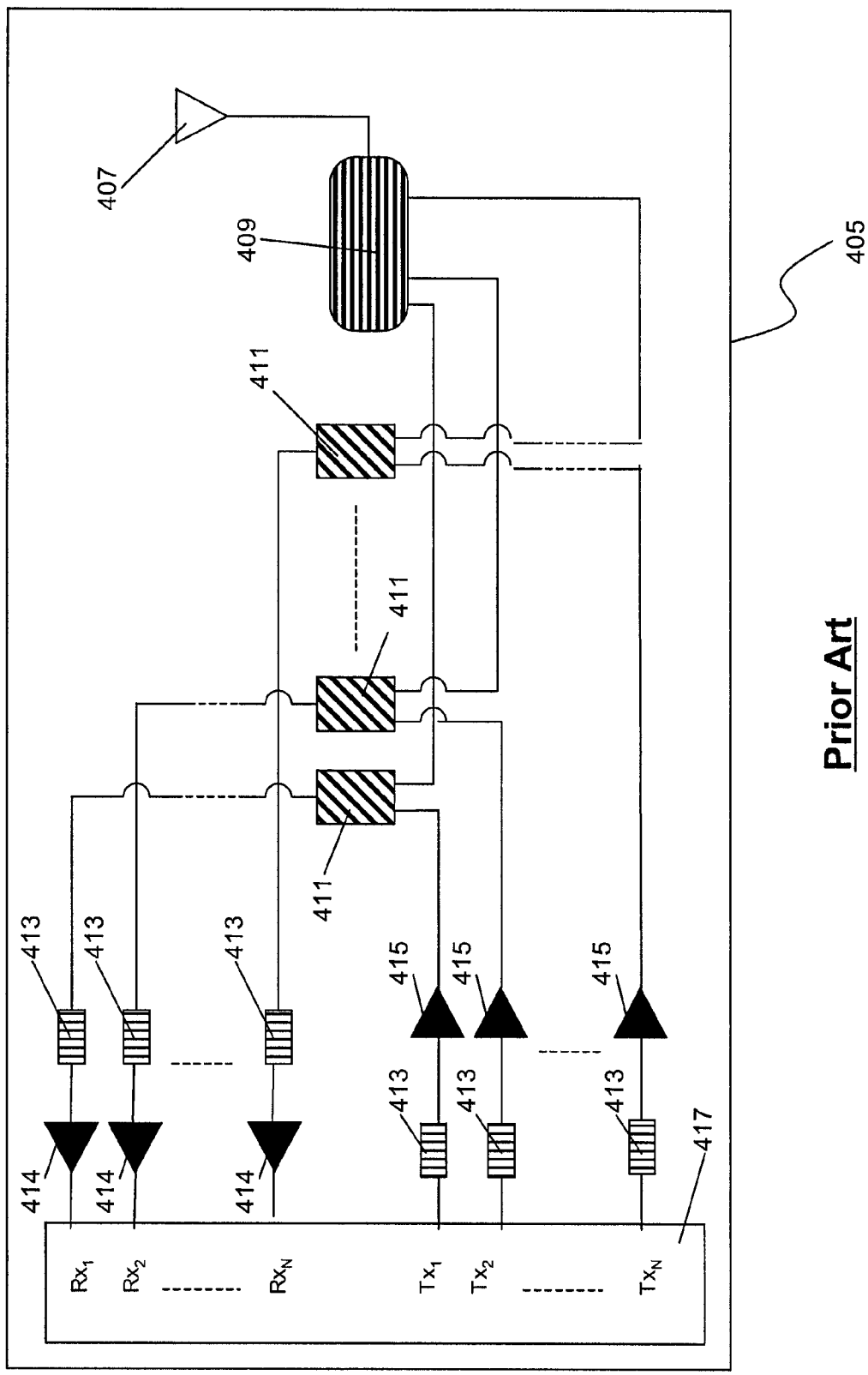
FIG. 28 is an illustration of a multiple frequency RF Front-End architecture representative of the prior art that incorporates a network of filters and switches to isolate and manage signal communications at specific frequencies of interest.

Many wireless systems will transmit and receive data over multiple frequency bands. For instance, modern cellular phones designed to operate in North America will typically, but not necessarily, manage some voice communications at the AMPS band, centered at 860 MHz, manage other voice and data communications at the PCS band, 1850-1930 MHz. Some cell phones will additionally provide global communications services at the GSM bands, GSM-400, GSM-800 and GSM-1800, located in the 400, MHz, 800 MHz, and 1800 MHz frequency bands, respectively. Other cell phones may provide some or all of the above communications protocols along with wireless internet access through 802.11a,b,g (2400 MHz and 5000 MHz) or global positioning systems at 2200 MHz). A given frequency band is often divided into transmit (Tx) and receive (Rx) bands, with AMPS Tx-mode operating between 824-849 MHz and its Rx-mode operating between 869-894 MHz. Conventional antenna assemblies have bandwidths that overlap two or more of these communications bands, thereby requiring extensive filtering and switching functions to be engineered into the RF front-end adding cost and complexity to the original equipment manufacturer (OEM). FIG. 28 is a representative description of an electrical block diagram that is roughly consistent with the prior art used in multi-band RF front-end that may typically be found in a cell phone or other wireless device assembly. Such antenna assemblies 405 will often include, among other components that are not specified in the figure, an antenna 407, a filtering stage 409 that includes one or more diplexers (among other components) to separate frequencies of interest from those received by the antenna, switches 411 that toggle the signal path from transmit to receive modes, impedance matching networks signal isolators 413, low noise amplifiers 414 (in the receive-side channel) and power amplifiers 415 (in the transmit-side channel) that are electrically connected to a signal processing unit and/or transceiver controls 417. The full complexity and cost of such circuitry grows as additional communications frequencies and services are added to the assemblies.

Figure 29A:
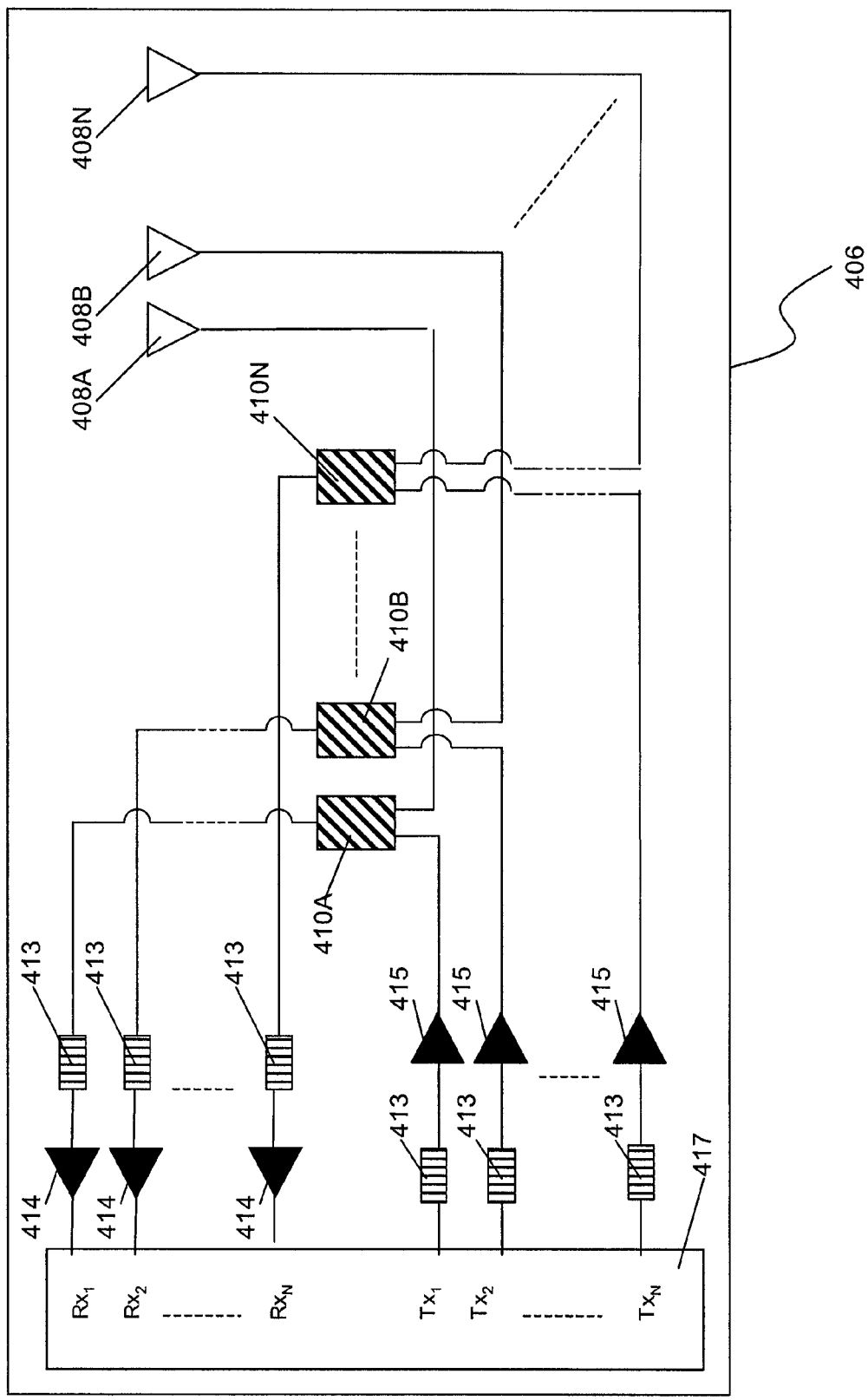
FIGS. 29A-C are illustrations of the use frequency-selective antenna modules used to eliminate the need for diplexers from a multiple frequency RF Front-End architecture.
Figure 29C:
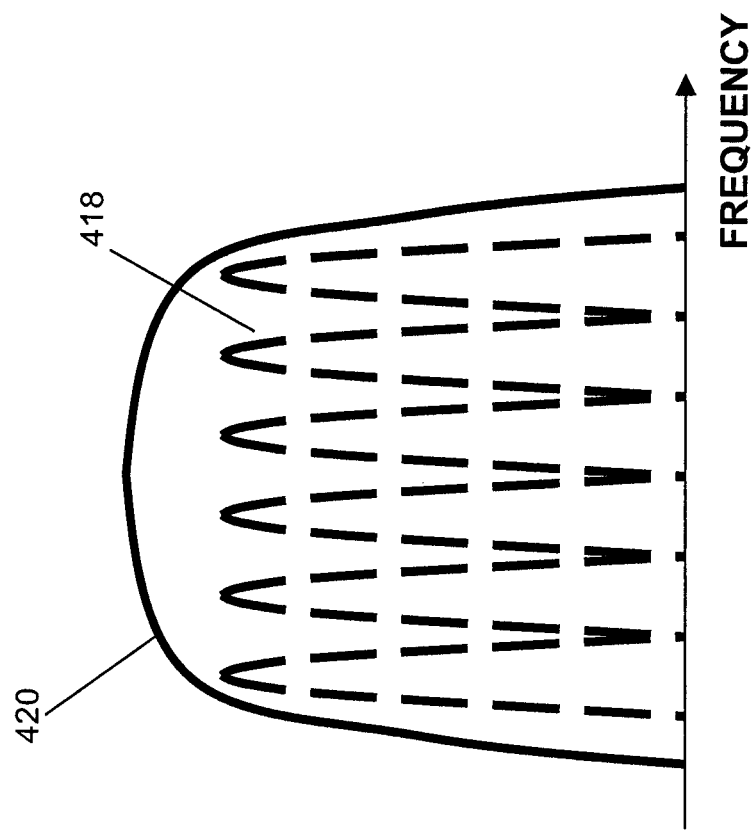
Figure 29B:
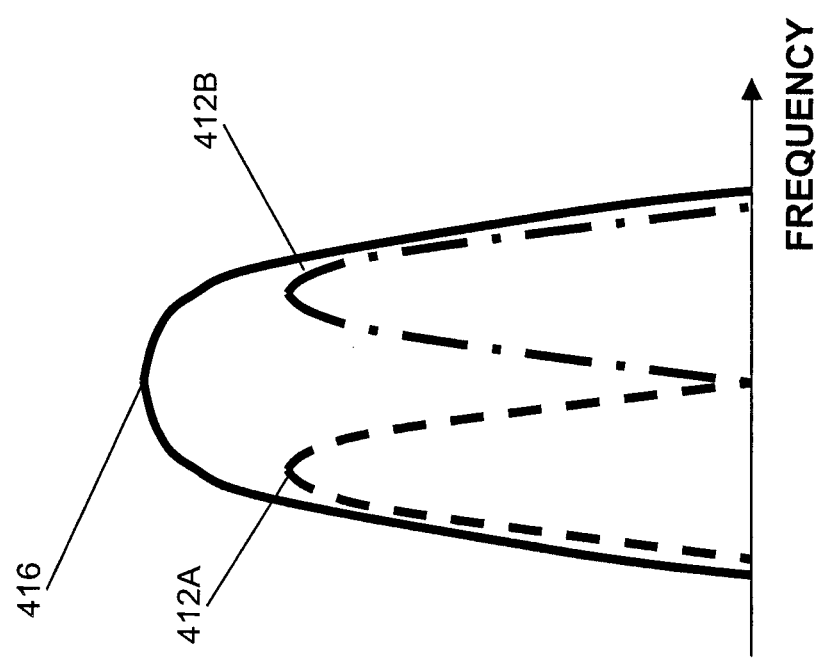
Figure 30:
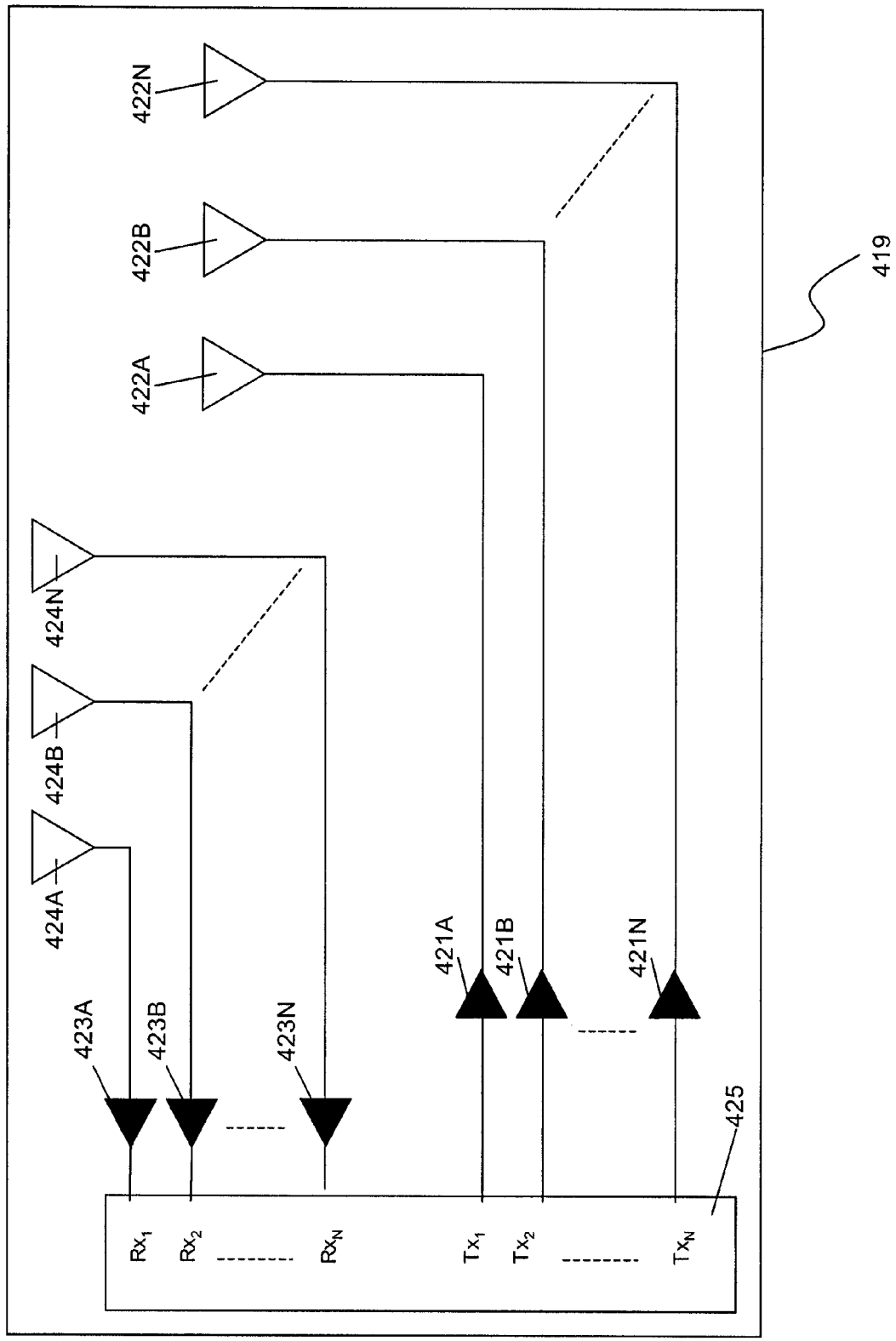
FIG. 30 is an illustration of a multiple-frequency RF Front-End architecture that uses frequency-selective antennas to reduce the receive-side and the transmit-side each to a single amplifier connected to an array of frequency-selective antennas each having its bandwidth tuned to a specific frequency of interest.
Figure 31:
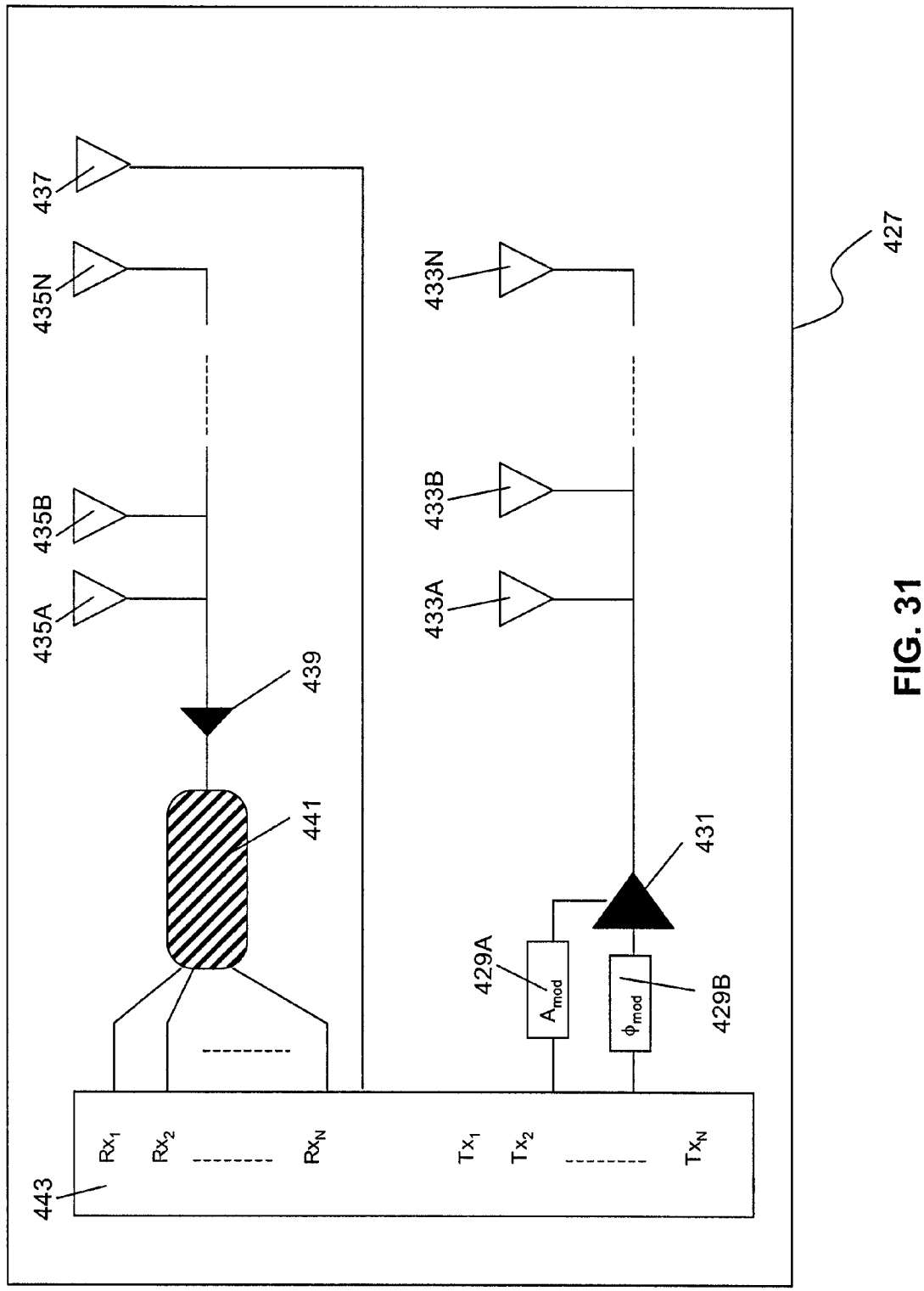
FIG. 31 is an illustration of a multiple-frequency RF Front-End architecture that uses frequency-selective antennas to reduce the receive-side and the transmit-side each to a single amplifier connected to an array of frequency-selective antennas each having its bandwidth tuned to a specific frequency of interest.

Prior art RF front-end assemblies can often occupy a sizeable footprint and include large part counts that impose conversion costs. They can also introduce signal loss that consumes appreciable power. For instance, SAW filters, which are commonly used to switch the radio function from Tx-mode to Rx-mode within a specific band, will typically impose 3 dB of power loss. All of these attributes to conventionally engineered front-ends are undesirable when engineering mobile platforms like cellular phones. Therefore, methods that reduce the size and conversion costs and power consumption and provide equivalent functions as a conventional RF front-end are desirable in mobile platform applications. In particular, methods that eliminate the need for a SAW filter in the RF front-end extend the allotted power budget by 50% (3 dB). Three non-limiting approaches are now described to furnish an RF front-end module providing reduced component count, form factor, or power loss enabled by the incorporation of at least one frequency-selective antenna tuned to operate narrowly within a specific communications frequency band. FIG. 29A depicts the first such embodiment, wherein a multi-band RF front-end module 406 eliminates the need for a filter stage 409 that isolates different communications bands of interest through the use of individual frequency-specific antennas 408A, 408B, . . . , 408N tuned to each of the communications bands desired by the module's operational design. The individual frequency-specific antennas 408A, 408B, . . . , 408N in turn feed switches 410A, 410B, . . . , 410N that, (making reference to FIGS. 29B,C), may optionally switch between the transmit 412A and receive 412B channels of, for instance, a cellular or Bluetooth communications band 416, or to a single low-noise channel 418 that is used for both send and receive as is the case in 802.11 (or similar) wireless communications band 420. The multi-band RF front-end module 406 may optionally include impedance-matching networks 413, if necessary, as well as low-noise power amplifiers 414A, 414B, . . . , 414N on the receive-side, power amplifiers 415A, 415B, . . . , 415N, on the transmit side, and (optionally) transceiver/signal processing die 417. FIG. 30 depicts an alternative RF front-end module 419 configuration that exploits the impedance matching and high-Q antenna characteristics enabled by the invention wherein individual frequency-selective antennas are tuned to specific transmit or receive frequencies, thereby eliminating the need for filtering stages, isolators, and switching banks. This embodiment includes a bank of power amplifiers 421A, 421B, . . . , 421N in direct electrical communication with a frequency-selective antenna 422A, 422B, . . . , 422N that has a bandwidth tuned to each transmit frequency, a bank of low-noise amplifiers 423A, 423B, . . . , 423N in direct electrical communication with a frequency-selective antenna 424A, 424B, . . . , 424N that has a bandwidth tuned to each receive frequency, and, optionally, a signal processing/transceiver chipset 425, An alternative, lower-complexity architecture for a multiple-frequency RF Front End 427 useful in software radio applications is shown in FIG. 31. In this instance, voltage-controlled oscillators 429A,B are used to modulate the amplitude and phase inputs of a single power amplifier 431 on the transmit-side, synthesizing modulated signals at the frequencies of interest for signal transmission, $f_{T1}$, $f_{T2}, \ldots, f_{TN}$. The signal output of power amplifier 431 is in direct electrical contact to an array of frequency-selective antennas 433A, 433B, . . . , 433N, wherein each one of the frequency-selective antennas in the array is tuned to have a narrow-band resonance at one of the frequencies of interest for signal transmission, $f_{T1}$, $f_{T2}$, . . . , $f_{TN}$. A similar configuration can be implemented on the receive-side, which comprises an array of frequency-selective antennas 435A, 435B, . . . , 435N, wherein each one of said frequency-selective antennas is tuned to have narrow-band resonance at one of the frequencies of interest for signal reception, $f_{R1}, f_{R2}, \ldots, f_{RN}$, and may include an additional frequency-selective antenna 437 that is tuned to resonate at a frequency of interest for global positioning systems (GPS), $f_{RGPS}$=2.5 GHz. The receiver array is separately configured to be in direct electrical connection with a low-noise amplifier 439 and to be electrically isolated from the transmit-side of the wireless device. The output of the low-noise amplifier 439 may optionally be directed through a signal mixing or filtering stage 441 to separate the individual frequencies of interest for signal reception, $f_{R1}, f_{R2}, \ldots, f_{RN}$, and $f_{RGPS}$, before directing them to the central processing unit 443.

At present, the need to use acoustic wave filters in cellular phones to switch between the transmit ("talk" or "send" mode) and the receive ("listen" mode) limits signal transmissions between the mobile platform and broadcast tower to only one direction at a given moment in time. The mobile platform is either in its listen mode or its talk mode. This communications protocol applies to analog voice as well as digital voice and data streams, and is commonly known as half-duplex mode, Telecommunications service providers are finding increasing demand for content to be delivered to the mobile terminal. The limitations imposed by half-duplex mode communications restricts the quality of advanced content services, such as bidirectional audio visual streaming deliverable to both ends of the communications link. As a result, video phone telecommunications often appear to be choppy or staggered. The ability to implement RF front-end architectures such as depicted in FIGS. 30 and 31 enables simultaneous full-duplex communications at multiple frequencies without the need for extensive signal processing and embedded software, as high-Q frequency selective antennas may be configured to launch voice/data communications narrowly over the transmit frequency channel without interfering with voice/data communications captured by the receive frequency channel. Thus, RF front-end architectures as described herein will be extremely useful in wireless communication device services, such as, for example, full duplex analog or digital voice/data streams or bidirectional audio video streaming over one or multiple simultaneously operating wireless communications frequency bands, which is a specific need for WCDMA and/or WEDGE 3G telecommunications protocols.

Figure 32:
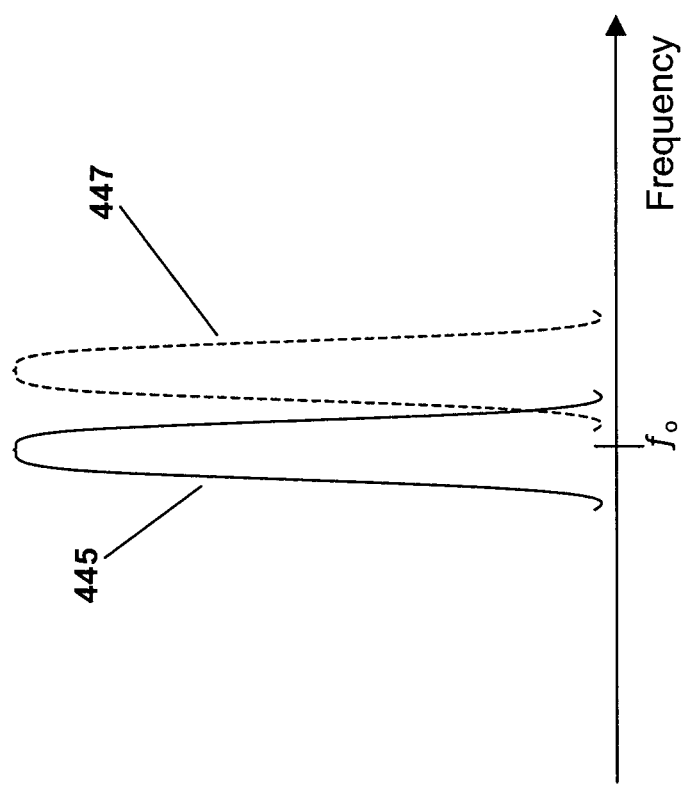
FIG. 32 is a plot depicting undesirable shifts in the center frequency, $f_o$, of a high-Q antenna that may result from changes in the ambient operating temperature.

A fundamental problem in the practical application of high-Q circuits is the need to maintain parametric stability. The precise value of the relative permittivity, $\in_R$, of high-κ dielectric body into which the antenna is embedded has a very strong effect on the frequency tuning of the antenna element. The center frequency $f_o$ of a dipole antenna element of length l varies roughly as:

$$f_o \propto c \times 1/(2\sqrt{\in_R}), \tag{6}$$

where c is the speed of light. For instance, if the medium into which the antenna element is embedded has an effective relative permittivity of $\in_R$=100, than a 10% change in the effective relative permittivity to $\in_R$=110 or 90, will cause $f_o$ to shift by approximately 20%. A 1% change in the relative permittivity to $\in_R$=101 or 99 will cause $f_o$ to shift by approximately 0.5%. Because the pass band is so narrow (1% or less), any fluctuations in manufacturing tolerances or thermal induced changes that would cause the value of the effective relative permittivity ER to change by 1% or more are undesirable because they would cause the antenna's desired pass band tuning 445 to shift out of the desired pass band 447 as shown in FIG. 32.

Three fundamental parameters will cause changes to the value of the effective relative permittivity $\in_R$ of a dielectric meta-material into which an antenna element might be embedded. First is the fractional volume of high-κ material incorporated into the meta-material dielectric. The present invention utilizes deposition techniques that control the fractional volume of high-κ materials to volumetric tolerances within ±0.1%. Ink-jet spray methods may be used that have the ability to control the location and sprayed volume of dielectric inclusions very precisely. Laser trimming techniques may also be applied to ink-jetted dielectric inclusions to ensure volumetric tolerances are held within ±0.1%, preferably ±0.05%.

The second parameter relates to compositional uniformity of the high-κ materials incorporated into the dielectric meta-material. High-κ materials that contain a single metal oxide component and a single valence state, such as tantalum pentoxide ($Ta_2O_5$), zirconia (ZrO), or hafnia (HfO), are preferred because they will exhibit no significant composition-dependent fluctuations in relative permittivity, $\in_R$, if metals purity levels to the precursors are held to values better than 99.99%, or, preferred values of 99.999%. Other single component high-κ materials known to have multiple valence states, such as, niobia (NbO, $NbO_2$, $Nb_2O_5$), or titania, (TiO, $Ti_2O_3$, $TiO_2$), are also preferred needs because they will exhibit no significant composition-depended fluctuations in relative permittivity, $\in_R$, when redox processing conditions are sufficient to maintain uniform valence throughout the ink-jetted deposit(s) and metals purity levels to the precursors are held to values better than 99.99%, or, preferred values of 99.999%. The comparatively low relative permittivity of single component high-κ materials, typical $\epsilon_R \leq 90$, requires relatively high volumetric fractions of these materials to be used to achieve meta-material dielectrics having modest effective relative permittivity, which is not optimal for many designs. Therefore, the use of multi-component high-Kr dielectric materials that have substantial relative permittivity, $\epsilon_R \geq 200$ is preferred in many instances. Multi-component high-κ dielectric materials would include, but are not limited to, barium-strontium titanate (BST) ceramic, with compositions spanning ($Ba_xSr_{1-x}TiO_3$), barium-strontium zirconate-titanate (BSZT) ceramic, with compositions spanning ($Ba_xSr_{1-x}Zr_yT_{1-y}O_3$), or lead-lanthanum zirconate-titanate (PLZT), with compositions spanning ($Pb_xLa_{1-x}Zr_yT_{1-y}O_3$). A significant drawback to using these ceramic compositions is that they are susceptible to strong fluctuations in compositional uniformity that can have dramatic effects on relative permittivity at both the microscopic and macroscopic domain. This is especially true for powder processed ceramics. Liquid aerosol spray techniques, however, allow an unlimited number of precursors to be chemically mixed at the molecular level in solution. This degree of chemical uniformity in the distribution of various precursors throughout the metalorganic solution is replicated in the spray-pyrolyzed deposit, enabling chemical composition of extremely high complexity to be deposited with an, as yet, undeterminable high degree of chemical uniformity.

Figure 33:
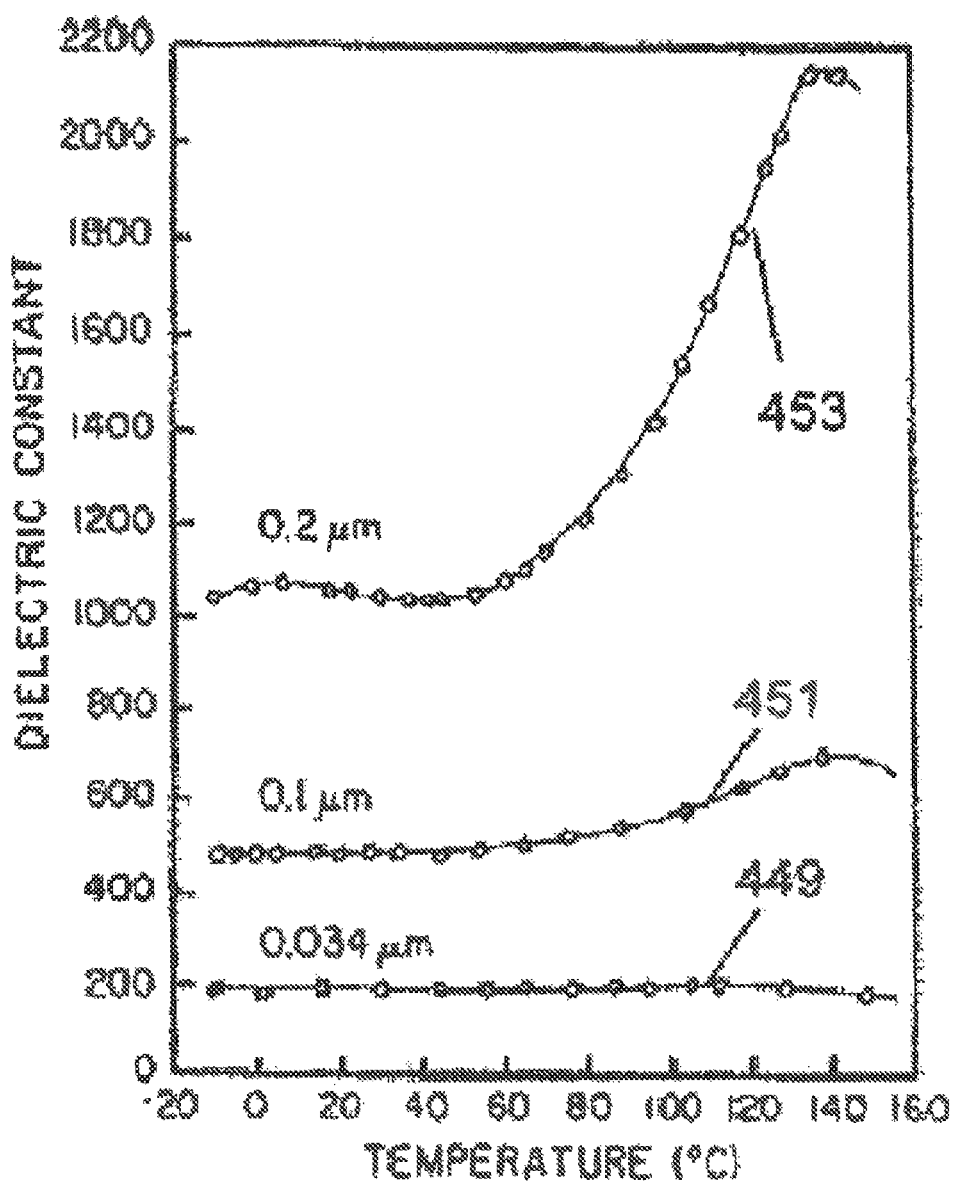
FIG. 33 is a chart showing dielectric response versus ambient temperature in BST ceramic as a function of the size of the grains comprising the BST ceramic.

The third parameter that impacts the temperature (and frequency) stability of the high-Q antenna structures disclosed under the present invention relates to the temperature dependence of the materials incorporated into the meta-material dielectric. To be useful in cellular handsets, it is necessary for the antenna module to hold its center frequency at operating temperatures ranging from −40° C. to 85° C. To achieve this performance standard, the materials used to construct the meta-material dielectric should have a thermal dependence in their dielectric constants that varies less $2 \times 10^{-4\circ}$ C. to achieve a ±1% variation in the relative permittivity at the temperature extremes, if the meta-material has an effective dielectric constant $\epsilon_R = 100$ at room temperature (20° C.). This is particularly the case for the high-κ materials. Thermal dependence in the expansion coefficient and dielectric constant of amorphous silica is within this tolerance over the prescribed temperature range, which makes it an ideal host for the meta-material dielectric body. High-κ ceramics, particularly the multi-component compositions, are more problematic and highlight the need for liquid aerosol spray deposition techniques. FIG. 32 [from Vest, Ferroelectrics, 102, 53-68 (1990)] correlates the thermal dependence in the relative permittivity in BST ceramic prepared from liquid metalorganic precursors. Immediately following metalorganic decomposition high-κ ceramic prepared from liquid precursors has an amorphous structure with no crystallographic structure. Crystalline quality evolves with subsequent heat treatment. A very short sintering cycle [≤10 minutes at 900° C.] produces ceramic with a very fine grain sizes (≅0.035 micron, 35 nm), see lowest curve 449 in FIG. 33. This small grain size causes the relative permittivity to be suppressed, $\epsilon_R = 200$, as opposed to the more typical value of $\epsilon_R \cong 400$, which is found when a longer cycle [20 min at 900° C.] evolves ceramic with moderate grain size (≅0.10 micron, 100 nm). (See middle curve 451 in FIG. 33). Increasing the ceramic crystalline structure with longer heat treatment [30 min at 900°] produces even larger grain size (≅0.20 micron, 200 nm), and higher values of relative permittivity, $\epsilon_R \cong 1000$. (See upper curve 453 in FIG. 33). However, larger grain size also produces a thermal dependence in the relative permittivity that is incompatible with stable dielectric response versus temperature needed to make a high-Q antenna that is effective over the −40° C. to 85° C. temperature range. In a preferred embodiment, a high-κ ceramic inclusions that have a maximum nominal grain size ≤0.050 micron (50 nm) may be employed to obtain a composite dielectric body whose effective permittivity changes as a function of temperature ≤$5 \times 10^{-2\circ}$ C.$^{-1}$. In another preferred embodiment, inclusions having a maximum nominal grain size ≤0.035 micron (35 nm) can be incorporated into the composite meta-material dielectric body, so as to obtain a composite dielectric body whose effective permittivity changes as a function of temperature ≤$9 \times 10^{-3\circ}$ C.$^{-1}$. The smallest grain sizes used in powder-based aerosol sprays are on the order of 50 micron, therefore it is a preferred method of the present invention to use liquid aerosol sprays to achieve greater control over the high-κ ceramic microstructure, most importantly grain size. The use of rapid thermal annealing techniques using laser, infrared light, or ultraviolet light sources provides greater control over the energy delivered to the ceramic during the grain growth step.

Figure 34:
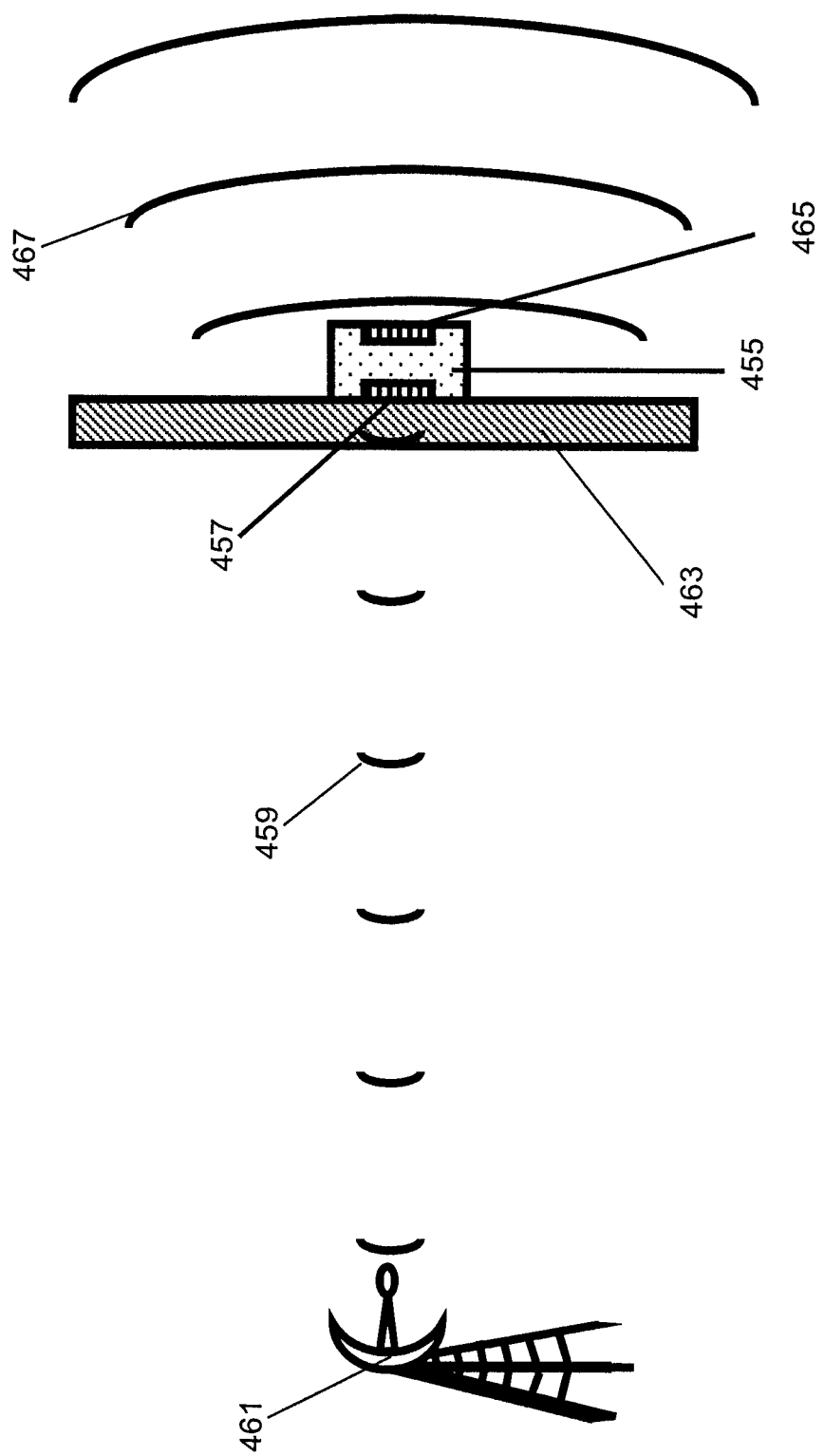
FIG. 34 is an illustration depicting antenna structures used in a small form-factor CPE radio used to rebroadcast an operator's transmission within the customer's premesis.
Figure 35A:
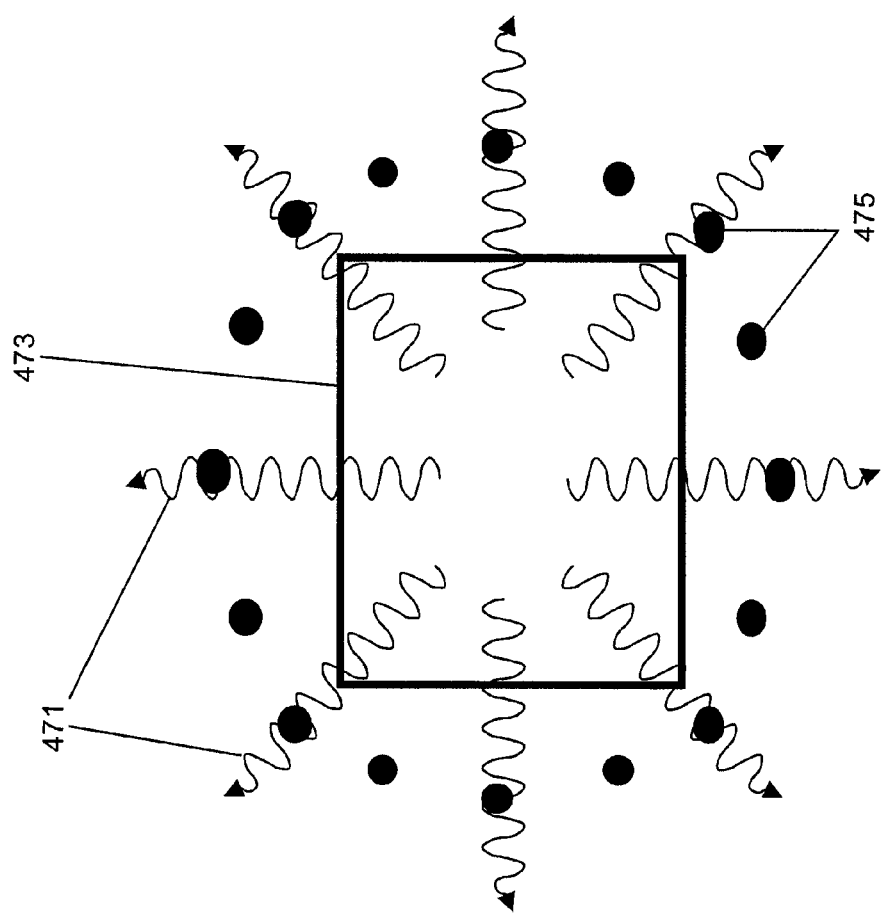
FIGS. 35A-B are illustrations depicting the use of antenna modules to suppress wireless network security intrusions from threats beyond a security perimeter.
Figure 35B:
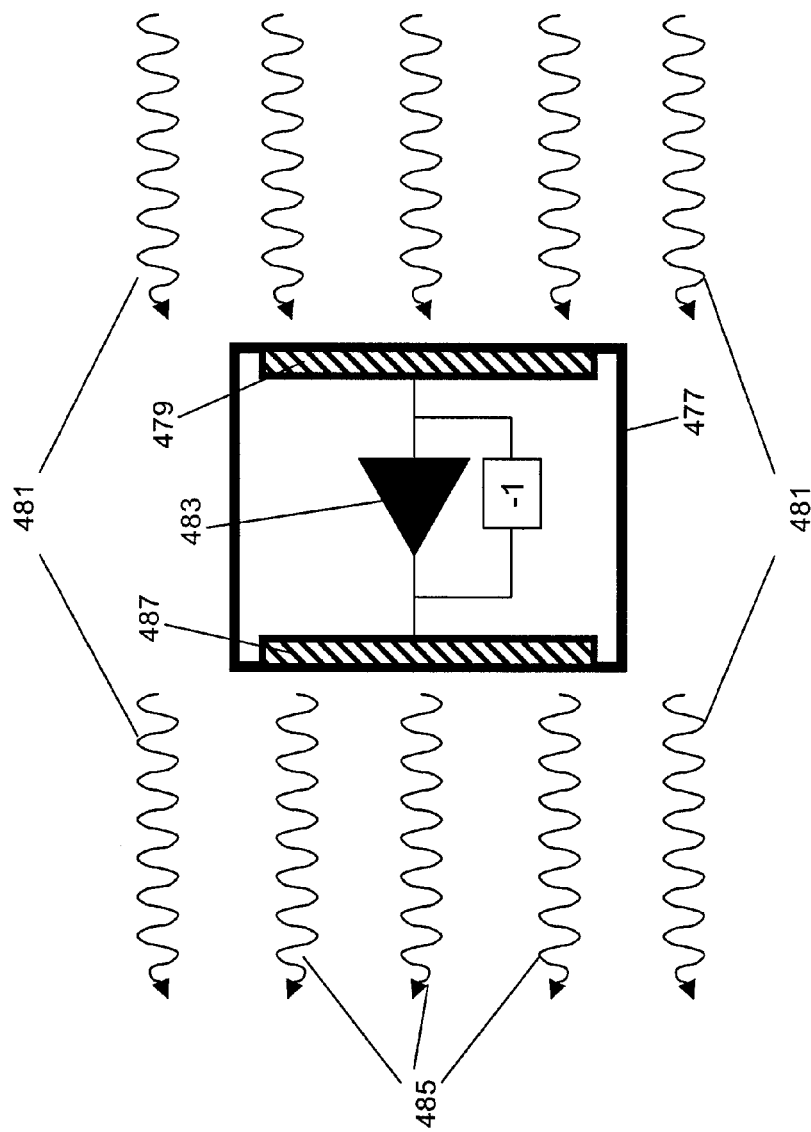

The antenna modules and manufacturing methods described above have value in any RF application that requires lightweight, compact size, and low power consumption, such as airborne radars, automotive radars, and mobile communications systems. The ceramic antenna modules described herein have radiation patterns that protrude in the half-space that contains the antenna element. The precise radiation pattern is a function of the shape of the antenna element, the number of antenna elements used to form the radiation pattern, as well as the precise location relative to the conducting antenna element and the relative dielectric properties of the ceramic inclusions embedded within a host. As shown in FIG. 34, these antenna modules can be used to develop low-profile customer premises equipment (CPE) radios useful in broadband communications systems. Many of these systems will utilize signaling frequencies that are greater than or equal to 2.4 GHz. These frequencies propagate well through air and window glass, but can be sharply attenuated by walls and other housing structures, which causes a problem for last mile broadband wireless delivery systems. Many last mile wireless systems require the use of large dish, or other antenna systems that are unattractive to the home consumer. The present invention enables a CPE radio 455 solution incorporates a high gain ceramic antenna module 457 that has a narrowly focused radiation profile 459 that is directed towards a network base station 461 transmission tower and is used to manage transceiver functions between the base station and the customer premises. The low-profile CPE radio 455 is situated on a window 463 with a view of the base station transmission tower 461 or a strong reflection point in non-line of sight (NLOS) locations. The CPE radio 455 also comprises a second antenna module 465 having a radiation pattern 467 that broadly disperses/detects signals within the customer premises. The directional sensitivity of the ceramic antenna modules enabled by the present invention also provides a means to improve wireless security as shown in FIGS. 35A&B. Wireless local area networks are often susceptible to security threats and unwanted network intrusions because electromagnetic emissions 471 will extend beyond the customers' premises 473 exposing the network to security hackers located nearby. A perimeter 475 of small form factor transceiver units 477 comprising a receive antenna module 479 with one or more receive antenna elements is used to detect electromagnetic emissions 481 emanating from within the premises 473. The electromagnetic emissions 481 are passed through an amplifier stage 483 that inverts the phase (shifts their phase by 180 degrees) and rebroadcasts a phase-inverted electromagnetic signal 485 through a transmit antenna module 487 in the same direction of the electromagnetic emissions 481. A properly tuned amplifier stage 483 will broadcast a phase-inverted signal with an amplitude such that the ratio between the primary signal and inverted signal is less than 0.05 dB. Phase-cancellation between the network's electromagnetic emission 487 and the phase-inverted signal 485 causes signals emitted from the customer premises 473 to be reduced to non-detectable limits outside the security perimeter 475.

Figure 36A:
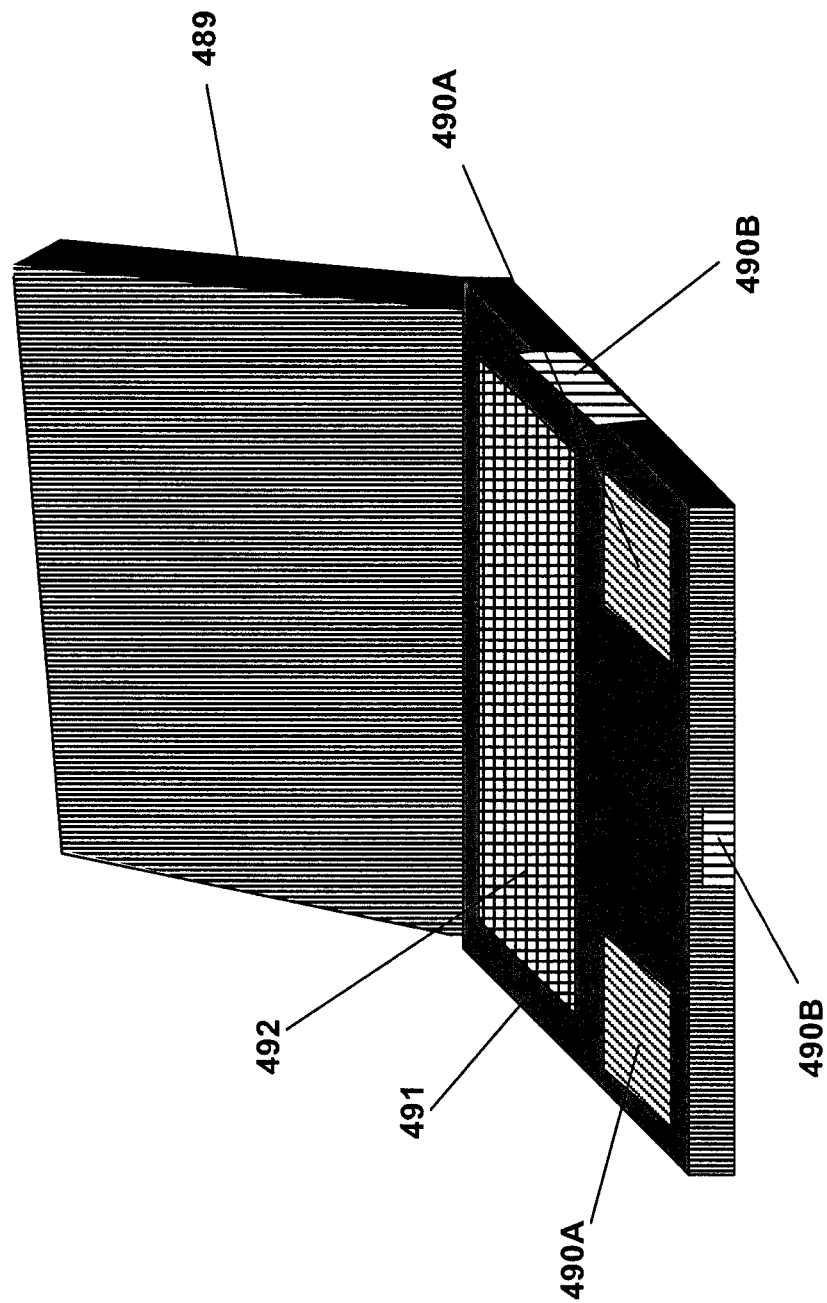
FIGS. 36A-B are illustrations depicting the use of antenna modules within a laptop computer.
Figure 36B:
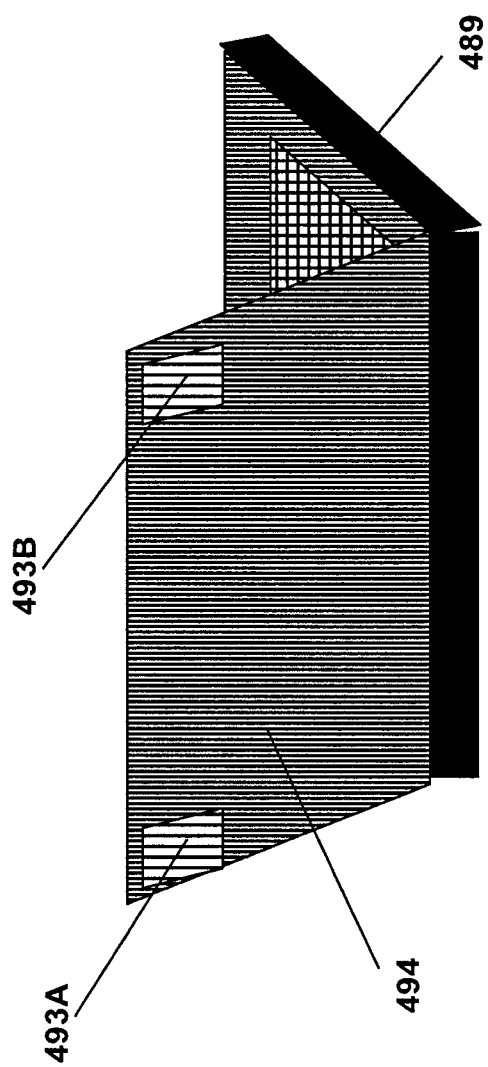
Figure 37B:
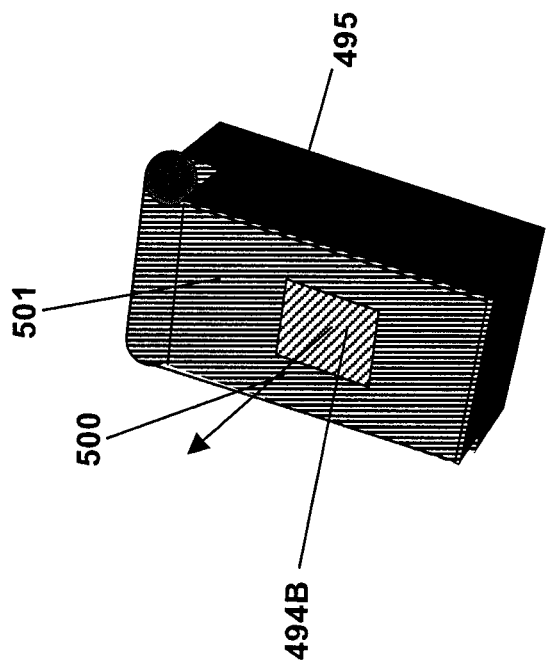
FIGS. 37A-B are illustrations depicting the use of antenna modules within a mobile handset.
Figure 37A:
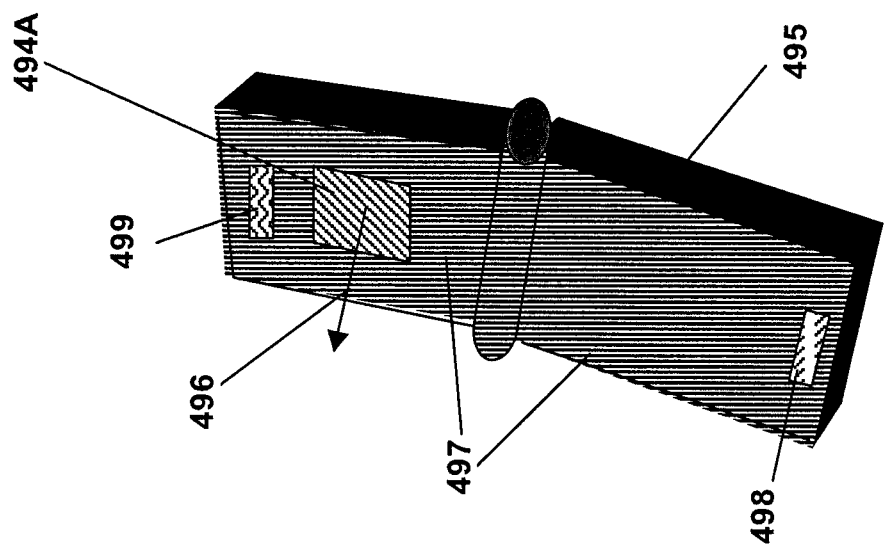
Figure 38:
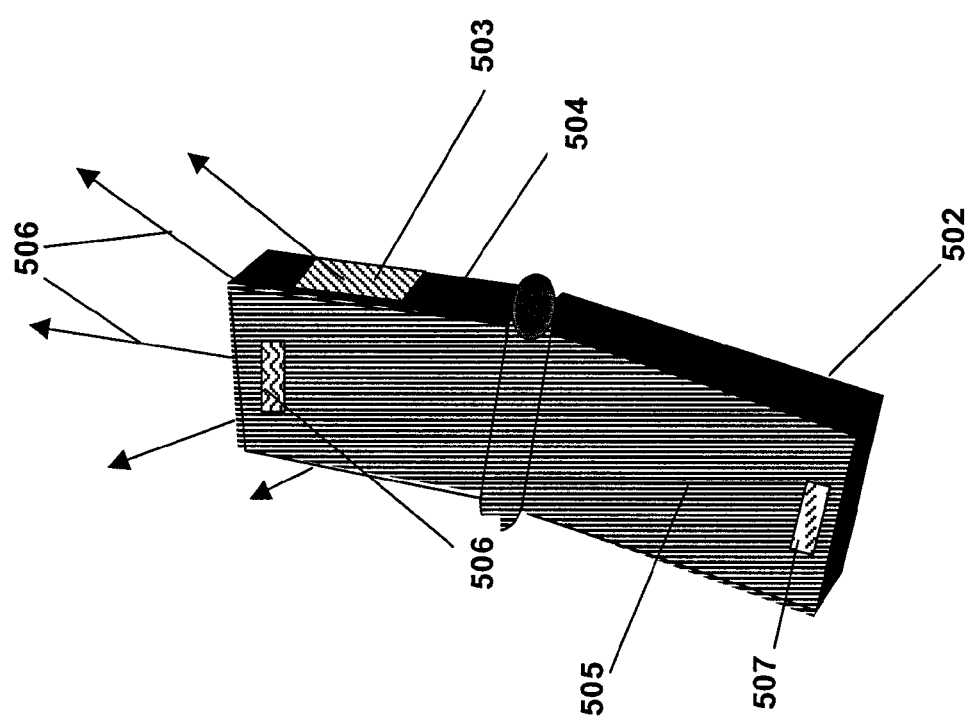
FIG. 38 is an illustration depicting the use of antenna modules within a wireless device.

The ability to reduce the physical size of an antenna element, or an array of antenna elements, under the present invention enables efficient broadband wireless communications in mobile platforms, such as cellular phones and laptop computers. This is particularly true for broadband communications at the 400-800 MHz band, where resonant antenna lengths for the communications wavelengths (≈75 cm-37.5 cm) are larger than the devices. FIGS. 36A&B depict the application of the antenna module in a laptop computer 489, where the antenna module 490A,B,C is situated in the laptop body 491 adjacent to the key board 492, located either on a top 490A or side surface 490B. Antenna modules 493A,B, may alternatively be situated on the back (top) side of the laptop body that contains the display screen 494. Often it is desirable to have a second antenna module 493B positioned nearby the first antenna module 493A to account for spatial diversity among the incoming signals. At sufficiently high frequency the antenna pair may be engineered into the same module. In cell phone applications, it is more frequently desirable to have an antenna system that is omni-directional to account for movements on the part of the user during operation. As shown in FIGS. 37A&B, it is desirable to utilize two antenna modules 494A,B to provide omni-directional coverage as each will radiate/receive signals in the half-plane defined by the modules' ground plane. This is realized by locating one antenna module 494A within the cellular phone device 495 such that the module's transmit/receive radiation pattern is directed 496 away from the surface 497 that contains the device's microphone 498 and speaker 499. In most cellular phone devices this surface would coincide with the surface that is placed in contact with the phone users' ear or face. The second antenna module is 494B positioned so its transmit/receive radiation pattern is directed 500 away from the opposite surface 501. This antenna configuration further provides a means to protect against the perception of human health hazards caused by microwave emissions by allowing the cell phone manufacturer to tune the transmitted power from antenna module 494A to a lower level than that transmitted by antenna module 494B. Although the illustration provided by FIGS. 37A,B show the antenna modules 494A,B embedded in an exterior surface of the cell phone device, it should be understood that the modules 494A,B may also be situated below the surfaces 497,501. Reference is now made to FIG. 38 which depicts a satellite phone device 502 where transmissions are directed skyward. In this embodiment, it is preferred to locate the antenna modules 503 within a minor surface 504 of the phone that is adjacent or opposite to the surface 505 that contains the phone's speaker 506 and microphone 507, and to project the modules' 503 transmit/receive radiation pattern in a skyward direction 508 during normal operational use.

Figure 39:
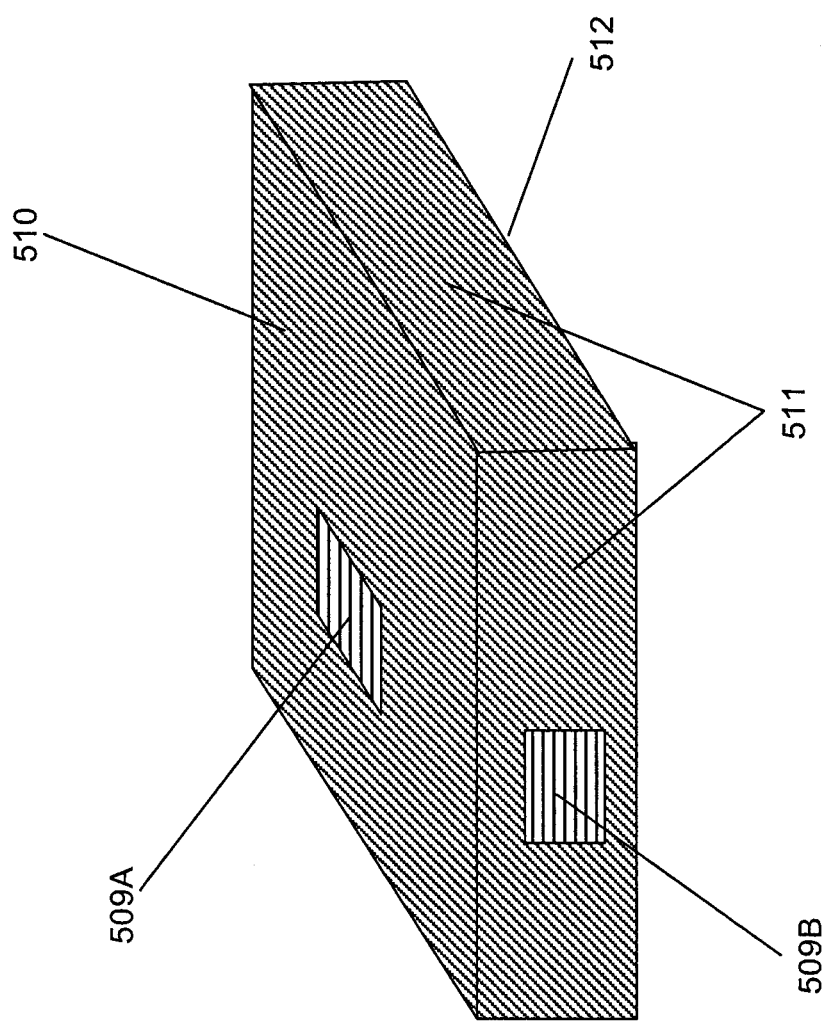
FIG. 39 is an illustration depicting a wireless appliance having antenna modules in accordance with the present invention attached to its surfaces.

The small form factor ceramic antenna modules enabled by the present invention are thus useful in any appliance, a computer, printer, smart refrigerator, etc., that will have a wireless interface. However, these modules may also be used in wireless appliance as shown in FIG. 39 by placing the wireless antenna module 509A,B on or within a top (front) 510 or side 511 surface of the wireless appliance 512.

Although the invention has been described with respect to various embodiments, it should be realized this invention is also capable of a wide variety of further and other embodiments within the spirit and scope of the appended claims.

What is claimed is:

1. An antenna module, comprising:
 a composite dielectric body including at least one ceramic dielectric inclusion composed of at least one material selected from the group consisting of materials having a relative dielectric permittivity ≥10 and materials having a relative dielectric permeability ≠1, the at least one ceramic dielectric inclusion embedded in a dielectric host material selected from the group consisting of amorphous silica, titania, tantalates, pure alumina, admixtures thereof, and an organic media such that the composite dielectric body has an effective permittivity ≥4;
 a metallization layer adjacent the composite dielectric body and including a ground plane and at least one contact pad;
 at least one electrically conductive element disposed parallel to the metallization
 layer and electrically connected with the at least one contact pad, each conductive element disposed relative to the composite dielectric body such that the conductive element is resonant over a band of frequencies and has a length that is ≤50% of the length that would be required to maintain the same resonance without the composite dielectric body; and
 an interconnect structure including:
 an oxide ceramic body located on a side of the metallization layer opposite the at least one electrically conductive element;
 at least a first conductive contact embedded at a first surface of the oxide ceramic body;
 at least a second conductive contact at a second surface of the oxide ceramic body; and
 at least one transmission line embedded within the oxide ceramic body at a uniform distance above the ground plane and providing an electrical pathway between the first conductive contact and the second conductive contact through the oxide ceramic body;
 wherein the first conductive contact or the second conductive contact is electrically connected to the at least one contact pad.

2. The module of claim 1, wherein:
 the dielectric inclusions each have a maximum nominal grain size of less than 50 nanometers; and
 the effective permittivity of the composite dielectric body changes as a function of temperature $\leq 5 \times 10^{-2}$ °C.$^{-1}$.

3. The module of claim 1, wherein:
 the dielectric inclusions each have a maximum nominal grain size of less than 35 nanometers; and
 the effective permittivity of the composite dielectric body changes as a function of temperature $\leq 9 \times 10^{-3}$ °C.$^{-1}$.

4. The module of claim 1, wherein the interconnect structure further includes a layer of high permittivity ceramic ($\in_R \geq 10$) disposed between the metallization layer and the at least one transmission line, the ceramic layer having a corresponding one or more vias to accommodate the electrical pathway through the oxide ceramic body.

5. The module of claim 4, wherein the at least one transmission line has an intrinsic impedance that is tuned to substantially match the output impedance of a semiconductor die electrically connected to the first conductive contact or the second conductive contact.

6. The module of claim 4, wherein the high permittivity ceramic layer is composed of at least one material selected from the group consisting of titania, tantalate, and niobate oxide ceramic.

7. The module of claim 1, wherein the interconnect structure further comprises:
   a capacitive pad embedded within the oxide ceramic body; and
   a branch extending from the transmission line and terminating on the capacitive pad.

8. The module of claim 7, wherein the transmission line is composed of discrete wire.

9. The module of claim 1, wherein the oxide ceramic body includes a spun coat layer of oxide ceramic material having a surface roughness $\leq 0.1$ µm RMS upon which the at least one transmission line is disposed.

* * * * *